United States Patent
Yuan et al.

(10) Patent No.: US 9,696,133 B2
(45) Date of Patent: Jul. 4, 2017

(54) INTERFERENCE SYSTEM AND AN INTERFERENCE METHOD

(71) Applicant: Kabushiki Kaisha Toshiba, Minato-ku (JP)

(72) Inventors: Zhiliang Yuan, Cambridge (GB); Marco Lucamarini, Cambridge (GB); James Dynes, Cambridge (GB); Bernd Matthias Frohlich, Cambridge (GB); Andrew James Shields, Cambridge (GB); Joanna Krystyna Skiba-Szymanska, Cambridge (GB)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/824,380

(22) Filed: Aug. 12, 2015

(65) Prior Publication Data
US 2016/0047643 A1 Feb. 18, 2016

(30) Foreign Application Priority Data

Aug. 14, 2014 (GB) .................................. 1414446.3
Jul. 22, 2015 (GB) .................................. 1512928.1

(51) Int. Cl.
*H04B 10/70* (2013.01)
*H01S 5/40* (2006.01)
(Continued)

(52) U.S. Cl.
CPC ........ *G01B 9/0201* (2013.01); *H01S 5/06246* (2013.01); *H01S 5/4006* (2013.01);
(Continued)

(58) Field of Classification Search
CPC .................................................... H04B 10/70
See application file for complete search history.

(56) References Cited

U.S. PATENT DOCUMENTS

| 7,680,169 B2 | 3/2010 | Park et al. |
| 2006/0056469 A1 | 3/2006 | Huhse et al. |

(Continued)

FOREIGN PATENT DOCUMENTS

| GB | 2505902 A | 3/2014 |
| GB | 2529228 A | 2/2016 |

(Continued)

OTHER PUBLICATIONS

Z. L. Yuan, et al.; Robust random number generation using steady-state emission of gain-switched laser diodes; Applied Physics Letters 104, 261112 (2014); DOI: 10.1063/1.4886761; arXiv:1407.0933v1 [quant-ph].*

(Continued)

*Primary Examiner* — Nathan Curs
(74) *Attorney, Agent, or Firm* — Oblon, McClelland, Maier & Neustadt, L.L.P.

(57) ABSTRACT

An interference system, comprising:
an interference apparatus, configured such that input light pulses interfere at an interference component;
wherein the input of said interference apparatus is provided by a phase-randomized light source, said phase-randomized light source comprising:
at least one slave light source;
at least one master light source configured to intermittently generate master light pulses such that the phase of each master light pulse has a random relationship to the phase of each subsequently generated master light pulse, further configured to supply said master light pulses to the slave light source; and
a controller, configured to apply a time varying drive signal to said at least one slave light source such that just one slave light pulse is generated during each period of time for which a master light pulse is (Continued)

received, such that the phase of each slave light pulse has a random relationship to the phase of each subsequently generated slave light pulse.

19 Claims, 42 Drawing Sheets

(51) Int. Cl.
*G01B 9/02* (2006.01)
*H01S 5/00* (2006.01)
*H01S 5/042* (2006.01)
*H01S 5/062* (2006.01)

(52) U.S. Cl.
CPC .............. *H04B 10/70* (2013.01); *H01S 5/005* (2013.01); *H01S 5/0078* (2013.01); *H01S 5/0428* (2013.01); *H01S 5/06216* (2013.01)

(56) References Cited

U.S. PATENT DOCUMENTS

| | | | |
|---|---|---|---|
| 2009/0022322 A1* | 1/2009 | Trifonov | H04L 9/0852 380/278 |
| 2009/0238575 A1* | 9/2009 | Zhang | H04Q 11/0003 398/140 |
| 2013/0036145 A1 | 2/2013 | Pruneri et al. | |

FOREIGN PATENT DOCUMENTS

| | | |
|---|---|---|
| JP | 2000-162899 | 6/2000 |
| WO | WO 97/30527 A1 | 8/1997 |

OTHER PUBLICATIONS

United Kingdom Search Report issued Mar. 1, 2016 in Patent Application No. GB1512928.1.
Dong-Sun Seo, et al., "Timing jitter reduction of gain-switched DFB laser by external injection-seeding" Electronics Letters, vol. 32, No. 1, Jan. 4, 1996, pp. 44-45.
Great Britain Search Report issued Dec. 24, 2014 in Great Britain Application 1414446.3, filed on Aug. 14, 2014.
Z. L. Yuan, et al., "Robust random number generation using -steady-state emission of gain-switched laser diodes", arXiv:1407.0933v1 (quant-ph), 2014, 5 pgs.
Yun-Cai Wang, et al., "Generation of low jitter single mode ultra-short optical pulse at arbitrary repetition rate", Microwave and Optical Technology Letters, vol. 49, (2), 2007, 5 pgs.
Toshiya Kobayashi, et al, "Evaluation of the phase correlation between the optical pulses for transmission in quantum key distribution", Proc of Advances in Photonics of Quantum Computing, Memory, and Communication VII, vol. 8997, 2014, 10 pgs.
Zhiyuan Tang, et al., "Experimental Demonstration of Polarization Encoding Measurement-Device-Independent Quantum Key Distribution", arXiv:1306.6134v2 (quant-ph), 2013, 6 pgs.
M.C. Nowell, et al., "Chirp Reduction Using Push-Pull Modulation of Three-Contact Lasers", IEEE Photonics Technology Letters, vol. 5, (12), 1993, 4 pgs.
A. Argyris, et al., "Photonic Integrated Device for Chaos Applications in Communications", PRL 100, 2008, 4 pgs.
O. Kjebon, et al., "Two-Section InGaAsP DBR-lasers at 1.55 pm wavelength with 31 GHz Direct Modulation Bandwidth", Proc. $9^{th}$ Int. Conf. Indium Phosphide and Related Materials, 1997, 4 pgs.
Martin Mohrle, et al., "Detuned grating multi-section-RW-DFB-lasers for high speed optical signal processing", IEEE J. Sel. Top. Quantum Electron, vol. 7, 2001, 8 pgs.
S. Bauer, et al., "Nonlinear dynamics of semiconductor lasers with active optical feedback", Physical Review E 69, 2004, 10 pgs.
G. Magyar, et al., "Interference fringes produced by superposition of two independent maser light beams", Nature, vol. 198, 1963, 2 pgs.
J. G. Rarity, et al., "Non-classical interference between independent sources", Journal of Optics B: Quantum Semiclass Opt. 7, 2005, 6 pgs.
A.J. Bennett, et al., "Interference of dissimilar photon sources", Nature Physics, vol. 5, 2009, 3 pgs.
Hoi-Kwong Lo, et al., "Measurement-Device-Independent Quantum Key Distribution", Physical Review Letters 108, 2012, 5 pgs.
Jianbin Liu, et al., "Observation on the incompatibility between the first-order and second-order interferences with laser beams", Optics Communications 284, 2011, 4 pgs.
D.M. Pataca, et al., "Gain-Switched DFB Lasers", Journal of Microwaves and Optoelectronics, vol. 1, (1), 1997, 18 pgs.
Notification of Reasons for Refusal issued Nov. 8, 2016 in Japanese Patent Application No. 2015-159844 (Submitting unedited computer generated English translation only).
Kyo Inoue, et al., "Differential-phase-shift quantum key distribution utilizing decoy pulses" CLEO/CAELS, May 2008, 2 pages.
Tatiana Habruseva, et al., "Dynamics of Quantum-Dot Mode-Locked Lasers With Optical Injection" IEE Journal of Selected Topics in Quantum Electronics, vol. 17, No. 5, 2011, pp. 1272-1279.
Jacek Swiderski, et al., "Gain-Switched Tm-doped Fiber Laser and Amplifier with Simultaneous Mode-Locked-Like Operation" International conference Laser optics, 2014, 1 Page.
Hiroki Takesue, et al., "Differential Phase Shift-Quantum Key Distribution" First ITU-T Kaleidoscope Academic Conference Innovations, May 2009, pp. 102-106.
Yao Minyu, et al., "A Novel Self-seeding Technique for Timing Jitter Reduction in Gain Switched DFB Laser" Pacific Rim, 1999, pp. 906-907.

\* cited by examiner

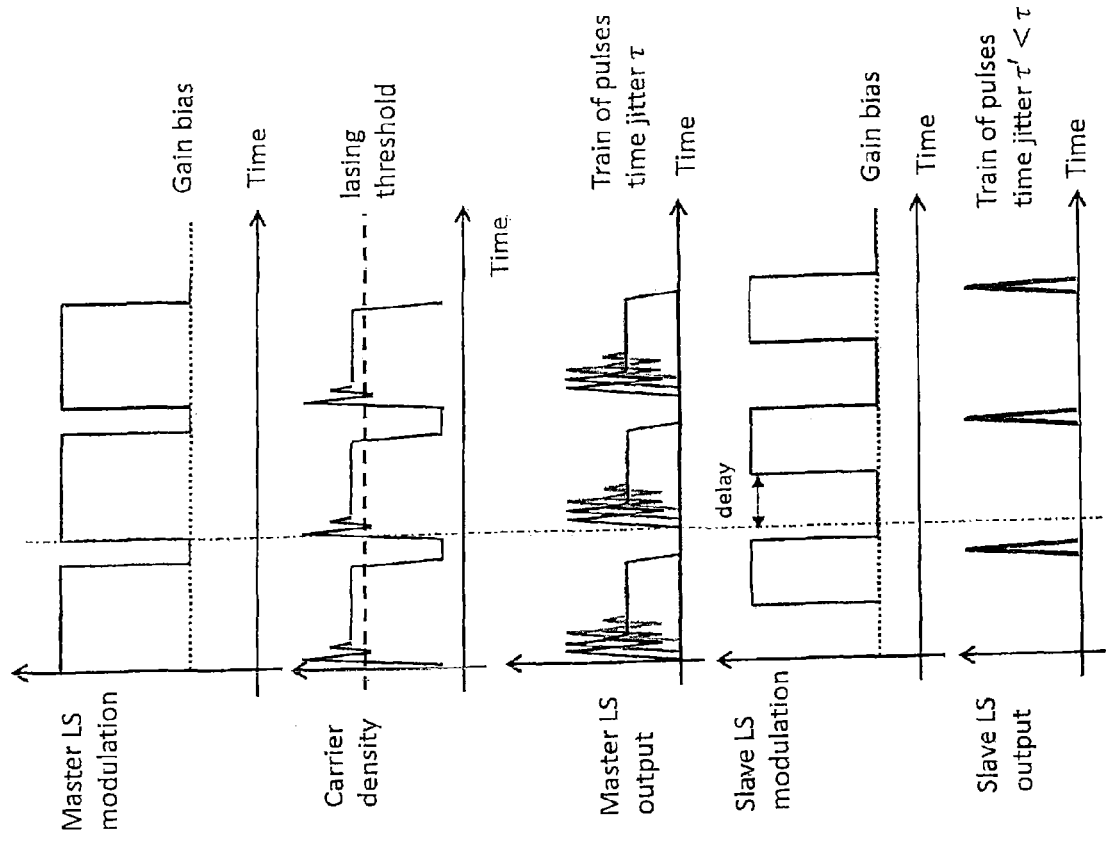
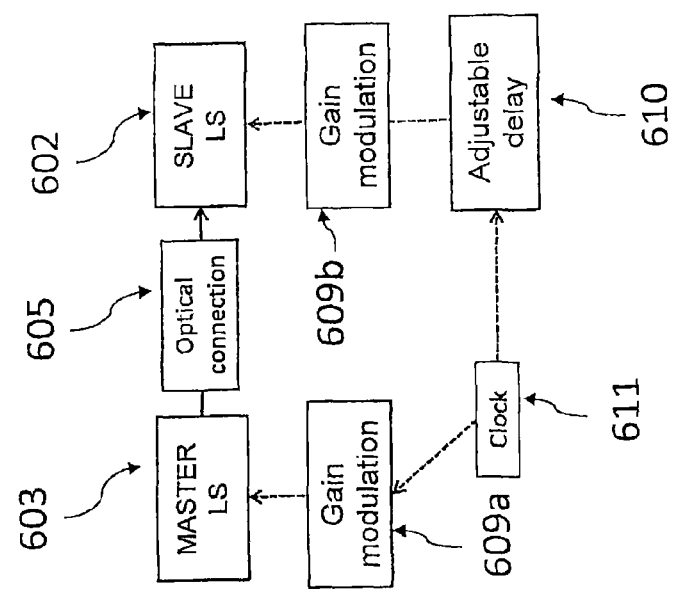
Figure 6A
Figure 6B

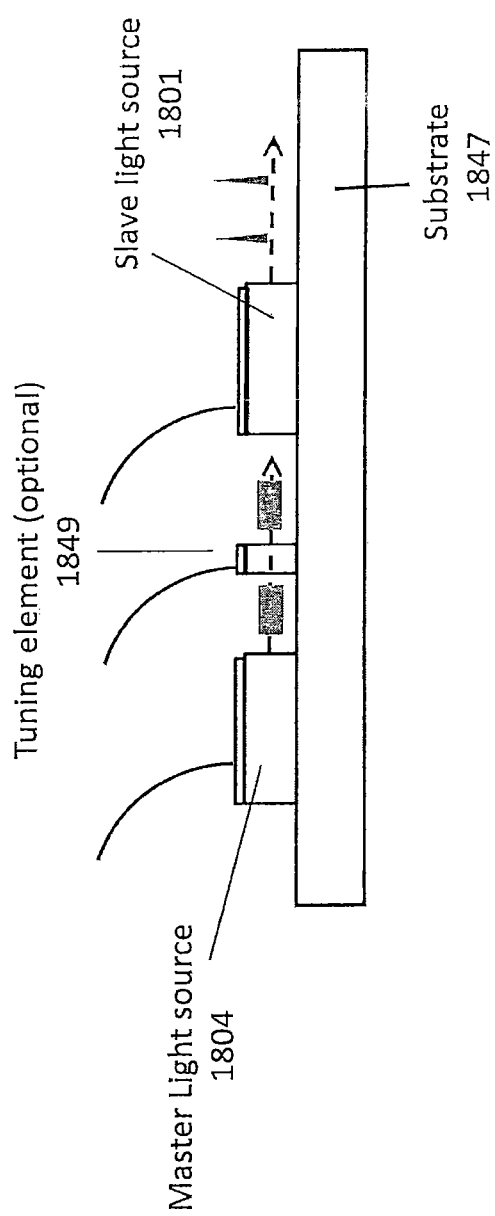

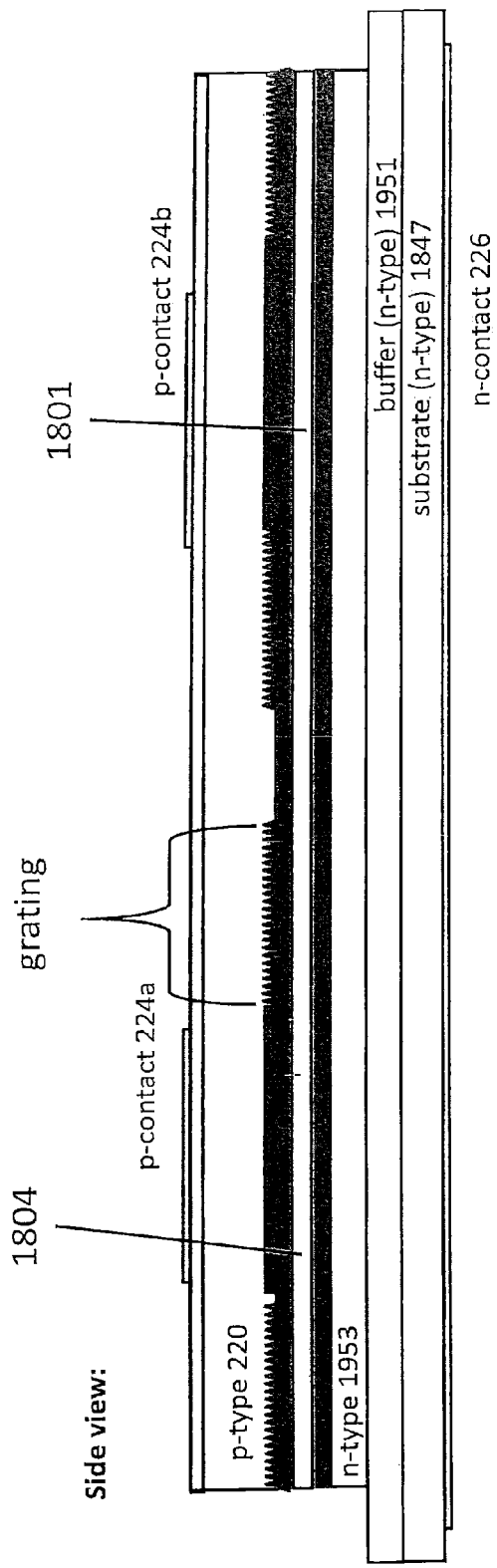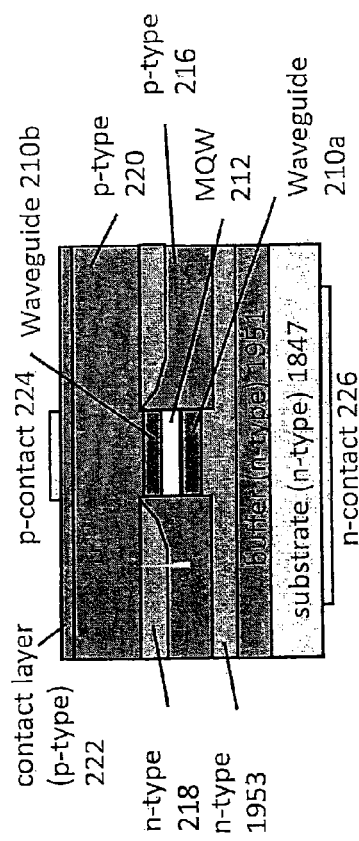
Figure 20

INTERFERENCE SYSTEM AND AN INTERFERENCE METHOD

FIELD

Embodiments described herein relate generally to interference systems.

BACKGROUND

Sources of pulses of light are used in a wide range of interference applications, for example in sensing or metrology apparatus such as strain, pressure or temperature sensors, spectroscopy apparatus, distance measurement apparatus or random number generation. The interference of pulses of light can also be used in quantum communications systems, for example in quantum key distribution (QKD) or measurement device independent QKD (MDI-QKD). In a quantum communication system, information is sent between a transmitter and a receiver by encoded single quanta, such as single photons. Each photon carries one bit of information encoded upon a property of the photon, such as its polarization, phase or energy/time. The photon may even carry more than one bit of information, for example, by using properties such as angular momentum.

There is a continuing need to enhance interference visibility in applications which use the interference of pulses of light.

BRIEF DESCRIPTION OF THE FIGURES

Embodiments will now be described with reference to the following figures:

FIG. 6A is a schematic illustration of a light source that can be embedded in an interference system in accordance with an embodiment, in which a first controller drives the master light source and a second controller drives the slave light source;

FIG. 6B is a series of graphs showing the gain modulation applied to the master laser, the effect of the gain modulation on carrier density, the output master light pulses, the gain modulation applied to the slave laser and the output slave light pulses;

FIG. 18 shows a schematic illustration of a light source that is part of an interference system in accordance with an embodiment, in which a master light source and a slave light source are integrated on a semiconductor substrate in a lateral combination;

FIG. 20 shows a schematic illustration of a light source that is part of an interference system in accordance with an embodiment, in which the master light source and the slave light source are both DBR lasers, in a vertical junction and in a lateral combination;

DETAILED DESCRIPTION

Figure 1:
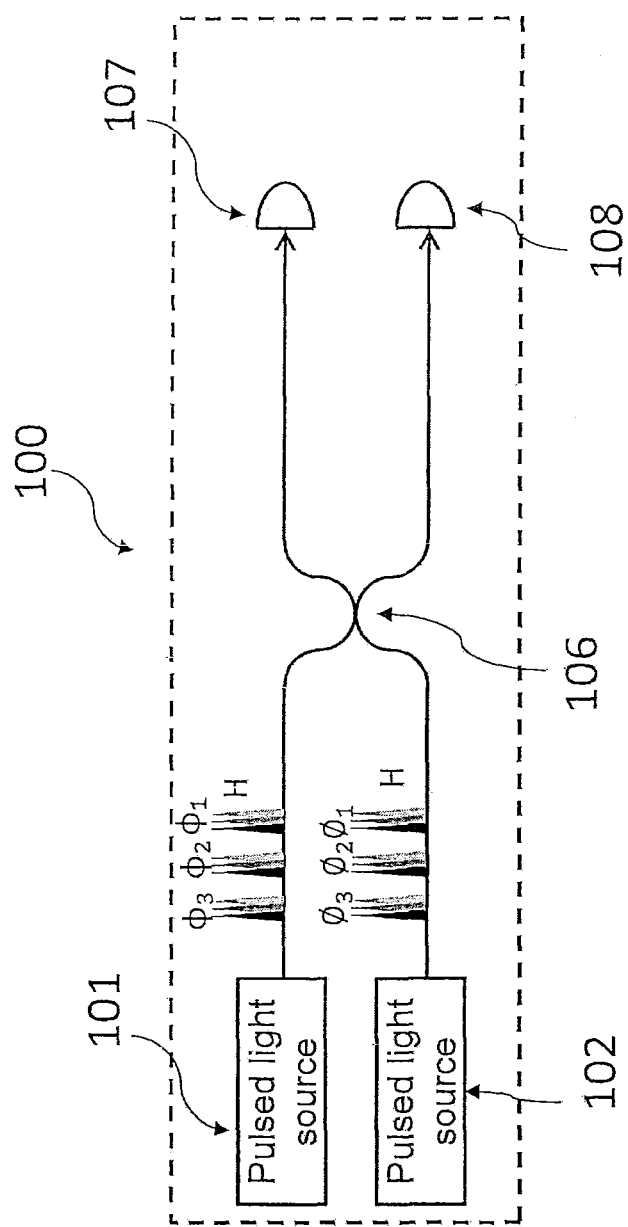
FIG. 1 is a schematic illustration of an interference system.

According to one embodiment, there is provided an interference system, comprising:
  an interference apparatus, configured such that input light pulses interfere at an interference component;
  wherein the input of said interference apparatus is provided by a phase-randomised light source, said phase-randomised light source comprising:
  at least one slave light source;
  at least one master light source configured to intermittently generate master light pulses such that the phase of each master light pulse has a random relationship to the phase of each subsequently generated master light pulse, further configured to supply said master light pulses to the slave light source; and
  a controller, configured to apply a time varying drive signal to said at least one slave light source such that just one slave light pulse is generated during each period of time for which a master light pulse is received, such that the phase of each slave light pulse has a random relationship to the phase of each subsequently generated slave light pulse.

In an embodiment, the interference system further comprises a first semiconductor substrate, and the slave light source and the master light source are integrated on the first semiconductor substrate.

The slave light pulses have a fixed phase relationship to the corresponding master light pulses.

The master light pulses are injected into the slave light source. The master light pulses seed the slave light pulse, such that one master light pulse is injected into the slave light source before each slave light pulse is generated. The generation of each slave light pulse is activated by photons from a different master light pulse.

The master light pulses have a first time jitter, and the slave light pulses are generated with a second time jitter, the second time jitter being less than the first time jitter. The second time jitter is less than the time jitter of light pulses generated by the slave light source when master light pulses are not injected.

In one embodiment, the master light source is configured to periodically supply the master light pulses to the slave light source. The controller is configured to apply a periodic signal to the slave light source.

In one embodiment, the master light pulses are emitted 400 ps apart. In one embodiment, the master light pulses are emitted 1 ns apart. In one embodiment, the master light pulses are emitted 10 ns apart. In one embodiment, the master light pulses are emitted 100 ns apart.

In one embodiment, the master light source and slave light source are configured to generate a plurality of light pulses.

In one embodiment, the slave light pulses generated by a single slave light source interfere at the interference component. In one embodiment, the interference apparatus comprises an interferometer, comprising first and second optical paths, wherein there is a difference in optical path length between the first and second optical paths. The interferometer may be a fibre optic asymmetric Mach-Zehnder interferometer, or it may be integrated on the first semiconductor substrate for example. The interference component may be an exit beam splitter in the interferometer, and the difference in optical path length may correspond to an integer multiple of the time difference between emission of a first slave light pulse and emission of a second slave light pulse, such that each slave light pulse interferes with a subsequently generated slave light pulse at the exit of the interferometer.

In one embodiment, the phase-randomised light source further comprises a $\chi^{(2)}$ non-linear crystal, configured such that when a slave light pulse is incident on the crystal, a signal light pulse and an idler light pulse are generated through spontaneous parametric down conversion in the crystal. The signal light pulses interfere at the interference component.

In one embodiment, the controller applies the same signal time varying drive signal to the master light source and the slave light source. The signal applied to the slave light source is delayed with respect to the signal applied to the master light source, such that generation of a slave light pulse occurs after a master light pulse has been injected into the slave light source.

In an alternative embodiment, a second controller supplies a second time varying drive signal to the master light source. The time varying drive signal applied to the slave light source and the time varying drive signal applied to the master light source may be synchronised to a master clock. The intermittent increases in the signal applied to the slave light source that correspond to generation of the slave light pulses may be delayed with respect to the intermittent increases in the signal applied to the master light source that correspond to generation of the master light pulses, such that generation of a slave light source occurs after a master light pulse has been injected into the slave light source. In one embodiment, the second controller is integrated onto the substrate.

In one embodiment, the substrate is InP.

In one embodiment, the slave light source is a gain-switched laser. In one embodiment, the slave light source is a semiconductor laser. In a further embodiment, the slave light source is a semiconductor gain-switched laser. The semiconductor laser may comprise a multiple quantum well layer. In one embodiment, the semiconductor laser comprises a quantum light emitter. In one embodiment, the semiconductor laser is electrically tuneable. The semiconductor laser may further comprise cladding layers. The semiconductor laser may further comprise layers configured to laterally confine generated light. The semiconductor laser may be a distributed feedback laser, a stripe laser or a vertical cavity surface emitting laser. The semiconductor laser may comprise a diffraction grating. In one embodiment, the semiconductor laser is a distributed Bragg reflector laser.

In one embodiment, the master light source is a gain-switched laser. In one embodiment, the master light source is a semiconductor laser. In a further embodiment, the master light source is a semiconductor gain-switched laser. The semiconductor laser may comprise a multiple quantum well layer. In one embodiment, the semiconductor laser comprises a quantum light emitter. In one embodiment, the semiconductor laser is electrically tuneable. The semiconductor laser may further comprise cladding layers. The semiconductor laser may further comprise layers configured to laterally confine generated light. The semiconductor laser may be a distributed feedback laser, a stripe laser or a vertical cavity surface emitting laser. The semiconductor laser may comprise a diffraction grating. In one embodiment, the semiconductor laser is a distributed Bragg reflector laser.

The time varying signal applied to the slave light source in order to generate slave light pulses may be a time varying current or voltage.

In an embodiment, the master light source and the slave light source are arranged in a first plane which is substantially parallel to a surface of the substrate on which the master light source and the slave light source are integrated.

In an alternative embodiment, the master light source is between the slave light source and the substrate.

In one embodiment, the master light source and the slave light source are edge emission lasers. In an alternative embodiment, they are vertical cavity lasers.

The interference system may further comprise a p-type electrode and an n-type electrode configured to form a p-n junction in a direction substantially perpendicular to a surface of the substrate on which the master light source and the slave light source are integrated. In one embodiment, the substrate is a first conductivity type and the master light source and slave light source each comprise a layer of a second conductivity type. Alternatively, the p-type electrode and n-type electrode are configured to form a p-n junction in a direction substantially parallel to a surface of the substrate on which the master light source and the slave light source are integrated. In one embodiment, there is a region of a first conductivity type adjacent to a first edge of the master light source and slave light source and a region of a second conductivity type adjacent to a second edge of the master light source and slave light source.

The interference system may further comprise a waveguide region between the master light source and the slave light source. Alternatively, light may travel between the master light source and the slave light source through free space.

In an embodiment, the interference apparatus is integrated on the first semiconductor substrate. In one embodiment, the first controller is integrated onto the substrate. In one embodiment, the interference system comprises an integrated heat sink.

In one embodiment, master light pulses are supplied to the slave light source through a first aperture of the slave light source, and slave light pulses are emitted through a second aperture of the slave light source. Alternatively, master light pulses are supplied to an aperture of the slave light source through an optical circulator or a beam splitter and slave light pulses are emitted through the same aperture.

In one embodiment, there are two or more slave light sources. All the slave light sources may be seeded by a single master light source. Alternatively, each slave light source may be seeded by a different master light source. All of the slave light sources and master light sources may be integrated on the first substrate. Alternatively, the interference system may further comprise one or more further semiconductor substrates, wherein a slave light source and a second master light source are integrated on each semiconductor substrate. The interference component may be a beam splitter configured such that each light pulse generated by one slave light source interferes with a light pulse generated by the other slave light pulse at the beam splitter.

The phase-randomised light source may further comprise a spectral filter, and/or other types of filters. The spectral filter and/or other filters may be integrated on the first semiconductor substrate. The spectral filter may be an arrayed waveguide grating filter.

The interference system may further comprise one or more photon detectors. The photon detectors may be single photon detectors, for example gated single photon detectors. The interference system may be configured to measure first order interference or second order interference. First order interference measurements look at the output of each detector independently, whereas second order interference measurements look at the correlation between the outputs of two detectors. First order interference measurements and second order interference measurements can be made for interference systems. For some applications the first order interference measurement may be of more interest, whilst for other applications the second order interference measurement may be of more interest.

In one embodiment, the interference system is part of a quantum communication system, and the interference apparatus comprises;
 an interferometer, comprising first and second optical paths, wherein there is a difference in optical path length between the first and second optical paths such that said slave light pulses interfere when exiting the interferometer.

The master light source and slave light source may be in a sending unit and the interference component in a receiving unit of the quantum communication system.

The interference apparatus may comprise a first interferometer, comprising first and second optical paths and having a difference in optical path length between the first and second optical paths; and a second interferometer, comprising third and fourth optical paths and having a difference in optical path length between the third and fourth optical paths; wherein the delay caused by the first interferometer is reversed to the delay caused by the second interferometer such that a light pulse which is separated by the first interferometer recombines and interferes when exiting the second interferometer.

The first interferometer is in a sending unit and the second interferometer is in a receiving unit of the quantum communication system. The interference component may be the exit beam splitter of the second interferometer.

The quantum communication system may be a MDI-QKD system. The quantum communication system may comprise a first sending unit, having a first slave light source and a first master light source; a second sending unit, having a second slave light source and a second master light; and a relay unit, having an interference component which is a beam splitter; wherein the interference system is configured such that each slave light pulse generated by the first slave light source interferes with a slave light pulse generated by the second slave light source at the beam splitter.

According to another embodiment, there is provided an interference method, comprising;
 intermittently supplying master light pulses to a slave light source, wherein the phase of each master light pulse has a random relationship to the phase of each subsequent master light pulse;
 applying a time varying drive signal to said slave light source such that just one light pulse is generated during each period of time for which a master light pulse is received, such that the phase of each slave light pulse has a random relationship to the phase of each subsequently generated slave light pulse; and
 interfering said slave light pulses at an interference component.

In one embodiment, the method is used in a quantum communication method, which further comprises:
 encoding information in said slave light pulses; and
 sending encoded slave light pulses from a sending unit to a receiving unit comprising an interferometer, comprising first and second optical paths, wherein there is a difference in optical path length between the first and second optical paths such that said slave light pulses interfere when exiting the interferometer.

According to another embodiment, there is provided a method of fabricating an interference system, comprising:
 i) forming a phase-randomised light source comprising a first master light source and a first slave light source on a first semiconductor substrate, wherein the first master light source is configured to intermittently generate master light pulses such that the phase of each master light pulse has a random relationship to the phase of each subsequently generated master light pulse, and is further configured to supply said master light pulses to the first slave light source;
 ii) forming an interference apparatus such that the input of the interference apparatus is provided by the phase-randomised light source, the interference apparatus being configured such that input light pulses interfere at an interference component,
 iii) electrically contacting a first electrode and a second electrode to the first slave light source, wherein the first electrode and the second electrode are connected to a first controller, the first controller being configured to apply a first time varying electrical signal to the first slave light source such that just one slave light pulse is generated during each period of time for which a master light pulse is received, such that the phase of each slave light pulse has a random relationship to the phase of each subsequently generated slave light pulse.

In one embodiment, step i) is performed by metal organic vapour phase epitaxy (MOVPE). Step i) may use a monolithically integrated approach or flip-chip bonding on a foreign carrier.

In one embodiment, step iii) further comprises electrically contacting a third electrode and a fourth electrode to the first master light source, wherein the third electrode and the fourth electrode are connected to the first controller. In one embodiment, step iii) further comprises electrically contacting the second electrode and a third electrode to the first master light source, wherein the third electrode is connected to the first controller. In one embodiment, step iii) further comprises electrically contacting a third electrode and a fourth electrode to the first master light source, wherein the first electrode and the second electrode are connected to a second controller.

In an embodiment, the step i) comprises:
 forming a first active region;
 forming at least one diffraction grating in the active region.
In an embodiment, the step i) comprises:
 forming a first active region;

etching at least one gap in the active region.

In an embodiment, the step i) comprises:
forming the first slave light source;
forming the first master light source;
flip-chip mounting the first slave light source and the first master light source on the first semiconductor substrate.

In one embodiment, the substrate is a first conductivity type, step i) comprises forming a layer having a second conductivity type for each of the first master light source and first slave light source and step iii) comprises electrically contacting the first electrode to the substrate and electrically contacting the second electrode to the layer having the second conductivity type.

In one embodiment, step ii) comprises forming a first region of a first conductivity type adjacent to a first edge of the first master light source and the first slave light source and a second region of a second conductivity type adjacent to a second edge of the first master light source and the first slave light source and step ii) comprises electrically contacting the first electrode to the first region and electrically contacting the second electrode to the second region.

In one embodiment, step iii) comprises forming the interference apparatus on the first semiconductor substrate.

In an embodiment, the step i) comprises:
forming a buffer layer on the first semiconductor substrate;
forming a first distributed Bragg reflector of a first conductivity type;
forming a first active region;
forming a distributed Bragg reflector of a second conductivity type;
forming a second active region;
forming a second distributed Bragg reflector of the first conductivity type;
etching the device to expose a part of the distributed Bragg reflector of the second conductivity type;
electrically contacting a third electrode to the substrate;
wherein step iii) comprises electrically contacting the first electrode to the second distributed Bragg reflector of the first conductivity type and electrically contacting the second electrode to the distributed Bragg reflector of the second conductivity type.

FIG. 1 is a schematic illustration of an example of an interference system 100 using phase randomised pulses of light, in which two light sources are connected to a beam splitter 106. The light pulses emitted from each light source interfere at the beam splitter 106. The phases $\phi_i$ and $\emptyset_j$ of each light pulse emitted from each light source have a random relationship to the phases $\phi_{(i+1)}$ and $\emptyset_{(j+1)}$ of each subsequently emitted light pulse. Detector 107 is connected to one output of the beam splitter and detector 108 is connected to the other output of the beam splitter.

The light pulses generated by the first pulsed light source 101 and the second pulsed light source 102 are initially generated by spontaneous emission and then amplified by stimulated emission. Spontaneous emission is a random, unpredictable process. Therefore the light pulses generated by the first pulsed light source 101 and the second pulsed light source 102 exhibit time jitter. Time jitter is any time deviation of an optical pulse edge from its ideal position, measured from a reference point. The reference point may be provided by the electrical clock driving the optical emission of the pulse. The pulse edge is the time when the pulse reaches half of its average peak value. The average value of the deviation from the reference point over a large number of pulses, i.e. the average time jitter, can be measured. The range of the time jitter range can also be measured, i.e. the maximum and minimum values of the deviation from the reference point over a large number of pulses. Time jitter is schematically represented in FIG. 1 as the splitting of each pulse into three closely spaced pulses.

A large time jitter exhibited by the light pulses may cause poor interference visibility. The random variation in the emission times of the light pulses means that a light pulse from the first pulsed light source 101 and a light pulse from the second pulsed light source 102 will enter the beam splitter 106 at slightly different times. The temporal overlap between the light pulses at the beam splitter will be smaller and thus the interference visibility will be poor.

Generation of phase randomised light pulses, which are used in QKD or MDI-QKD applications for example, can be accomplished using a gain-switched laser diode. Alternatively, phase randomised light pulses can be generated using a laser such as a mode-locked pulsed laser followed by a separate unit for the random modulation of the phase. Alternatively a coherent source, followed by an intensity modulator which chops the light into pulses and a phase modulator which randomises the phase of the pulses, can produce phase-randomised light pulses with small time jitter. However, such a light source is bulky and complex. For example, the light source may be followed by and synchronised with one or more modulators to achieve a desired pulse sequence and phase randomness.

Figure 2:
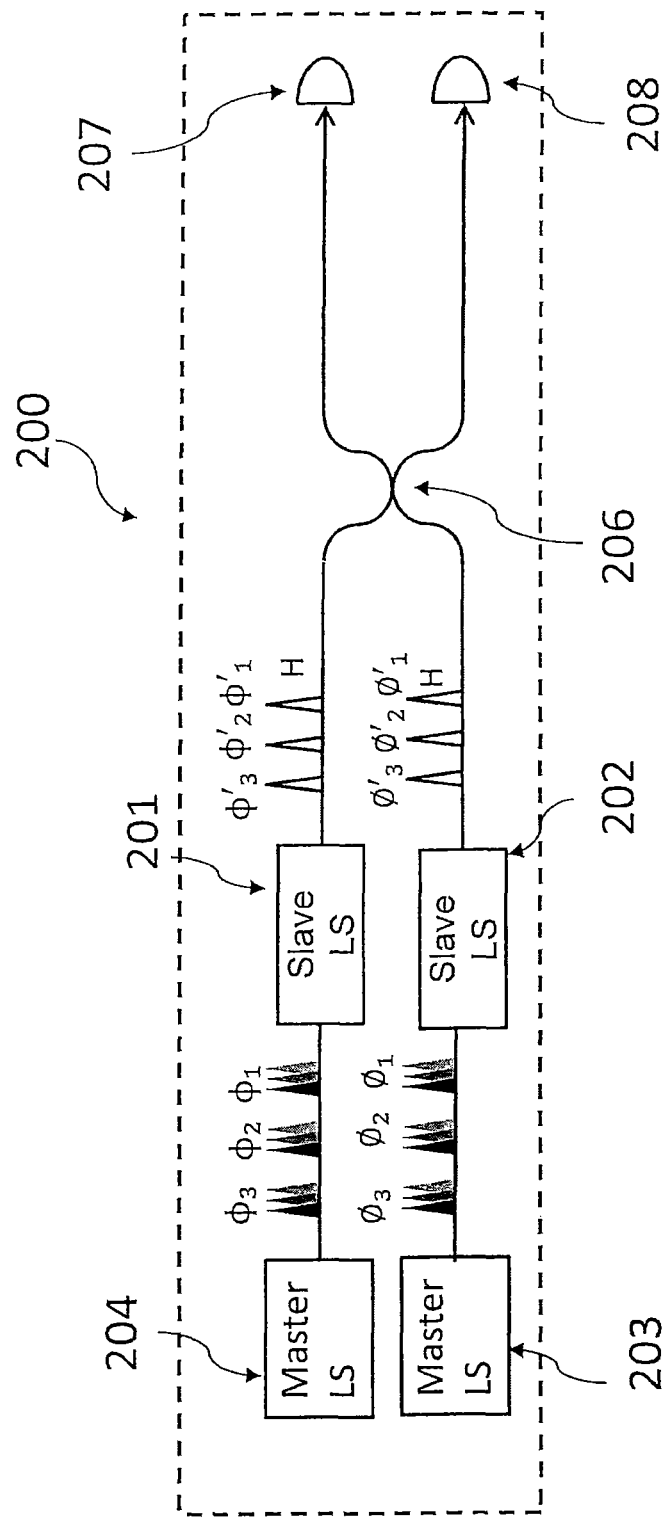
FIG. 2 is a schematic illustration of an interference system in accordance with an embodiment.

FIG. 2 is a schematic illustration of an interference system 200 according to an embodiment. In this system, a first master light source 204 and a first slave light source 201 substitute the first pulsed light source 102 of FIG. 1. A second master light source 203 and a second slave light source 202 substitute the second pulsed light source 103 of FIG. 1.

In an embodiment, the first master light source 204 and the first slave light source 201 are integrated on a first substrate, as described in relation to FIGS. 18 to 36. The second master light source 203 and the second slave light source 202 may also be integrated on the first substrate. A beam splitter 206 may also be integrated onto the first substrate. The detector 207 and detector 208 may also be integrated onto the first substrate. Alternatively, the second master light source 203 and the second slave light source 202 may be integrated on a second substrate. The beam splitter 206 may be on a third substrate, for example. The detector 207 and detector 208 may also be integrated onto the third substrate, for example.

The master light pulses are injected into the cavity of the slave light sources. Each light pulse emitted by the slave light sources is generated after a light pulse from the master light source has entered the cavity of the slave light source. The presence of the master light pulse in the cavity of the slave light source means that the slave light pulse is started by stimulated emission and not by spontaneous emission. In the light sources shown in FIG. 1, the mechanism that activates the lasing action is spontaneous emission. In the slave light sources in FIG. 2, the mechanism that activates the lasing action is photons from the master light pulses. The time jitter of the slave light pulses is therefore less than the time jitter of the master light pulses. Furthermore, the time jitter of the slave light pulses generated with injection of the master light pulses is less than the time jitter of light pulses generated without injection of master light pulses (such as is shown in FIG. 1 for example). The interference system 200 has good interference visibility due to the low time jitter of the slave light pulses.

Each generated slave light pulse has a fixed phase relation to the corresponding injected master light pulse. In other words, the slave light pulses have a fixed phase relationship with the master light pulses. If the phase of each injected master light pulse is random with respect to the phase of each subsequently injected master light pulse, then the phase of each generated slave light pulse is random with respect to the phase of each subsequently generated slave light pulse. In other words, where the phases $\phi_i$ and $\varnothing_j$ of each light pulse emitted from each master light source 203 and 204 have a random relationship to the phases $\phi_{(i+1)}$ and $\varnothing_{(j+1)}$ of each subsequently emitted light pulse, the phases $\phi'_i$ and $\varnothing'_j$ of each light pulse emitted from each slave light source 201 and 202 have a random relationship to the phases $\phi'_{(i+1)}$ and $\varnothing'_{(j+1)}$ of each subsequently emitted light pulse.

The first master light source 204, the second master light source 203, the first slave light source 201 and the second slave light source 202 can be any type of light source that generates pulses of light. In one embodiment, the master light sources and slave light sources are gain-switched lasers. The operation of a gain-switched laser will now be described in more detail in relation to FIG. 3 below. In one embodiment, they may be semiconductor laser diodes. Further examples include fibre lasers and solid state lasers.

Figure 3B:
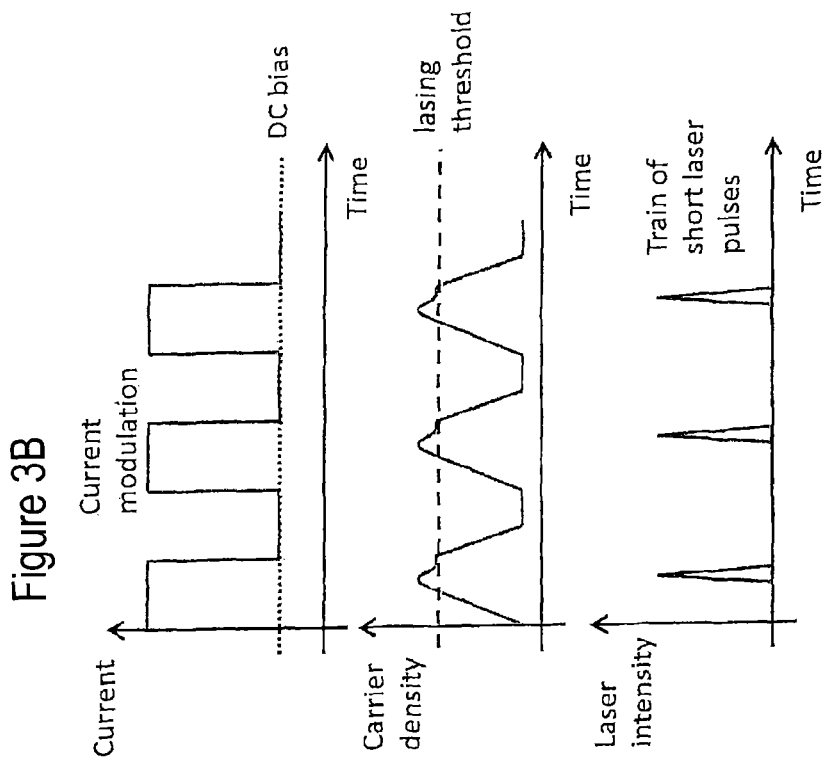
FIG. 3B is a series of graphs showing the gain modulation applied to the laser, the effect of the gain modulation on carrier density and the output light pulses.
Figure 3A:
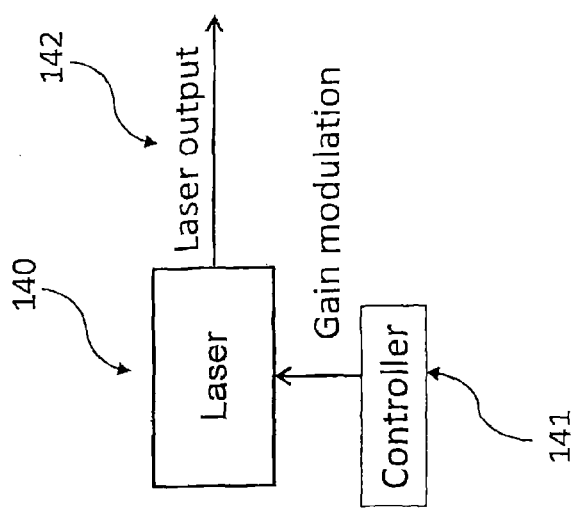
FIG. 3A is a schematic illustration of a gain-switched laser.

FIG. 3A shows a schematic illustration of a gain-switched laser. A gain-switched laser generates light when the laser is switched above the lasing threshold and generates almost no light when the laser is switched below the lasing threshold. Laser 140 has a controller 141 which modulates the gain of the laser by modification of the pump power. The gain is modulated in a time varying manner, and may be modulated in a periodic manner. Driving the laser in this manner generates laser pulses at the laser output 142. The laser pulses may be of the order of picoseconds in duration.

If laser 140 is a semiconductor laser then it can be pumped electrically, by applying a current or voltage. In order to modulate the gain of a semiconductor laser, the controller 141 modulates the current or voltage applied to the laser.

If laser 140 is a fiber laser or solid state laser, it can be pumped optically. In order to modulate the gain of a fiber laser or solid state laser the controller 141 modulates the optical input applied to the laser.

FIG. 3B shows three graphs illustrating a gain modulation of a semiconductor gain-switched laser. The upper graph shows the current applied to the laser on the vertical axis, with time on the horizontal axis. The DC bias is indicated by a horizontal dotted line. The current applied to the laser has the form of a series of current modulation pulses. The wave in this case is a square-type waveform. A different gain modulation signal can be used, for example a sine wave, or a non-periodic time varying signal. In this case, the current is not reduced to zero in between the current modulation pulses, but only reduced to a bias value (which is indicated by the dotted line).

The current modulation signal is applied to the laser and switches the gain of the laser above and below the lasing threshold periodically. The second graph shows the carrier density of the laser on the vertical axis, against time on the horizontal axis. The lasing threshold is indicated by a dashed horizontal line. When a current modulation pulse is applied to the laser, the injected carriers increase the carrier density and the photon density increases.

The laser output generated by the modulation signal is shown in the lower graph. The vertical axis shows the laser intensity, with time on the horizontal axis. The laser outputs light when the carrier density is above the lasing threshold. Photons generated by spontaneous emission inside the laser cavity are amplified sufficiently by stimulated emission to generate an output signal. The length of the delay between the application of the current modulation pulse and the generation of the output light depends on several parameters, such as the laser type, cavity length and pumping power.

The rapid increase of the photon density causes a decrease in the carrier density. This in turn decreases the photon density, which increases the carrier density. At this point the current modulation pulse is timed to switch back down to the DC bias level, and the laser emission dies off quickly. The laser output therefore consists of a train of short laser pulses as shown in the lower graph.

To generate longer pulses, the gain bias is chosen to be closer to the lasing threshold. This means that the carrier density crosses the lasing threshold earlier, which gives the light pulse more time to evolve. Initially the light intensity will overshoot and quickly reduce the carrier density. This in turn causes the photon density to decrease and the carrier density to increase, in turn increasing the light intensity. This competing process causes oscillations of the light intensity at the beginning of the pulse which are strongly damped, leading quickly to a steady-state where the intensity is constant. The oscillations are called relaxation oscillations. The laser pulse ends when the current pulse ends and switches the current to the bias value again.

Figure 3C:
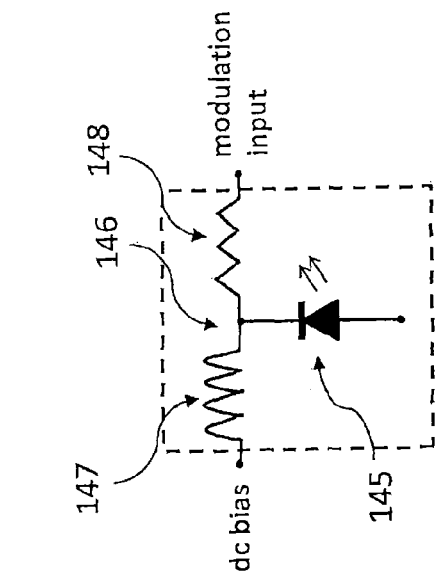
FIG. 3C is a schematic illustration of an electrical driving circuit for a semiconductor gain-switched laser.

FIG. 3C shows a schematic illustration of an electrical driving circuit for a semiconductor gain-switched laser. The semiconductor gain-switched laser is laser diode 145. The cathode of laser diode 145 is connected to bias-T 146 comprising inductor 147 and resistor or capacitor 148. These components make up a gain modulation unit for the semiconductor laser diode 145. Via inductor 147 a DC bias current is sent through the laser diode. This provides the gain bias (the minimum level of the current indicated by the dotted line in FIG. 3B). Via resistor or capacitor 148 an AC modulation current is sent through the laser diode, providing the gain modulation needed for gain-switching the laser above and below the lasing threshold.

A gain switched laser can generate phase-randomised light pulses. The light pulses exhibit time jitter.

Figure 4:
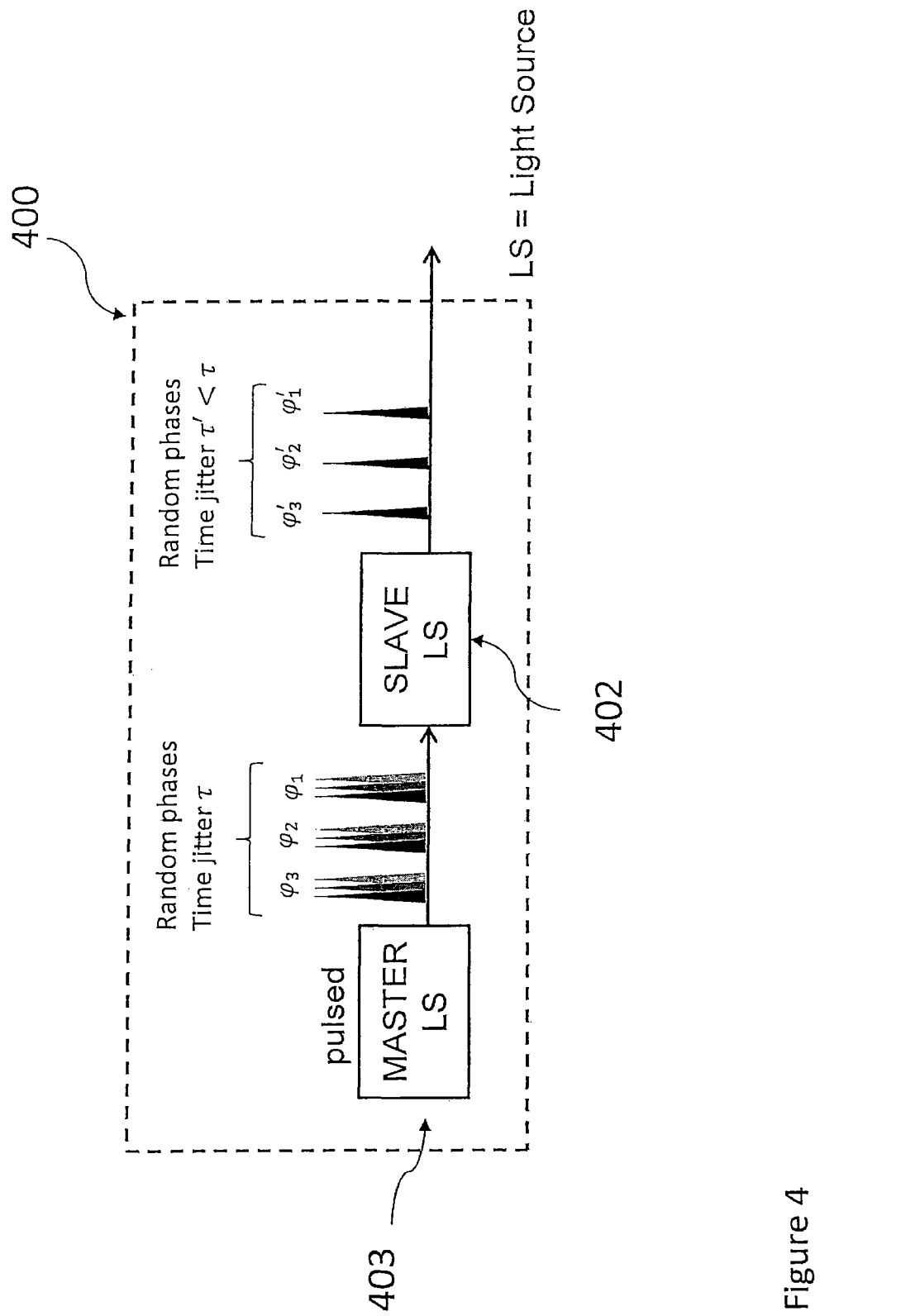
FIG. 4 is a schematic illustration of a light source that can be embedded in an interference system in accordance with an embodiment.

FIG. 4 is a schematic illustration of a phase-randomised light source 400 that can be used in an interference system in accordance with an embodiment.

In an embodiment, the master light source 403 and the slave light source 402 are integrated on a substrate, as described in relation to FIGS. 18 to 36. The master light source 403 and slave light source 402 will comprise electrodes which control and synchronise them, and which are connected to the controller (not shown).

The light source works on the mechanism of pulsed and phase-randomised seeding.

The pulsed master light source 403 can be a gain-switched semiconductor laser as described in relation to FIG. 3. A controller (not shown) drives the master light source 403 such that it generates pulses of light, for example as described above in relation to FIG. 3.

The master light source 403 emits light pulses having a random phase relationship. This means that the phase of each light pulse emitted from the master light source has a random relationship to the phase of each subsequent light pulse. The master light pulses are injected into the slave light source 402. The slave light source 403 can be a gain-switched semiconductor laser as described in relation to FIG. 3. A controller (not shown) is configured to apply a periodic signal to the slave light source so that one light pulse is generated during each period of time for which a master light pulse is injected. Each generated slave light pulse has a fixed phase relation to the injected master light pulse.

Although the phase of the master light pulses is described as being random, in practice there might be a finite amount of correlations between the phases of two light pulses emitted in quick succession. By describing the phase difference as random, it is meant that these correlations are small and decay rapidly. In one embodiment, there are no measurable correlations for two light pulses that are emitted 400 ps apart. In one embodiment, there are no measurable correlations for two light pulses that are emitted 1 ns apart. In one embodiment, there are no measurable correlations for two light pulses which are emitted 10 ns apart. In one embodiment, there are no measurable correlations for pulses emitted 100 ns apart.

Not all light sources produce pulses with a random phase relationship. A mode-locked pulsed laser for example cannot produce pulses having a random phase relationship. Specific driving conditions for the master light source 403 can be used in order for a random phase relationship to occur between the generated master light pulses. For example, a semiconductor gain switched laser can produce pulses having a random phase relationship if the empty cavity condition is met. This is explained in more detail below.

The random nature of the phase of each light pulse generated arises because each light pulse is initiated through spontaneous emission. Spontaneous emission can be ascribed to the vacuum fluctuations of the optical field. In a gain-switched laser diode, spontaneous emission influences the electromagnetic phase of each generated pulse. When the laser cavity is empty, i.e. in the vacuum state, prior to lasing the lasing action is triggered entirely by spontaneous emission. Spontaneous emission inherits its electromagnetic phase from the vacuum, the phase of which is totally unbiased and random.

The empty cavity condition can be reached when cavity photons have a sufficient time to decay prior to each lasing event. For example, when a laser diode is gain-switched with a 2.5 GHz square wave, the average residual photon number of the cavity before the generation of each pulse is $10^{-10}$. This intensity is orders of magnitude weaker than the spontaneous emission. In one embodiment, when the master light source is under a driving frequency of less than or equal to 4.0 GHz, each master light source pulse will have a random electromagnetic phase.

The controller is thus configured to drive the master light source such that there is sufficient time for residual cavity photons to decay between each lasing event that the master light pulses are initiated through spontaneous emission instead of residual cavity photons. In one embodiment, the controller is configured to drive the master light source with a time varying current or voltage having a frequency of less than or equal to 4.0 GHz. In one embodiment, the controller is configured to drive the master light source with a time varying current or voltage with a frequency of less than or equal to 2.5 GHz. In one embodiment, the time gap between each generated master light pulse is greater than or equal to 125 ps. In one embodiment, the time gap between each generated master light pulse is greater than or equal to 200 ps.

The master light source 403 is connected to a first aperture of a slave light source 402 by a waveguide, for example an optical fibre. A second waveguide, for example an optical fibre is connected to a second aperture of the slave light source 402. Alternatively, the light pulses may travel between the components of the phase randomised light source 400 through free space (meaning that no waveguides are required to connect the components such as the master light source 403 and the slave light source 402). In an alternative embodiment, the waveguide is a waveguide region integrated on the substrate between the master light source 403 and the slave light source 402.

The slave light source 402 may also be a gain-switched semiconductor laser as described in relation to FIG. 3. Alternatively, the slave light source 402 can be any type of light source that generates pulses of coherent light. A controller (not shown) drives the slave light source 402 such that it generates pulses of light, for example as described above in relation to FIG. 3. A single controller may drive both the slave light source and the master light source. Alternatively, a separate controller may drive each light source. This is described further in relation to FIGS. 5 and 6 below.

Master light source 403 generates a sequence of light pulses which are referred to as master light pulses. The phase of each master light pulse has a random relationship to the phase of each subsequently generated master light pulse. In FIG. 4, the master light source 403 produces a train of pulses with random electromagnetic phases $\phi_1, \phi_2, \phi_3, \ldots$, and a large time jitter $\tau$ represented by the triplets of pulses. The triplets of pulses represent that fact that the light pulse could have been emitted at the time of the first, second, or third triplet pulse, and it is not known at which time it is emitted. The master pulses are then injected as "seeds" into the slave light source 402, leading to pulsed injection seeding.

In other words, the master light pulses are emitted from the master light source 403 into the waveguide, and enter slave light source 402 through the first aperture. Light from master light source 403 enters the optical cavity of the slave light source 402 and causes pulsed injection seeding of the slave light source 402. The term pulsed injection seeding can refer to laser seeding, or seeding by a light source other than a laser. Slave light pulses are generated through pulsed injection seeding and are emitted from a second aperture of the slave light source 402.

The random phase relationship of the master light pulses means that each slave light pulse will also have a random phase with respect to each subsequently generated slave light pulse. When pulsed injection seeding occurs, each time the slave light source 402 is switched above the lasing threshold, the generated slave light pulse has a fixed phase relation to the injected master light pulse. As only one slave light pulse is generated for each injected master light pulse, each slave light pulse has a random phase relationship to each subsequently generated slave light pulse (because each master light pulse has a random phase relationship to each subsequently generated master light pulse). Under proper operating conditions, for example, those described in relation to FIGS. 5 and 6 below, the slave light source 402 generates a new train of pulses, which still exhibit random electromagnetic phases $\phi_1', \phi_2', \phi_3', \ldots$, but have a smaller time jitter $\tau' < \tau$.

In order for pulsed injection seeding to occur, the frequency of the injected master light pulses must match the frequency of the slave light source 402 to within a certain range. In one embodiment, the difference in the frequency of the light supplied by the master light source 403 and the frequency of the slave light source 402 is less than 30 GHz. In some embodiments, where the slave light source 402 is a distributed feedback (DFB) laser diode the frequency difference is less than 100 GHz.

For successful pulsed injection seeding the relative power of the master light pulses that enter the optical cavity of the slave light source 402 has to be within certain limits which depend on the type of light source that is used. In one embodiment, the optical power of the injected master light pulses is at least 1000 times lower than the optical output power of the slave light source 402. In one embodiment, the optical power of the injected master light pulses is at least 100 times lower than the optical output power of the slave light source 402. The master light source 403 can comprise a fixed optical attenuator that reduces the intensity of the master light pulses emitted. Alternatively, the master light source 403 can comprise an adjustable optical attenuator that is adjusted only slowly. The intensity of the generated slave light pulses depends on the intensity of the master light pulses. Indeed, with the correct driving conditions, no slave light pulses are generated at all if no master light pulses are injected. The master light source 403 can comprise an intensity modulator that varies the intensity of the generated master light pulses before they are supplied to the slave light source 402, in order to vary the intensity of the generated slave light pulses. The phase-randomised light source 400 can comprise a second optical attenuator that reduces the intensity of the slave light pulses generated by the slave light source 402 or an intensity modulator that varies the intensity of the slave light pulses generated by the slave light source 402.

In one embodiment, slave light source 402 and master light source 403 are electrically driven, gain-switched semiconductor laser diodes. In one embodiment, the slave light source and master light source have the same bandwidth. In one embodiment, both light sources have a bandwidth of 10 GHz. In one embodiment, both light sources have a bandwidth of 2.5 GHz. Here, the bandwidth means the highest bit rate achievable with the gain-switched laser diode under direct modulation. A laser of a certain bandwidth can be operated at a lower clock rate.

A light source, for example a gain-switched laser, referred to as a master light source, produces a train of phase randomised light pulse with time jitter τ and seeds a second light source, which may also be a gain switched laser, referred to as a slave light source, which produces a train of phase randomised light pulses with time jitter $\tau'<\tau$.

The master light source generates phase-randomised light pulses that are injected into the slave light source. This reduces the time jitter of the pulses emitted by the slave light source, relative to the time jitter of pulses emitted by the slave light source without master light pulses being injected. The generated slave light pulses are phase randomised. For a reduction of the time jitter, the light from the master laser must be in the cavity of the slave laser before the slave laser gain increase is activated. Thus when the slave laser gain modulation signal is switched on, or increased above the lasing threshold, the light from the master laser has been generated already. The travelling time of the light from the master laser to the slave laser is negligible.

Reducing the time jitter of the slave light pulses before they are used in an interference apparatus means that the interference visibility is increased. For example, if the slave light pulse is a gain-switched laser which produces pulses with full width at half maximum (FWHM) of 35 ps with a r.m.s. time jitter around 7 ps, the time jitter is about 20% of the FWHM. It can be shown in simulation that such a time jitter may reduce visibility of an interference experiment to less than 90%, regardless of the specific bandwidth considered. A direct measurement using a laser, photodiode and oscilloscope shows that the time jitter can be reduced by a factor of up to 6 by seeding the slave light source with a master light source.

Figures 5A, 5B:
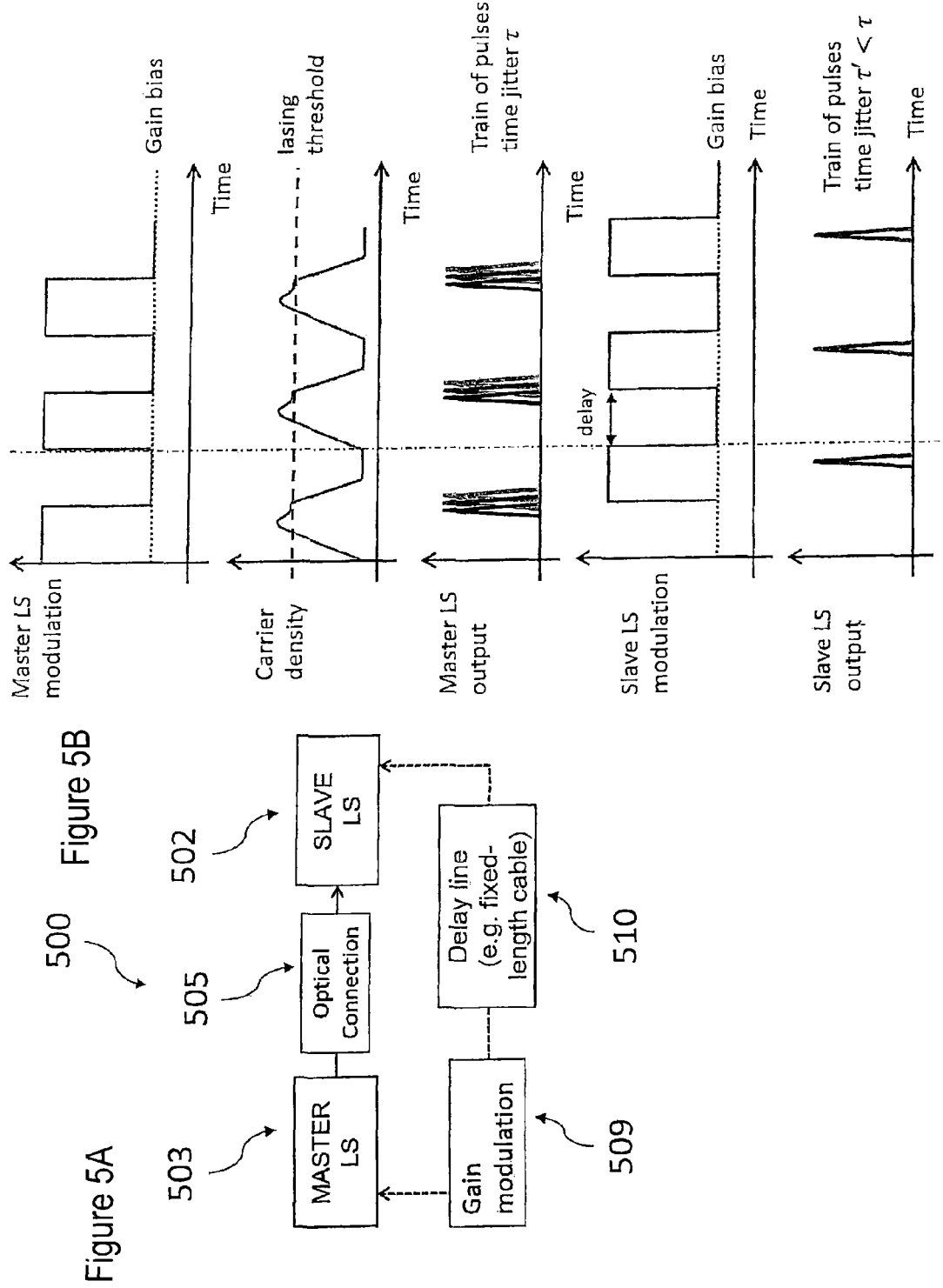
FIG. 5A is a schematic illustration of a light source that can be embedded in an interference system in accordance with an embodiment, in which a single controller drives the master and slave light sources.
FIG. 5B is a series of graphs showing the gain modulation applied to the master laser, the effect of the gain modulation on carrier density, the output master light pulses, the gain modulation applied to the slave laser and the output slave light pulses.

FIG. 5A is a schematic illustration of a driving scheme for the phase-randomised light source 500 for which both the master light source 503 and the slave light source 502 are driven with a single gain modulation unit 509. The master light source 503 and the slave light source 502 and the optical connection 505 between them can be integrated on a substrate, as described in relation to FIGS. 18 to 36. The gain modulation unit 509 and delay line 510 are an example of a controller which is configured to apply a time varying drive signal to the slave light source 502 such that just one light pulse is generated during each period of time for which a master light pulse is received. The master light source 503 is connected to the slave light source 502 via an optical connection 505. The optical connection 505 could be a waveguide, for example an optical fibre (as shown in FIG. 4). Alternatively, the light pulses may travel between the master light source 503 and the slave light source 502 through free space. The optical connection 505 can be a waveguide region integrated on the substrate between the master light source 503 and the slave light source 502. The optical connection 505 may include further components such as an optical circulator or a beam splitter. This is described further in relation to FIG. 7.

A gain modulation unit 509 drives both the master light source 503 and the slave light source 502. Where the master light source 503 and the slave light source 502 are both gain-switched semiconductor lasers, the gain modulation unit may be a gain modulation circuit such as in FIG. 3C. The gain modulation unit drives the master light source 503 and the slave light source 502 to generate pulses of light. The delay line 510 is used to synchronise the apparatus. The delay line could be, for example, a fixed length cable. The gain modulation unit is directly connected to the master light source 503. For example, where the master light source 503 is a semiconductor laser, a gain modulation circuit is electrically connected to the master light source 503. The gain modulation unit 509 is connected to the slave light source 502 through delay line 510. By properly tuning the delay between the master light source 503 and the slave light source 502, the time jitter of the pulses can be reduced. The range of the delay should cover the clock period of the light sources. For example, when the master light source 503 and the slave light source 502 are pulsed at a clock frequency of 2.5 GHz, a tuneable delay with a range of 400 ps can be used. In order for the time jitter to be reduced, when the gain modulation is applied to the slave light source 502, the light from the master light source 503 is already in the cavity of the slave light source 502. The travelling time between master light source 503 and slave light source 502 is negligible.

FIG. 5B shows a temporal sequence for the single gain modulation scheme shown in FIG. 5A. The upper graph shows the gain modulation applied to the master light source 503. The gain modulation is a time varying drive signal, having the form of a square wave, which when applied to the master light source, increases the carrier density above and below the lasing threshold. In other words, the gain modulation is a series of pulses. In between the pulses, the gain has a minimum value, which is the gain bias and is indicated by the dotted line.

The next graph shows the carrier density of the master light source 503. Each gain modulation pulse increases the carrier density above the lasing threshold, indicated by the dashed line. The next graph shows the output of the master light source 503. One light pulse is outputted each time the carrier density increases above the lasing threshold. As explained in relation to FIG. 3, there can be a delay between when the gain increases and when a light pulse is outputted. The master light pulses have a large time jitter T.

The next graph shows the gain modulation applied to the slave light source 502. The gain modulation is the same as that applied to the master light source 503, with the addition of the time delay labelled by an arrow. The gain modulation is a time varying drive signal applied to the slave light source. In other words, the gain modulation applied to the slave light source 502 is shifted in time with respect to the gain modulation applied to the master light source 503. Each periodic increase in gain is applied to the slave light source 502 later than it is applied to the master light source 503. The delay in this case is around half a period of the gain modulation signal. The delay means that the periodic increase in gain is applied to the slave light source 502 after the master light pulse has been injected. Therefore the master light pulse is present in the slave laser cavity when the gain increase is applied, and the resulting slave light pulse is generated by stimulated emission from the master light pulse. This means that the generated slave light pulse has a fixed phase relation to the injected master light pulse, and a low time jitter.

The slave light source 502 is switched above the lasing threshold after the master light pulse has been injected such that a slave light pulse is initiated by stimulated emission caused by the injected master light pulse. The final graph shows the output of the slave light source 502. Only one slave light pulse is outputted each time the carrier density increases above the lasing threshold. Again, there can be a delay between the increase in gain modulation and the outputted light pulse. The time jitter of the outputted slave light pulses is $\tau'<\tau$.

In the system shown in FIG. 5, gain modulation unit 509 applies a time varying gain modulation to the slave light source 502 such that it is switched above the lasing threshold only once during the time that each master light pulse is incident. The switching of the slave light source 502 is synchronised with the arrival of the master light pulses because the same gain modulation signal is applied to both light sources, and a delay line delays the application of the increase in gain to the slave light source 502 with respect to the master light source 503.

In the system shown in FIG. 5B, the time varying gain modulation signal has a square type wave form. However, the time varying gain modulation can comprise signals with arbitrary pulse shape.

Where the light sources are gain-switched semiconductor lasers, the gain modulation signal is an applied current or voltage. In one embodiment, the gain modulation signal is an applied current or voltage with a square type wave form. In an alternative embodiment, the time varying current or voltage is an electrical sine wave generated by a frequency synthesizer. In one embodiment, the frequency of the gain modulation signal is less than or equal to 4 GHz. In one embodiment, the frequency is 2.5 GHz. In one embodiment, the frequency is 2 GHz.

A gain-switched semiconductor laser has a good extinction ratio between the state when pulses are emitted and the "off" state. It can be used to generate very short pulses. In one embodiment, the duration of each of the slave light pulses is less than 200 ps. In one embodiment, the duration of each of the slave light pulses is less than 50 ps. In one embodiment, the duration of each of the slave light pulses is of the order of a few picoseconds. In one embodiment, where the time varying current or voltage is a square wave current or voltage with a frequency of 2 GHz, the short light pulses are 500 ps apart.

In the light source shown in these figures, the master light source and the slave light source share the same electrical driver for gain modulation.

FIG. 6A is a schematic illustration of a driving scheme for the phase-randomised light source 600 for which the master light source 603 and the slave light source 602 are driven with separate gain modulation units. The master light source 603 and the slave light source 602 and the optical connection 605 between them can be integrated on a substrate, as described in relation to FIGS. 18 to 36. The gain modulation unit 609b, adjustable delay 610 and clock 611 are an example of a controller which is configured to apply a time varying drive signal to the slave light source 602 such that just one light pulse is generated during each period of time for which a master light pulse is received. The gain modulation unit 609a and clock 611 are an example of a second controller which is configured to supply a second time varying drive signal to the master light source 603. The first signal and second signal are synchronised. The master light source 603 is connected to the slave light source 602 via an optical connection 605. The optical connection 605 could be a waveguide, for example an optical fibre, such as shown in FIG. 4. Alternatively, the light pulses may travel between the master light source 603 and the slave light source 602 through free space. The optical connection 605 can be a waveguide region integrated on the substrate between the master light source 603 and the slave light source 602. The optical connection (605) may include further components such as an optical circulator or a beam splitter. This is described further in relation to FIG. 7.

A gain modulation unit 609a drives the master light source 603 and a gain modulation unit 609b drives the slave light source 602. Where the master light source 603 and the slave light source 602 are both gain-switched semiconductor lasers, the gain modulation units may be gain modulation circuits such as in FIG. 3C. The gain modulation units drive the master light source 603 and the slave light source 602 such that they generate pulses of light.

The delay line 610 and the clock 611 are used to synchronise the apparatus. The delay line could be, for example, a fixed length cable. The gain modulation unit 609a is directly connected to the master light source 603. The gain modulation unit 609b is directly connected to the slave light source 602. For example, where the light sources are semiconductor lasers, the gain modulation circuits are electrically connected to the light sources.

The clock 611 is directly connected to the gain modulation unit 609a. The clock is connected to the gain modulation unit 609b through delay line 610. The clock triggers each increase in gain over the lasing threshold, i.e. it triggers each pulse in the gain modulation signal. The gain bias for the master light source is higher than the gain bias applied in the system in FIG. 5. The duration of time for which the gain modulation signal is increased above the lasing threshold may also be longer for the master light source 603 than the slave light source 602. In the example shown, the gain modulation pulses applied to the master light source 603 are longer than those applied to the slave light source 602. By properly tuning the delay between the master light source 603 and the slave light source 602, the time jitter of the pulses can be reduced. The range of the delay should cover the clock period of the light sources. For example, when the master light source and the slave light source are pulsed at a clock frequency of 2.5 GHz, a tuneable delay with a range of 400 ps can be used. In order for the time jitter to be reduced, when the gain modulation is applied to the slave light source 602, the light from the master light source 603 is already in the cavity of the slave light source 602. The travelling time between master light source 603 and slave light source 602 is negligible.

FIG. 6B shows a temporal sequence for the gain modulation scheme shown in FIG. 6A. The upper graph shows the gain modulation applied to the master light source 603. The gain modulation is a time varying drive signal, having the form of a square wave. In other words, the gain modulation is a series of pulses. In between the pulses, the gain has a minimum value, the gain bias, indicated by the dotted line. Each pulse increases the carrier density of the master light source above the lasing threshold, indicated by the dashed line. In order to generate longer master light pulses than those generated in FIG. 5B, the gain bias value is closer to the lasing threshold. This means that the carrier density crosses the lasing threshold earlier, which gives the light pulse more time to evolve.

The next graph shows the carrier density of the master light source. The lasing threshold is indicated by a dashed line. The carrier density crosses the lasing threshold almost immediately after the increase in gain is applied, because the gain bias is high. The carrier density oscillates and then remains at a steady value above the lasing threshold until the gain modulation signal decreases.

The next graph shows the output of the master light source 603. One light pulse is outputted each time the gain increases above the lasing threshold. The duration of the master light pulses is longer than the duration of the master light pulses in FIG. 5B, because the gain bias is increased compared to the gain bias used in FIG. 5B. The duration of the master light pulses is approximately the same as the duration of the gain modulation pulse. The master light pulses have a spike-like temporal intensity profile followed by a plateau-like temporal intensity profile. The plateau-like part has a longer duration than the spike-like part, and the maximum intensity of the plateau-like part is less than the maximum intensity of the spike-like part. The plateau-like part is emitted in a steady state, in other words, the variation in the intensity over the duration of the plateau-like part is less than 20% of the maximum intensity of the plateau-like part. The master light pulses have a large jitter $\tau$ at the rising edge of each light pulse. The falling edge of the master light pulses is defined by the falling edge of the master light source modulation signal shown in the first graph. There is therefore less time jitter at the falling edge of the master light pulses. There may be no time jitter at the falling edge of the master light pulses.

The next graph shows the gain modulation applied to the slave light source 602. The gain modulation is also a time varying signal, having the form of a square wave, which increases above and below the lasing threshold. The gain modulation is a time varying drive signal applied to the slave light source. In other words, the gain modulation is also a series of pulses. In between the pulses, the gain has a minimum value, the gain bias, indicated by the dotted line. Each pulse increases the gain above the lasing threshold, indicated by the dashed line. The duration of the pulses is less than the duration of the pulses of the gain modulation signal applied to the master light source 603. However, the period length of both signals is the same. Therefore the gap between the pulses is larger for the gain modulation signal applied to the slave light source 602 than it is for the gain modulation signal applied to the master light source 603.

The gain modulation signal applied to the slave light source 602 is also delayed with respect to the gain modulation signal applied to the master light source 603. This delay is labelled by an arrow. In other words, the gain modulation applied to the slave light source 602 is shifted in time with respect to the gain modulation applied to the master light source 603. Each periodic increase in gain is applied to the slave light source 602 later than it is applied to the master light source 603. The delay in this case is less than half a period of the gain modulation signals. The delay means that the periodic increase in gain is applied to the slave light source 602 after the master light pulse has been injected. Therefore the master light pulse is present in the slave laser cavity when the gain increase is applied, and the resulting slave light pulse is generated by stimulated emission from the master light pulse. This means that the generated slave light pulse has a fixed phase relation to the injected master light pulse.

The final graph shows the output of the slave light source 602. Only one slave light pulse is outputted each time the gain increases above the lasing threshold. Again, there can be a delay between the increase in gain above the lasing threshold and the outputted light pulse. The time jitter of the outputted slave light pulses is $\tau' < \tau$.

In the system shown in FIG. 6, gain modulation unit 609b applies a time varying gain modulation to the slave light source 602 such that it is switched above the lasing threshold only once during the time that each master light pulse is incident. The switching of the slave light source 602 is synchronised with the arrival of the master light pulses, and a delay delays the application of the increase in gain to the slave light source 602 with respect to the master light source 603. The duty cycle of the master light source 603 and the slave light source 602 are controlled independently. A long duty cycle is used for the master light source 603 and a shorter duty cycle is used for the slave light source 602. By properly tuning the delay between when the increase in gain modulation is applied to the master light source 603 and when the increase in gain modulation is applied to the slave light source 602, the time jitter of the slave light pulses can be considerably reduced with respect to the time jitter of the master light pulses. In this configuration, the final repetition rate of the generated light is limited by the master light source 603 duty cycle.

Again, the time varying gain modulation signal has a square type wave form. However, the time varying gain modulation can comprise signals with arbitrary pulse shape.

In these figures, the master light source and the slave light source have different electrical drivers for gain modulation.

Figure 7A:
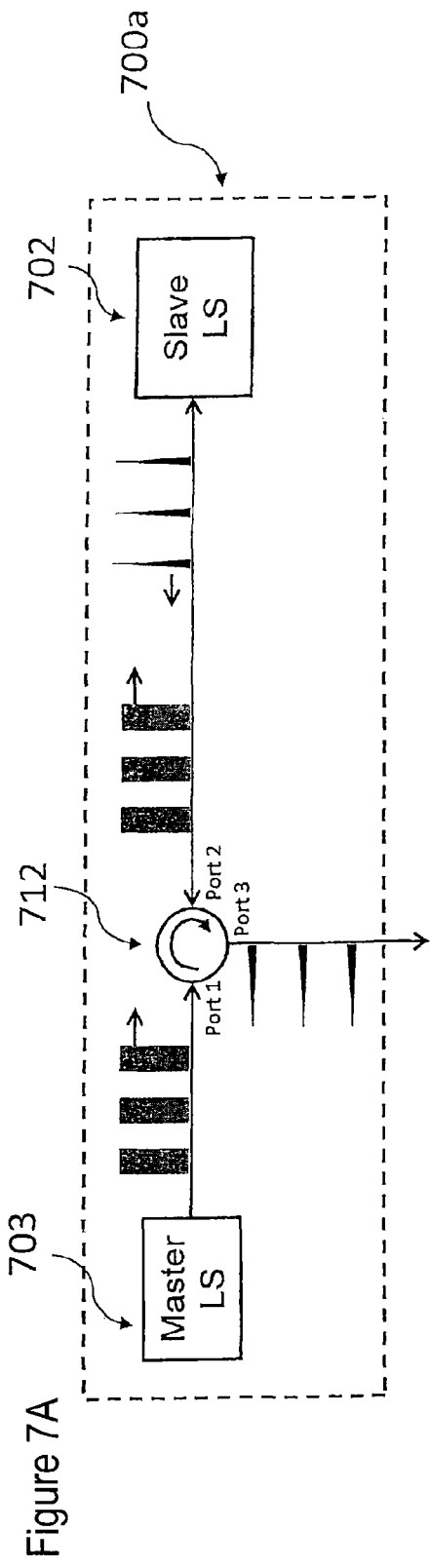
FIG. 7A is a schematic illustration of a light source that can be embedded in an interference system in accordance with an embodiment, comprising an optical circulator.

FIG. 7A is a schematic illustration of a phase-randomised light source 700a that can be used in an interference system according to an embodiment. In an embodiment, the master light source 703 and the slave light source 702 and the optical circulator 712 between them are integrated on a substrate, as described in relation to FIGS. 18 to 36. In this light source, the optical connection is realised by an optical waveguide, for example an optical fibre, connecting the two light sources through an optical circulator, configured such that light entering port 1 exits through port 2, and light entering port 2 exits through port 3. In an embodiment, the optical waveguide is a waveguide region integrated on the substrate. In an alternative embodiment, the light travels between the components through free space. The light pulses generated by the master light source 703 travel along the optical waveguide until it reaches the slave light source 702. The light is injected into the slave light source 702, thus realising the pulsed injection seeding. In this phase-randomised light source 700a, the master and slave light sources are connected using an optical circulator 712 configured such that light entering port 1 of the optical circulator exits through post 2, and light entering port 2 exits through port 3.

Master light source 703 is connected to port 1 of optical circulator 712 by an optical waveguide, for example an optical fibre. Alternatively, the light pulses may travel between the components through free space. In an embodiment, the optical waveguide is a waveguide region integrated on the substrate. Port 2 of the optical circulator 712 is connected to slave light source 702 by an optical waveguide. Optical circulator 712 is configured such that light entering port 1 of the optical circulator 712 exits through port 2, and light entering the optical circulator 712 through port 2 exits through port 3.

Master light source 703 generates master light pulses, which travel along the optical waveguide and enter port 1 of optical circulator 712. Light from the master light pulses mainly exits through port 2 of the circulator, although a small fraction of the light may be absorbed or exit through port 3. Light from the master light pulses exits port 2 of optical circulator 712 and travels along the optical waveguide which is connected to slave light source 702. The master light pulses are injected into slave light source 702. The slave light source 702 is seeded by the master light pulses and generates slave light pulses.

The slave light source 702 is switched above the lasing threshold just once during the time that the each master light pulse is incident on the slave light source 702. Slave light source 702 therefore emits a single slave light pulse corresponding to each master light pulse, which is emitted into the optical waveguide connected to the slave light source 702, and travels along the waveguide in the opposite direction to the master light pulses. The slave light pulses enter port 2 of the optical circulator 712 and exit port 3 of the optical circulator 712 into an optical waveguide, for example an optical fibre. In an embodiment, the optical waveguide is a waveguide region integrated on the substrate.

Figure 7B:
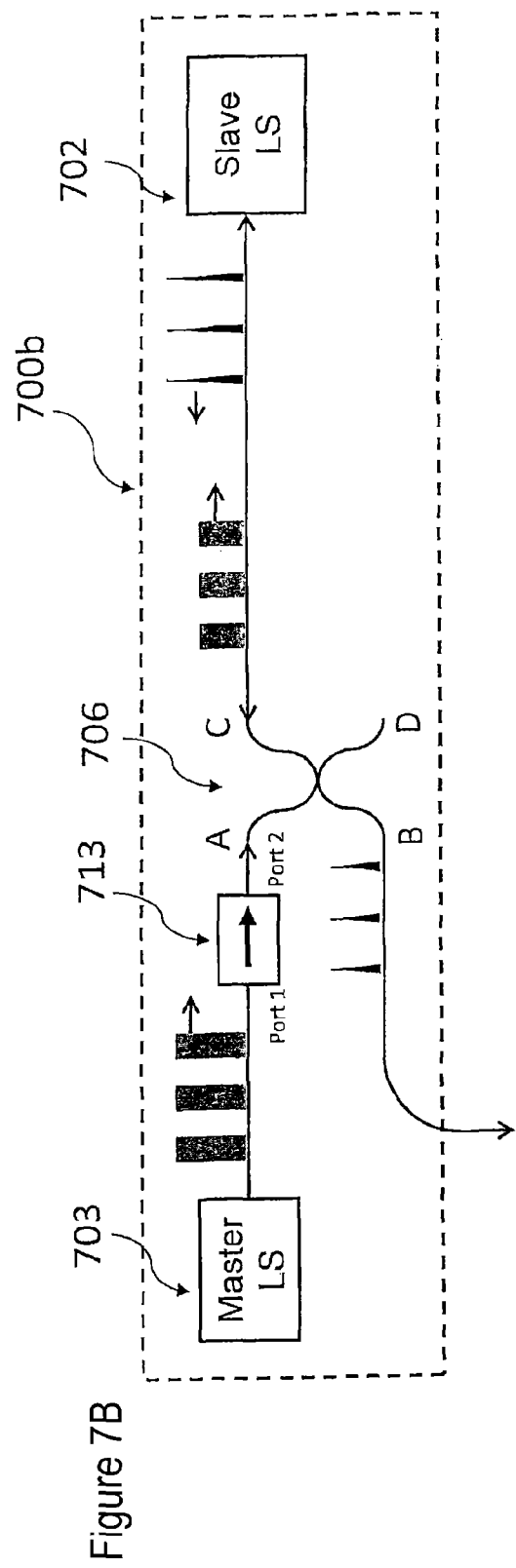
FIG. 7B is a schematic illustration of a light source that can be embedded in an interference system in accordance with an embodiment, comprising a beam splitter.

FIG. 7B is a schematic illustration of a phase-randomised light source 700*b* that can be used in an interference system according to an embodiment. In an embodiment, the master light source 703 and the slave light source 702 and the beam splitter 706 between them are integrated on a substrate, as described in relation to FIGS. 18 to 36. An optical isolator 713 may also be integrated on the substrate. FIG. 7B shows an alternative optical connection used for seeding the slave light source 702, which makes use of an optical isolator 713 followed by a beam splitter 706. In this phase-randomised light source 700*b*, the master and slave light sources are connected using an optical isolator 713 and a beam splitter 706, with optical isolator 713 configured to let light pass from port 1 to port 2 and prevent light from passing from port 2 to port 1.

Master light source 703 is connected to port 1 of optical isolator 713 by an optical waveguide, such as an optical fibre. Alternatively, the light pulses may travel between the components through free space. In an embodiment, the optical waveguide is a waveguide region integrated on the substrate. A port 2 of optical isolator 713 is connected to port A of beam splitter 706 by a second optical waveguide, such as an optical fibre. In an embodiment, the second optical waveguide is a waveguide region integrated on the substrate. Optical isolator 713 is configured to allow light to pass which enters via the port 1, but to prevent light from passing which enters via the port 2. In an alternative embodiment that does not comprise an optical isolator, the output of the master light source 703 is directly connected to port A of beam splitter 706 by a single optical waveguide such as an optical fibre. In an embodiment, the single waveguide is a waveguide region integrated on the substrate. An optical waveguide such as an optical fibre connects port C of the beam splitter 706 to slave light source 702. In an embodiment, the optical waveguide is a waveguide region integrated on the substrate.

Master light source 703 emits a master light pulse which enters the beam splitter 706 through port A. A first fraction of the light entering beam splitter 706 through port A exits through port C of the beam splitter. A second fraction entering the beam splitter 706 through port A exits through port D of the beam splitter. The first fraction of light that exits port C travels along the optical waveguide and is injected into the slave light source 702 and pulsed injection seeding occurs as described previously. The slave light pulses generated by slave light source 702 are emitted back into the optical waveguide, and travel along the waveguide in an opposite direction to the master light pulses. The slave light pulses enter beam splitter 706 through port C. A first fraction of the slave light pulses exit the beam splitter 706 through port A and a second fraction exit through port B.

The first fraction of the slave light pulses exiting the beam splitter 706 through port A is stopped at optical isolator 713. Optical isolator 713 therefore prevents light emitted from slave light source 702 from entering master light source 703 and causing a disturbance in the master light source 703. The output at port D of beam splitter 706 can be used for monitoring purposes.

Selective filtering of light emitted from a light source can be used to try to achieve high quality interference in an interference system.

Figure 8:
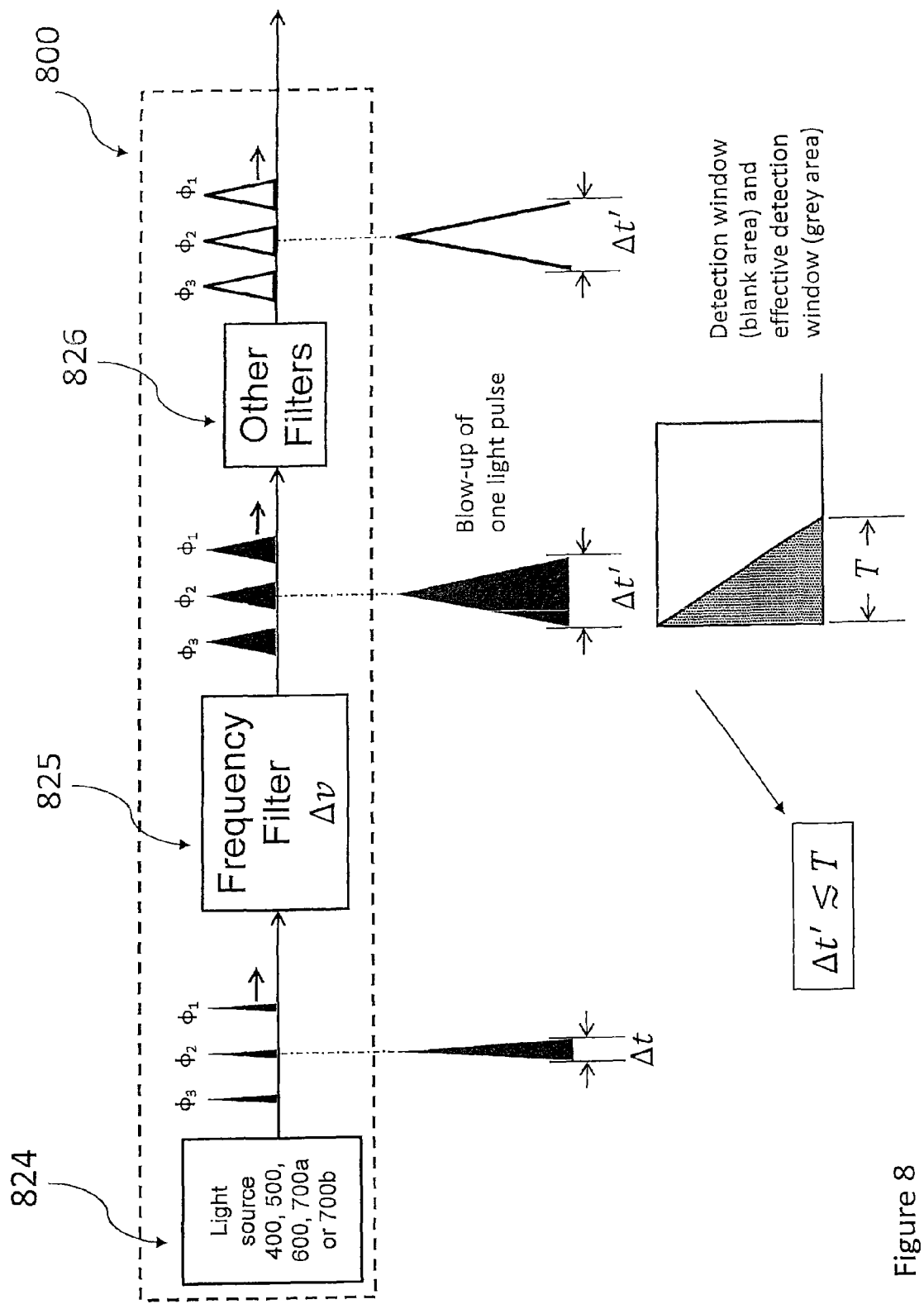
FIG. 8 is a schematic illustration of a light source that can be embedded in an interference system in accordance with an embodiment, comprising a frequency filter.

FIG. 8 is a schematic illustration of a filtered phase-randomised light source 800 that can be used in an interference system according to an embodiment. In an embodiment, the components of the light source 824 are integrated on a substrate, as described in relation to FIGS. 18 to 36. The frequency filter 825 may also be integrated on the same substrate as the light source 824, as described in relation to FIGS. 34 and 35. The other filters 826 may also be integrated on the substrate, as described in relation to FIGS. 34 and 35. The light source 824 is a light source such as phase-randomised light source 400 shown in FIG. 4, phase-randomised light source 500 shown in FIG. 5, phase-randomised light source 600 shown in FIG. 6 or phase-randomised light source 700*a* or 700*b* shown in FIG. 7. Any of these light sources could be used.

The light source 824 is connected to a frequency filter 825 by an optical waveguide, for example an optical fibre. Alternatively, the light pulses may travel between the components through free space. In an embodiment, there is a waveguide region integrated on the substrate between the light source 824 and the frequency filter 825. The frequency filter has a bandwidth of $\Delta v$. A frequency filter may also be referred to as a spectral filter.

Filtering can be used in an interference system in order to increase the coherence of the light and thus improve the final visibility of the interference pattern. However, the filtering does not affect or eliminate the time jitter of a particular pulse. This is because filtering acts on different degrees of freedom, or properties of the light pulses, than time. For example, filtering can affect the frequency or polarisation of the light. Time jitter on the other hand represents a random temporal delay in the interfering pulses that leads to poor final interference visibility. A frequency filter such as shown in FIG. 8 removes frequencies outside the bandwidth from the light pulses.

However using too much frequency filtering, i.e. using filters with very narrow bandwidth $\Delta\nu$, can limit the speed of interference applications. For example, a frequency filter with a narrow bandwidth applied to a Gaussian pulse will make the temporal pulse width $\Delta t$ wider, as prescribed by the time-bandwidth product:

$$\Delta\nu \cdot \Delta t \geq 0.44 \quad \text{(Eq.1)}$$

For example, a filter with $\Delta\nu = 44$ GHz would entail $\Delta t \geq 10$ ps, while filter with $\Delta\nu = 4.4$ GHz entails a pulse width at least 10 times larger, i.e. $\Delta t \geq 100$ ps. This increase in time width is an undesired effect of the frequency filter.

On the other hand, the maximum achievable speed in a system is $\Delta t^{-1}$. Therefore, the maximum speed of a system with $\Delta\nu = 44$ GHz would be 100 GHz, while that of a system with $\Delta\nu = 4.4$ GHz would be 10 times smaller, i.e. 10 GHz.

Therefore, the frequency filter 825 can increase the time width of the pulses travelling through it. The frequency filter 825 does not change the relative phase of the light pulses travelling through it, as it acts on the phase of all the light pulses travelling through it in the same way. In FIG. 8, the time width of the slave light pulses emitted from the light source 824 is $\Delta t$. After the slave light pulses have traveled through the frequency filter 825, the time width is increased to $\Delta t'$. The phase of the slave light pulses $\phi_1, \phi_2, \phi_3, \ldots,$ when emitted from the light source 824 is the same as the phase of the slave light pulses after they have travelled through the frequency filter 825.

Using too much frequency filtering, i.e. using filters with very narrow bandwidth can also reduce the detection efficiency of a quantum receiver setup. In some applications, for example those related to quantum communications, the receiving apparatus is sensitive to light for only a short time period T. Too much frequency filtering can increase the pulse width, or time width, $\Delta t$. The time width $\Delta t'$ after filtering should be smaller than the effective detection window T shown in the bottom of the figure, in other words $\Delta t' \lesssim T$, in order that the system detection efficiency is not reduced. When the pulse width after filtering is $\Delta t' > T$, all the light falling outside the detection time window T will not be detected by the receiver. The size of the detection window relative to the pulse time width $\Delta t'$ is shown by the blank rectangular area at the bottom of the figure.

Within the detection window, there is a smaller effective detection window, which is indicated by the darker triangular area within the detection window. The detection window coincides with the gate width of the detector decided by the operator. The effective detection window is shorter due to the fact that if a photon arrives late into the gate, it has "less time" to generate a detectable avalanche. In other words, the earlier part of the detection gate window has a higher probability to generate an avalanche and so detect a photon. The earlier part of the detection window is therefore the effective detection window. In one embodiment, the detection window is 1 ns, and the effective detection window is 100 ps.

The frequency filter 825 may be connected to other filters 826 by an optical waveguide, for example an optical fibre. Alternatively, the light pulses may travel between the components through free space. In an embodiment, there is a waveguide region integrated on the substrate between the frequency filter 825 and the other filters 826. The other filters 826 clean the pulses, without affecting the time width $\Delta t'$ or the relative phase. The other filters may introduce some loss into the system. The other filters may be, for example, polarizers, which "clean" the polarization of the light pulse. The light pulses after the other filters are represented by unfilled symbols. This signifies that the pulses are "cleaner" than before filtering by the other filters. The time duration of the light pulses after filtering by the other filters is shown in the figure to be the same as the time duration before filtering by the other filters. This signifies that the other filters 826 clean the pulses without affecting the time duration. While the frequency filter 825 increases the time interval of the pulses from $\Delta t$ to $\Delta t'$, for the other filters, the time interval $\Delta t'$ is the same.

A light source comprising a master light source and a slave light source is followed by a set of filters in frequency, polarisation, and/or any other relevant degree of freedom of light, to enhance the purity of the light pulses, the set of filters specifically including a frequency filter whose bandwidth $\Delta\nu$ must be carefully selected.

The frequency filtering is partly done by the seeding mechanism itself. In other words, filtering is a feature of laser seeding, because seeding reduces the bandwidth of the slave light pulses.

When the lasing cavity is empty, and the lasing action is activated by spontaneous emission, there are many different frequencies that can activate the lasing action. This translates into a broad bandwidth for the output light. However, when light from the master light source is present in the cavity of the slave light source, it is the light already present in the lasing cavity that activates the lasing action, through stimulated emission. There is no competition between different frequencies to activate the lasing action, and the output light has virtually only a single frequency, very close to that of the master light. The bandwidth of the light pulses generated by seeding is therefore less than if they were generated without seeding.

In one embodiment, additional frequency filtering is added, whilst avoiding excessive filtering, i.e. filtering with too narrow a bandwidth. The frequency filter can be selected to produce a pulse width $\Delta t'$ about equal to the temporal window T of the quantum receiver apparatus. This will maximise the interference visibility without spoiling the overall system performance.

Filtering in degrees of freedom other than frequency, i.e. such as by the other filters 826, does not have such limitations, other than possible losses introduced by the filtering component.

Interference systems will now be described. The relevant measurements obtained from interference systems can be in the form of:
(i) counts or current or any other form of output from each detector individually; or
(ii) coincidence counts or signals from the two detectors simultaneously (i.e. instances in which both detectors clicked or both detectors provided an output signal for the same input).

A measurement of (i) is referred to as first order interference (1OI) measurement. A measurement of (ii) will be referred to as second order interference (2OI) measurement. Thus in 1OI measurements, the behaviour of each single detector independently from the other is relevant. In 2OI measurements, the correlations between both detectors' output is relevant. In other words, in 1OI, the relevant outcome is (i) and in 2OI, the relevant outcome is (ii).

Either first order interference or second order interference measurements can be made for all the systems. For some applications the first order interference measurement may be of more interest, whilst for other applications the second order interference measurement may be of more interest.

1OI and 2OI provide very different results. This is because 1OI measures the signals themselves, whereas 2OI measures the correlations between signals. Signals and correlations between signals are different quantities. For example, two clean signals which are totally uncorrelated will produce a very noisy correlation function whereas noisy signals which are highly correlated will produce a clean correlation output.

The first order correlation function is given by:

$$\langle E^*(t)E(t+\tau)\rangle = \frac{1}{T}\int_0^T dt E^*(t)E(t+\tau) \quad \text{(Eq. 2)}$$

where E is the electric field whose amplitude varies with the time t and τ is the temporal misalignment between the two signals. Note that the symbol τ used in the correlation functions given in Equations 2 and 3 is not used to represent time jitter. The symbol τ in these equations is used to represent the temporal misalignment between two signals. T is the measurement time window. The brackets indicate the average over the time t.

The second order correlation function or "Intensity correlation function" is given by the average of the product of each pair of readings from the 2 detectors:

$$\langle I(t)I(t+\tau)\rangle = \langle E^*(t)E^*(t+\tau)E(t+\tau)E(t)\rangle = \frac{1}{T}\int_0^T dt I(t)I(t+\tau) \quad \text{(Eq. 3)}$$

where I is intensity, t is the time and τ is the temporal delay between the two signals. The brackets indicate the average over the time t.

Figure 9:
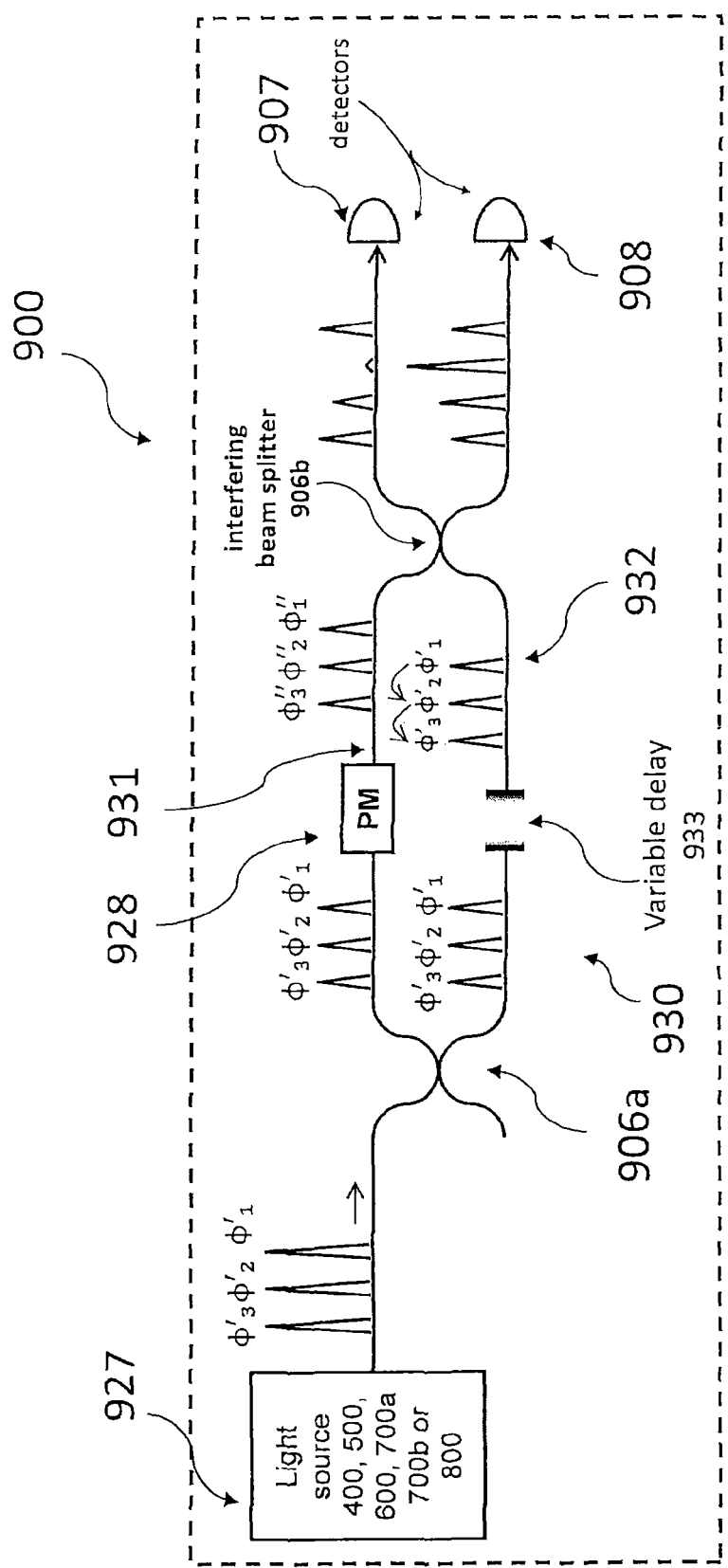
FIG. 9 is a schematic illustration of an interference system in accordance with an embodiment.

FIG. 9 shows a schematic illustration of an interference system 900 in accordance with an embodiment. In an embodiment, the components of the light source 927 are integrated on a first substrate, as described in relation to FIGS. 18 to 36. The interferometer 930 may also be integrated on the first substrate with the light source 927. The detector 907 and detector 908 may also be integrated on the first substrate with the light source 927. Alternatively, the interferometer 930 and/or detector 907 and detector 908 may be integrated on a second substrate. An interference system such as shown in FIG. 9 could be used as a random number generator (RNG). A RNG may use classical detectors rather than single-photon detectors with a narrow time window. In the interference system shown in FIG. 9, classical light pulses and classical detectors are used.

However, the system of FIG. 9 can work for classical or quantum detection scenarios. For RNG with quantum detection, the classical detectors may be replaced with single-photon detectors, and single photon pulses may be used. The random bit is decided by a detector which measures a click or no-click, rather than by an intensity measurement.

In this system, the light source is embedded in, i.e. connected to, an interferometer, which is configured to make the generated slave light pulses interfere and produce a phase related variable output, which is useful in many applications. Light source 927 is a light source such as phase-randomised light source 400 shown in FIG. 4, phase-randomised light source 500 shown in FIG. 5, phase-randomised light source 600 shown in FIG. 6, phase-randomised light source 700a or 700b shown in FIG. 7 or phase-randomised light source 800 shown in FIG. 8. Any of these light sources could be used.

The light source 927 is connected to an interferometer 930. A sequence of slave light pulses is emitted from light source 927 and enters the interferometer 930. The phase modulator 928 applies a phase shift to light pulses travelling the first arm 931 of the interferometer 930. The variable delay line 933 applies a time delay of one clock period to light pulses travelling the second arm 932 of the interferometer 930. The slave light pulses interfere at the interfering beam splitter 906b. The delay of one clock period is equivalent to each slave light pulse interfering with the subsequent slave light pulse at the interfering beam splitter 906b, as indicated by the arrows on the top of the pulses in the second arm 932 of the interferometer 930.

The interferometer output depends on the relative phase of the interfering pulses and is represented by a variable intensity of the pulses emerging on the two arms exiting the box. Both arms are potentially useful in applications. As classical light pulses are used, an intensity is measured at both detectors for each of the light pulses. In some embodiments, for example in RNG applications, only one detector is used. Where the system of FIG. 9 is used with single photon pulses, only one detector will click for each pulse, and the random bit is decided by a detector which measures a click or no-click, rather than by an intensity measurement.

The interference system 900 may be configured for a first order interference measurement. In other words, the intensity measured at each detector independently is recorded by the logic gate and outputted.

The light source 927 is connected to one input of a beam splitter 906a by an optical waveguide, for example an optical fibre. Alternatively, the light pulses may travel between the components through free space. There may be a waveguide region integrated on the substrate between the light source 927 and the input of beam splitter 906a. A first output of the beam splitter 906a is connected to a phase modulator 928.

The phase shift applied by the phase modulator 928 may be controlled by the voltage applied to an electro-optic phase modulator. Different voltages are applied to the phase modulator 928 during the transit of the slave light pulses so as to impart a different phase modulation to each pulse. The phase modulation may be applied based on the times that pulses are emitted from the light source 927. A phase modulator such as described can comprise a crystal, such as a LiNbO3 crystal, in which the refractive index is a function of electric field strength. Alternatively the phase modulation can be provided by passive means, for example, a plurality of fixed phase elements which are each configured to apply a different fixed phase difference and a switch configured to select each of the said components. The phase shift applied to each pulse may be controlled by the switch. The phase modulator 928 may be integrated on a substrate with the other components of the interferometer 930.

The output of the phase modulator is connected to a first input of an interfering beam splitter 906b. The first output of the beam splitter 906a, the phase modulator 928 and the first input of the interfering beam splitter 906b form the first arm 931 of the interferometer 930.

The second output of the beam splitter 906a is connected to a variable delay line 933. The variable delay line 933 delays light by a single clock period of the light source 927. Alternatively, the variable delay line 933 may delay the light pulses by an integer multiple of the clock period. Alternatively, a fixed delay line is used instead of variable delay line 933, for example a loop of optical fibre of the desired optical path length. In an embodiment in which the interferometer is integrated on a substrate, the variable delay line is not included, as the interferometer can be fabricated sufficiently precisely for good interference. Additional phase tuning, i.e.

delay tuning by only a couple of wavelengths, can be included by fabricating a heater, i.e. a resistor, on one arm of the interferometer in place of the variable delay line, to which a current may be applied. In an alternative embodiment, a fixed delay line can be integrated on the substrate by fabricating a longer section of waveguide for one of the arms for example. The output of the variable or fixed delay line is connected to the second input of interfering beam splitter 906b. The second output of the beam splitter 906a, the delay line 933 and the second input of the interfering beam splitter 906b form the second arm 932 of the interferometer 930.

A train of slave light pulses are emitted from the light source 927 having phases $\phi_1, \phi_2, \phi_3, \ldots$, and enter the beam splitter 906a. The beam splitter 906a sends a first fraction of each light pulse down the first arm 931 and a second fraction of each light pulse down the second arm 932. The phase modulator 928 applies a phase shift to the fraction of the light pulses travelling the first arm 931, such that the light pulses exiting the phase modulator 928 have phases $\phi_1", \phi_2", \phi_3", \ldots$. The second arm 932 comprises variable delay line 933. In one embodiment, the variable delay, which matches the delay between the emission of the pulses from the light source 927 (or an integer multiple thereof) to within at least 10 ps. The precision of the variable delay which is suitable for the system depends on the duration of time between the emission times of the pulses and the time width of the pulses. For example, in one embodiment, a precision of 20% of the delay between the emission times for a system in which 1 pulse is emitted every 1 microsecond, means time precision of 200 ns. For a pulse with time width of 100 ns, a time precision of 200 ns is acceptable. For a pulse with time width less than 10 ns, a higher precision variable delay should be used. The second fraction of the first pulse emitted from the light source 927 and the first fraction of the second pulse emitted from the light source 927 interfere at the interfering beam splitter 906b. The second fraction of the second light pulse and the first fraction of the third light pulse subsequently interfere at the interfering beam splitter 906b, and so on. As described above, in an embodiment in which the interferometer is integrated on a substrate, the variable delay line is not included, as the interferometer can be fabricated sufficiently precisely for good interference.

The intensity of the light detected by the detector 907 connected to one output of the interfering beam splitter 906b depends on the phase difference between the consecutive light pulses (which is random), and the phase shift applied by the phase modulator 928. Where, for example, the same phase shift is applied by the phase modulator 928 for each light pulse, the phase difference between subsequent pulses will be random. Therefore, for each pair of interfering pulse fractions, a random intensity is measured at the detector 907 at an output of the output beam splitter. The detector 908 measures the remaining fraction of the intensity.

The phase randomness of the light pulses is thus converted into directly measurable intensity fluctuation using an interferometer 930. The interferometer in this case is a fibre optic interferometer. Other types of interferometer can also be used, for example, Michelson interferometers or ring resonators. These types of interferometers can also be constructed with fibre optics. Alternatively, the interferometer can be integrated on a substrate. The variable delay 933 between the first arm 931 and the second arm 932 of the interferometer 930 is such that interference occurs between slave light pulses emitted at different times from the light source 927. As described above, in an embodiment in which the interferometer is integrated on a substrate, the variable delay line is not included, as the interferometer can be fabricated sufficiently precisely for good interference between slave light pulses emitted at different times from the light source 927. By matching the interferometer differential delay (i.e. the optical delay between the first arm 931 and the second arm 932, caused by the variable delay 933 or fixed delay for example) to an integer multiple of the light source 927 clock frequency, interference occurs in the interfering beam splitter 906b between light pulses emitted at different clock cycles. For example, the variable delay 933 or fixed delay may be set such that a fraction of the light pulse emitted from the light source 927 and travelling the second arm interferes with a fraction of the light pulse emitted next from the light source 927, and which travels the first arm 931.

A phase difference of 0 at the interfering beam splitter 906b leads to a maximum intensity measured at one detector (e.g. detector 907) and a minimum intensity at the other detector (detector 908). If, on the other hand, there is a phase difference of $\pi$ at the interfering beam splitter 906b, a minimum intensity is measured at detector 907 and a maximum intensity at detector 908. For any other value of phase difference there will be an intermediate intensity measured at each detector.

At the interfering beam splitter 906b, light pulses travelling through the first arm 931 and the second arm 932 should have the same polarisation in order for good interference. This may be achieved using polarisation maintaining waveguides and components. Alternatively, polarisation of photons in one of the arms may be controlled using a polarisation controller. In an embodiment in which the interferometer is integrated on a substrate, a polarisation controller is not included, as the waveguides maintain the polarisation of the signals.

In an alternative embodiment, the interference system does not include a phase modulator, and no phase shift is applied to the pulses. The first output of the beam splitter 906a is connected directly to the first input of the interfering beam splitter 906b. The second output of the beam splitter 906a is connected to a variable delay line 933. The variable delay line 933 delays light by a single clock period of the light source 927. Alternatively, the variable delay line 933 may delay the light pulses by an integer multiple of the clock period. Alternatively, a fixed delay line is used instead of a variable delay line 933, for example a loop of optical fibre of the desired optical path length or a longer section of waveguide in an integrated interferometer. The output of the variable or fixed delay line is connected to the second input of interfering beam splitter 906a. The intensity of the light detected by the detector 907 connected to one output of the interfering beam splitter 906b for this case depends on the phase difference between the first slave light pulse and the second slave light pulse, which is random. A variable fine tuning delay line may be included in the interferometer.

In one embodiment, which is used to perform the measurements relating to FIGS. 16 and 17 below, the interference system does not include a phase modulator, and no phase shift is applied to the pulses. The first output of the beam splitter 906a is connected to a variable fine tuning delay line, which is in turn connected to the first input of the interfering beam splitter 906b. In an embodiment in which the interferometer is integrated on a substrate, the variable delay line is not included. The second output of the beam splitter 906a is connected to a fixed delay line which is a loop of optical fibre of the desired optical path length or a longer section of waveguide in an integrated interferometer. The fixed delay line delays light by a single clock period of the light source 927. The output of the fixed delay line is connected to the second input of interfering beam splitter 906*b*. Light pulses with random phases $\phi'_1, \phi'_2, \phi'_3, \ldots$, are emitted by the light source 927, and are each split into two dependent pulses. By dependent pulses, it is meant that the two pulses originate from the same original pulse, and therefore inherit their phase from the same origin. Both trains of dependent pulses have phases $\phi'_1, \phi'_2, \phi'_3, \ldots$. One of the trains of dependent pulses is delayed by 1 clock period by the fixed delay line, which is 1 bit delay. A dependent pulse with phase $\phi'_1$ is combined at the interfering beam splitter with a dependent pulse with phase $\phi'_2$. The other dependent pulse with phase $\phi'_2$ is combined with a dependent pulse with phase $\phi'_3$ and so on. The resulting interference pattern is a signal with variable amplitude which is eventually detected by the detectors.

Figure 10:
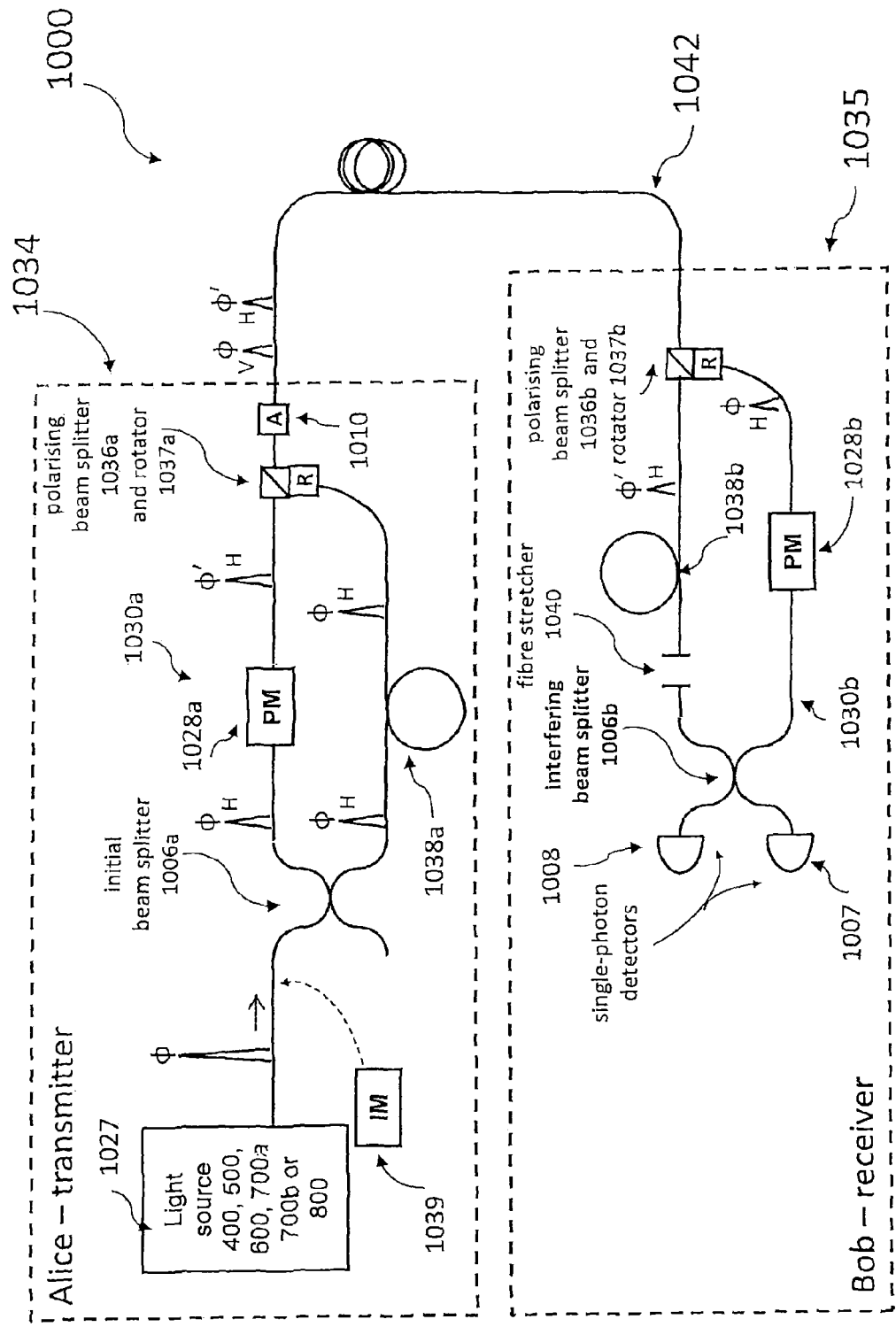
FIG. 10 is a schematic illustration of an interference system in accordance with an embodiment, in which the interference system is used in a QKD system.

FIG. 10 shows a schematic illustration of an interference system 1000 in accordance with an embodiment. In this system, the low time jitter phase randomised light source 1027 is used in a QKD set up. The QKD set up includes a transmitter and a receiver, each having an asymmetric Mach-Zehnder interferometer.

In an embodiment, the components of the light source 1027 are integrated on a first substrate, as described in relation to FIGS. 18 to 36. The interferometer 1030*a* may also be integrated on the first substrate for example. The interferometer 1030*b* and/or detectors 1007 and 1008 may be integrated on a second substrate for example.

The system may be configured for a 1OI measurement.

In this setup there is no direct consequence of time jitter on the visibility of the interference, because one light pulse interferes with itself. However, reduction of the time jitter can increase the accuracy of the synchronisation of the phase modulator and photon detectors with the light pulses. When the light pulses arrive at the phase modulator with a reduced time jitter, the phase modulator is more likely to be "ready" when the pulses arrive, i.e. not on a rising or falling edge. Thus the modulation, or encoding, accuracy is increased. When the light pulses arrive at the photon detector with a reduced time jitter, pulses are more likely to arrive within the detection window, and more counts are registered. This increases the number of total events that are measured.

A light pulse with random phase $\phi'$ emitted by the light source 1027 is split into two pulses at the initial beam splitter 1006*a*. One pulse is delayed by a fibre loop 1038*a* and its polarization is flipped by the rotator 1037*a* before the polarising beam splitter 1036*a*. In an embodiment in which the interferometer is integrated on a substrate, the fibre loop 1038*a* is realised by a longer section of waveguide. The other pulse passes through a phase modulator 1028*a* which changes its phase from $\phi'$ to $\phi''$. The two pulses are then combined at the polarising beam splitter 1036*a* and travel as separated time bins and with orthogonal polarisations along the optical fibre 1042 until they reach the receiver apparatus 1035.

At the receiver apparatus, they are split again according to their polarisation by a second polarising beam splitter 1036*b*. The pulse which was not delayed in the transmitter apparatus 1034 is directed into the upper arm of the interferometer 1030*b* and is delayed by a fibre loop 1038*b* identical to the one in the transmitter apparatus 1034. In an embodiment in which the interferometer is integrated on a substrate, the fibre loop 1038*b* is realised by a longer section of waveguide. The delay between the arms in the interferometer 1030*b* in the receiver matches the delay between the arms in the interferometer 1030*a* in the transmitter. In one embodiment, the delay may be any duration less than one clock period. A delay of more than one clock period may require further phase stabilisation between the interferometer arms. The other pulse enters the lower arm and is modulated in phase by the phase modulator 1028*b*. The two pulses are then recombined at the interfering beam splitter 1006*b* and the resulting light detected by the single photon detectors 1007 and 1008. The fibre stretcher 1040 is used to finely align the time delay between the two interfering pulses. In an embodiment in which the interferometer is integrated on a substrate, the fibre stretcher is replaced with a heater element in one arm of the interferometer as described above in relation to FIG. 9. Alternatively, the whole interferometer can be temperature stabilised, removing the need for a fibre stretcher.

An intensity modulator 1039 can be optionally added after the light source 1027 in order to implement the decoy state QKD. For decoy-state QKD, phase randomisation is used because there using phase randomization allows the security of decoy-state QKD to be equivalent to QKD with a single-photon source. For non-decoy state QKD, phase randomisation is not essential, but it increases the security level, the working distance and the final secure key rate. The phase randomisation means that the phase relationship between subsequently emitted light pulses is random. This means that an unauthorised eavesdropper, Eve, cannot lock her measuring apparatus to this phase and thus perform a better measurement of Alice's pulses.

An attenuator 1010 is included at the output of Alice in order to reduce the intensity of the light pulses down to the single photon level, in other words the light pulses emitted from the transmitter have on average less than one photon per pulse.

The QKD system comprises a transmitter apparatus 1034 which is connected to a receiver apparatus 1035 by a fibre optic cable 1042. The transmitter apparatus 1034 is labelled "Alice—transmitter" and the receiver apparatus is labelled "Bob—receiver". The transmitter apparatus 1034 may be integrated on a first substrate and the receiver apparatus 1035 may be integrated on a second substrate.

The transmitter apparatus comprises a light source 1027 and an interferometer 1030*a*. Light source 1027 is a light source such as phase-randomised light source 400 shown in FIG. 4, phase-randomised light source 500 shown in FIG. 5, phase-randomised light source 600 shown in FIG. 6, phase-randomised light source 700*a* or 700*b* shown in FIG. 7 or phase-randomised light source 800 shown in FIG. 8. Any of these light sources could be used.

The light source 1027 is connected to one input of initial beam splitter 1006*a* by an optical waveguide, for example an optical fibre. Alternatively, the light pulses may travel between the components through free space. There may be a waveguide region integrated on the substrate between the light source 1027 and the input of initial beam splitter 1006*a*. An intensity modulator 1039 is optionally connected between the light source 1027 and the initial beam splitter 1006*a*. A first output of the initial beam splitter 1006*a* is connected to a phase modulator 1028*a*. The phase modulator may be a phase modulator such as described in relation to FIG. 9 for example. The output of the phase modulator 1028*a* is connected to a polarising beam splitter 1036*a*.

The second output of the initial beam splitter 1006*a* is connected to a fibre loop 1038*a*. The fibre loop 1038*a* delays the light pulses. The output of the fibre loop 1038*a* is connected to a rotator 1037*a*. A physical device can be avoided for the rotator 1037*a* by rotating the fibre axis in the optical path 1038*a* by 90 degrees at the position of the polarisation beam splitter 1036*a*.

The output of the rotator 1037a is connected to the second input of polarising beam splitter 1036a. The output of polarising beam splitter 1036a is connected to an attenuator 1010.

The receiver apparatus 1035 comprises an interferometer 1030b. The fibre optic cable 1042 is connected to the input of a polarising beam splitter 1036b. One output of the polarising beam splitter is connected to a fibre loop 1038b. The delay caused by fibre loop 1038b matches that caused by fibre loop 1038a. The fibre loop 1038b is connected to fibre stretcher 1040, which is connected to a first input of interfering beam splitter 1006b. The other output of polarising beam splitter 1036b is connected to rotator 1037b. The output of rotator 1037b is connected to a phase modulator 1028b, such as described in relation to FIG. 9. The output of the phase modulator 1028b is connected to a second input of interfering beam splitter 1006b. Each output of interfering beam splitter 1006b is connected to a single photon detector 1008 and 1007.

A light pulse entering initial beam splitter 1006a is split into a first fraction, which travels the short arm of interferometer 1030a, and a second fraction, which travels the long arm of the interferometer 1030a. The first fraction enters phase modulator 1028a, which may apply a phase shift to the first fraction of the light pulse. The second fraction travels fibre loop 1038a and therefore enters the polarising beam splitter 1036a later than the first fraction. The second fraction also travels through rotator 1037a before entering polarising beam splitter 1036a. The polarisation of the second fraction of the light pulse is flipped by the rotator 1037a, such that the first fraction and second fraction exit the polarising beam splitter into fibre optic cable 1042 with orthogonal polarisations and with a time delay between the first fraction and the second fraction. The attenuator 1010 reduces the intensity of the light pulses.

The first fraction and the second fraction enter polarising beam splitter 1036b in the receiver apparatus 1035. The first fraction is sent down the long arm of the interferometer 1030b and the second fraction is sent down the short arm of the interferometer 1030b. The second fraction travels through rotator 1037b which flips the polarisation back such that the first fraction and second fraction have the same polarisation. The second fraction then travels through phase modulator 1028b which may apply a phase difference. The first fraction travels through fibre loop 1038b which delays the first fraction such that the first fraction and the second fraction enter the interfering beam splitter 1006b at the same time. The fibre stretcher can be used to fine tune the delay in order to achieve this.

The first fraction and the second fraction interfere at the interfering beam splitter 1006b. The measurement at the single-photon detectors depends on the phase difference between the phase applied at the two phase modulators.

Using phase modulator 1028a and phase modulator 1028b a QKD protocol such as BB84 can be realized. In the BB84 protocol, Alice selects a phase value at random from four equally spaced phase values. For example, Alice can randomly set the voltage applied to the phase modulator 1028a to one of four different values, corresponding to phase shifts of 0, $\pi/2$, $\pi$, and $3\pi/2$. 0 and $\pi$ are associated with bits 0 and 1 in a first encoding basis, while $\pi/2$ and $3\pi/2$ are associated with 0 and 1 in a second encoding basis.

Bob selects a phase value at random from two values. For example, Bob can randomly set the voltage applied to the phase modulator 1028b to one of two values, corresponding to a phase shift of 0 or $\pi/2$. This amounts to selecting between the first and second measurement bases, respectively. In other words, Alice's 0 and $\pi$ values are compatible with Bob's 0 value (first basis), and Alice's $\pi/2$ and $\pi/2$ values are compatible with Bob's $\pi/2$ value (second basis). Neither Alice nor Bob knows what values the other chooses or will choose when choosing their values. Only afterwards do they compare whether they used the same basis. They then only use the values for which they used the same basis for the final key.

A phase difference of 0 between the phase shift applied at phase modulator 1028a and phase modulator 1028b (i.e. the phase shift applied by Alice is 0 and the phase shift applied by Bob is 0 or the phase shift applied by Alice is $\pi/2$ and the phase shift applied by Bob is $\pi/2$) leads to a detection at one detector, for example detector 1007, and no detection at the other detector, detector 1008. A phase difference of $\pi$ (i.e. the phase shift applied by Alice is $\pi$ and the phase shift applied by Bob is 0 or the phase shift applied by Alice is $3\pi/2$ and the phase shift applied by Bob is $\pi/2$) would then mean a detection at detector 1008 and no detection at detector 1007. For any other value of phase difference between the two phase modulators, there will be a finite probability that a photon is detected at detector 1007 and a finite probability that it is detected at detector 1008.

Phase stabilisation can be included in the QKD system in order to ensure that the interferometers are aligned correctly. In this case, phase stabilisation is achieved by including fibre stretcher in the receiver interferometer. It can also be implemented at the transmitter side. The phase stabilisation is implemented by looking at the counts in the receiver and adjusting until only one detector clicks for a phase difference of 0.

Components such as the phase modulator and the single photon detectors may be synchronised with the emission times of the slave light source. For example, the slave light source, master light source, phase modulator and single photon detectors may all be synchronised to a master clock.

In this system, the light source is embedded in a QKD system.

Figure 11A:
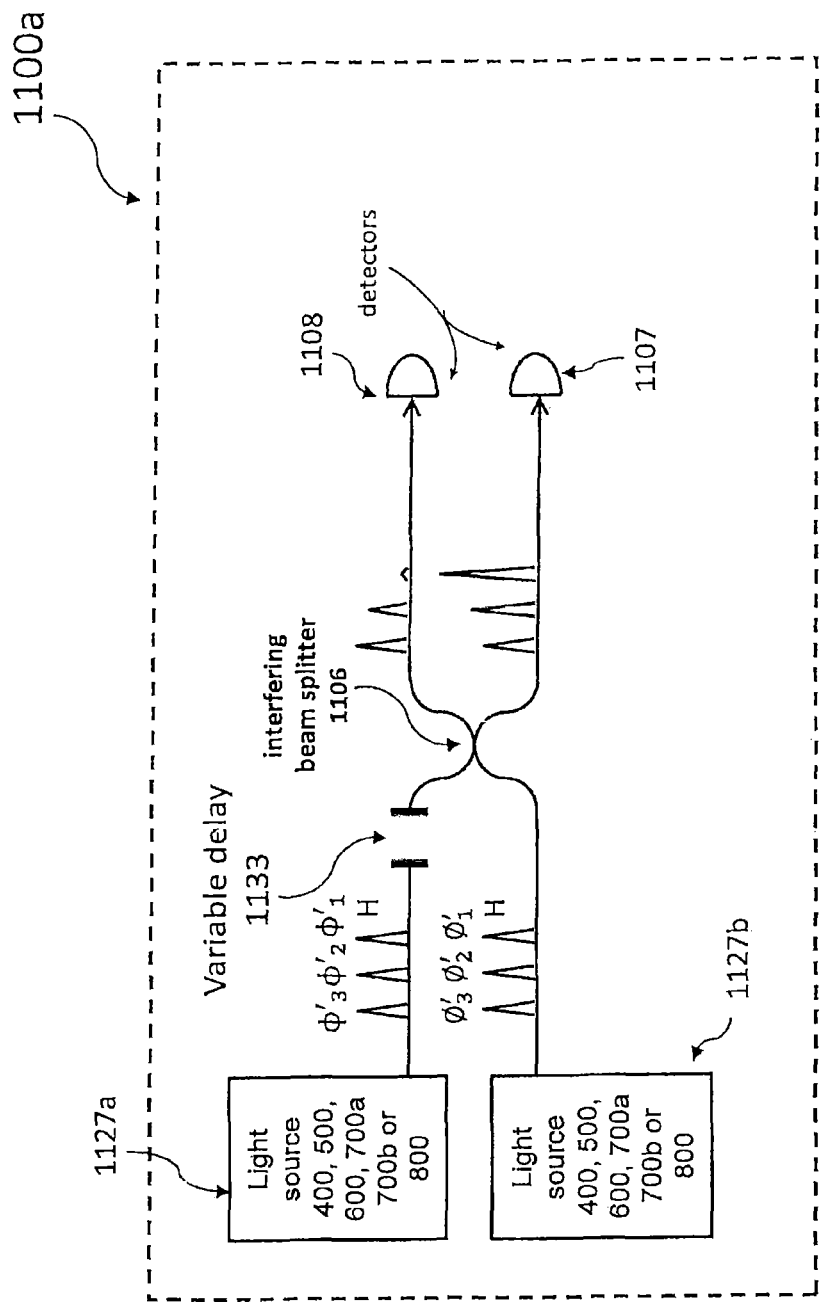
FIG. 11A is a schematic illustration of an interference system in accordance with an embodiment.

FIG. 11A shows a schematic illustration of an interference system 1100a in accordance with an embodiment. Two independent light sources interfere at the interfering beam splitter 1106. The output depends on the relative phase of the interfering pulses and is represented by signals with variable intensity on the two arms exiting the interfering beam splitter. Both arms are potentially useful in applications, for example either arm could be used for a RNG. Alternatively, the correlations between both arms could be used in a MDI-QKD application. When the system of FIG. 11A is used for RNG, a first order interference measurement may be used. FIG. 11A can be either first order or second order. For an MDI-QKD application, a second order interference measurement is used.

In an embodiment, the components of the first light source 1127a are integrated on a first substrate, as described in relation to FIGS. 18 to 36. The components of the second light source 1127b, the beam splitter 1106 and/or the detector 1107 and detector 1108 may also be integrated onto the first substrate. Alternatively, the second light source 1127b may be integrated on a second substrate. The beam splitter 1106 and/or detector 1107 and detector 1108 may be integrated onto a third substrate, for example.

In this system, two or more light sources produce trains of phase randomised light pulses, said pulses interfere at a beam splitter and produce a phase related variable output that is useful in applications. The trains of phase randomised light pulses may have high purity in frequency, polarisation and any other relevant degree of freedom of light, the level of purity of each degree of freedom can be determined by the desired application.

The variable delay means that the pulses reach the interfering beam splitter at the same time. The variable delay cannot take into account the intrinsic laser time jitter, which is different for each pulse.

All the pulses have horizontal (H) polarization in this example. They could be in any other polarization (Vertical, Diagonal, Anti-diagonal) but the polarizations for both paths should be the same. If the polarisation is not the same for both paths then no interference will occur at the beam splitter.

Light source 1127a is a light source such as phase-randomised light source 400 shown in FIG. 4, phase-randomised light source 500 shown in FIG. 5, phase-randomised light source 600 shown in FIG. 6, phase-randomised light source 700a or 700b shown in FIG. 7 or phase-randomised light source 800 shown in FIG. 8. Any of these light sources could be used. Light source 1127b is a light source such as phase-randomised light source 400 shown in FIG. 4, phase-randomised light source 500 shown in FIG. 5, phase-randomised light source 600 shown in FIG. 6, phase-randomised light source 700a or 700b shown in FIG. 7 or phase-randomised light source 800 shown in FIG. 8. Any of these light sources could be used.

Light source 1127a is connected to variable delay 1133. The variable delay 1133 can be omitted by electronically tuning the emission time of the light source 1127a. The variable delay 1133 is in turn connected to one input of interfering beam splitter 1106. Light source 1127b is connected to a second input of interfering beam splitter 1106. The variable delay is adjusted such that the slave light pulses from light source 1127a and light source 1127b interfere at the interfering beam splitter 1106. In other words, the variable time delay is adjusted such that a light pulse emitted from light source 1127a will enter the interfering beam splitter 1106 at the same time as a light pulse emitted from light source 1127b, not taking into account any time jitter. The low time jitter of the slave light pulses means that there is only small variation in the emission times of the light pulses. Therefore the temporal overlap between the light pulses at the beam splitter is large and thus the interference visibility is good. In an embodiment in which the interferometer is integrated on a substrate, the variable delay line is not included, as the interferometer can be fabricated sufficiently precisely for good interference.

A train of light pulses are emitted from light source 1127a having horizontal polarisation and having phases $\phi'_1$, $\phi'_2$, $\phi'_3$, . . . . A train of light pulses are emitted from light source 1127b having horizontal polarisation and having phases $\varnothing_1'$, $\varnothing_2'$, $\varnothing_3'$ . . . . The light pulses emitted from light source 1127a enter the variable delay 1133 and then enter the interfering beam splitter 1106. The light pulses from light source 1127b enter the interfering beam splitter 1106 at the same time as the light pulses from light source 1127a. Each light pulse from light source 1127a interferes with a light pulse from light source 1127b. The intensity detected at detector 1108 and 1107 depends on the phase difference between the interfering pulses.

The master light source and slave light source in light source 1127a may be synchronised using a controller, for example such as described in relation to FIG. 5 or FIG. 6. The master light source and slave light source in light source 1127b may be synchronised using the same controller or using a second controller, for example such as described in relation to FIG. 5 or FIG. 6. The first controller and second controller should be synchronised such that light pulses from the two light sources interfere at the interfering beam splitter. The detectors may be synchronised with the controller(s). For example, first controller, second controller, phase modulator and photon detectors may all be synchronised to a master clock.

Figure 11B:
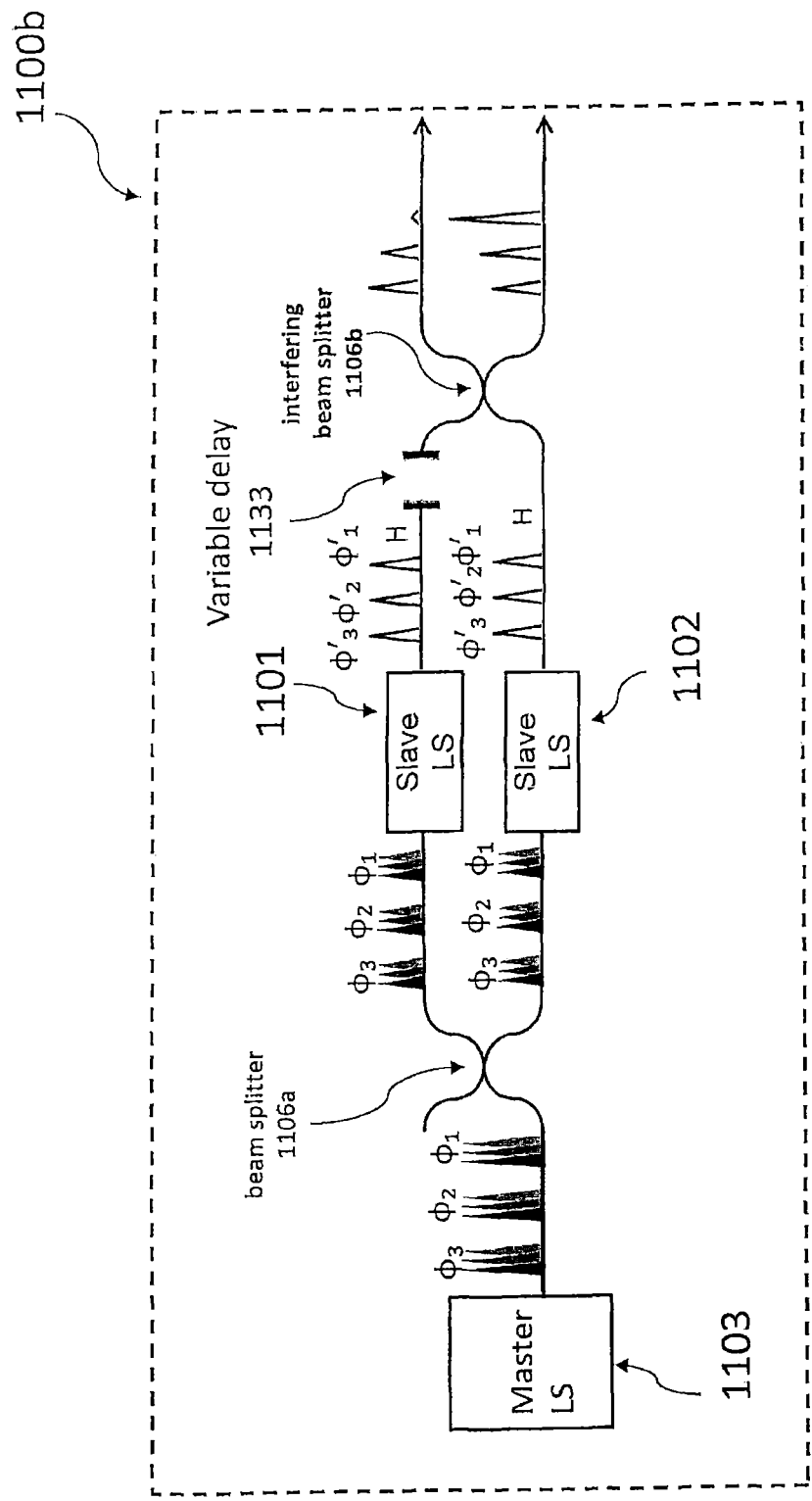
FIG. 11B is a schematic illustration of an interference system in accordance with an embodiment, comprising a single master light source and two slave light sources.

FIG. 11B shows a schematic illustration of an interference system 1100b in accordance with an embodiment. In an embodiment, a master light source 1103, a beam splitter 1106a, a first slave light source 1101 and a second slave light source 1102 are integrated on a first substrate, as described in relation to FIGS. 18 to 36. A beam splitter 1106b may also be integrated onto the first substrate. Two slave light sources interfere at the interfering beam splitter 1106b. The output depends on the relative phase of the interfering pulses and is represented by signals with variable intensity on the two arms exiting the interfering beam splitter. Both arms are potentially useful in applications. In this system, two or more slave light sources produce trains of phase randomised light pulses, said pulses interfere at a beam splitter and produce a phase related variable output that is useful in applications. The trains of phase randomised light pulses may have high purity in frequency, polarisation and any other relevant degree of freedom of light, the level of purity of each degree of freedom can be determined by the desired application.

In this embodiment, both slave light sources are seeded by the same master light source 1103. The phases of the slave light pulses emitted from the two slave light sources when seeded by the same master pulse are thus equal. In other words, both slave light pulses emit a train of pulses having phases $\phi'_1$, $\phi'_2$, $\phi'_3$. However, the phase of each light pulse emitted from a slave light source has a random relationship to the phase of each subsequently emitted light pulse from the slave light source, i.e. $\phi'_1$ has a random relationship to $\phi'_2$.

Master light source 1103 is a master light source such as has been described previously. It is modified to produce two or more trains of pulses. In this embodiment, a beam splitter 1106a is connected between the master light source 1103 and the two slave light sources. One input of the beam splitter 1106a is connected to the output of the master light source 1103. Light pulses emitted from the master light source 1103 enter the beam splitter 1106a. One output of the beam splitter 1106a is connected to slave light source 1101 and a second output of the beam splitter 1106a is connected to slave light source 1102. A train of master light pulses are emitted from the master light source 1103 having phases $\phi_1$, $\phi_2$, $\phi_3$, . . . . The light pulses enter the beam splitter 1106a. A fraction of each light pulse exits one output of the beam splitter 1106a and a fraction of each light pulse exits the second output of the beam splitter 1106a. The trains of light pulses exiting both outputs of the beam splitter 1106a have phases $\phi_1$, $\phi_2$, $\phi_3$. The first train of light pulses enter slave light source 1101 and the second train of light pulses enter slave light source 1102. The slave light sources generate a slave light pulse corresponding to each master light pulse that enters. Each slave light source generates a train of light pulses having phases $\phi'_1$, $\phi'_2$, $\phi'_3$.

The variable delay means that a pulse from slave light source 1101 reaches the interfering beam splitter at the same time as the subsequently generated light pulse from slave light source 1102. In an embodiment in which the interfering beam splitter 1106b is integrated on a substrate, the variable delay line is not included, as the system can be fabricated sufficiently precisely for good interference. Thus slave light pulse $\phi'_1$ emitted from slave light source 1101 interferes with slave light pulse $\phi'_2$ emitted from slave light source 1102. The variable delay cannot take into account the intrinsic laser time jitter, which is different for each pulse.

All the pulses have horizontal (H) polarization in this example. They could be in any other polarization (Vertical, Diagonal, Anti-diagonal) but the polarizations for both paths should be the same. If the polarisation is not the same for both paths then no interference will occur at the beam splitter.

Light source 1101 is connected to variable delay 1133. In an embodiment in which the interfering beam splitter 1106*b* is integrated on a substrate, the variable delay line is not included. The variable delay 1133 is in turn connected to one input of interfering beam splitter 1106*b*. Light source 1102 is connected to a second input of interfering beam splitter 1106*b*. The variable delay is adjusted such that a slave light pulses from light source 1101 and a subsequently generated slave light pulse from light source 1102 interferes at the interfering beam splitter 1106*b*. In other words, the variable time delay is adjusted such that a light pulse emitted from light source 1101 will enter the interfering beam splitter 1106*b* at the same time as a subsequently emitted light pulse from light source 1102, not taking into account any time jitter. In one embodiment, the variable delay is equal to an integer multiple of the slave light source clock period. The low time jitter of the slave light pulses means that there is only small variation in the emission times of the light pulses. Therefore the temporal overlap between the light pulses at the beam splitter is large and thus the interference visibility is good.

The light pulses emitted from light source 1101 enter the variable delay 1133 and then enter the interfering beam splitter 1106*b*. The light pulses from light source 1101 enter the interfering beam splitter 1106*b* at the same time as the subsequently generated light pulses from light source 1102. Each light pulse from light source 1101 interferes with a subsequently generated light pulse from light source 1102. The intensity after the interfering beam splitter 1106*b* depends on the phase difference between the interfering pulses.

The master light source 1103 and slave light sources 1101 and 1102 may all be synchronised using a controller, for example such as described in relation to FIG. 5 or FIG. 6.

Figure 12:
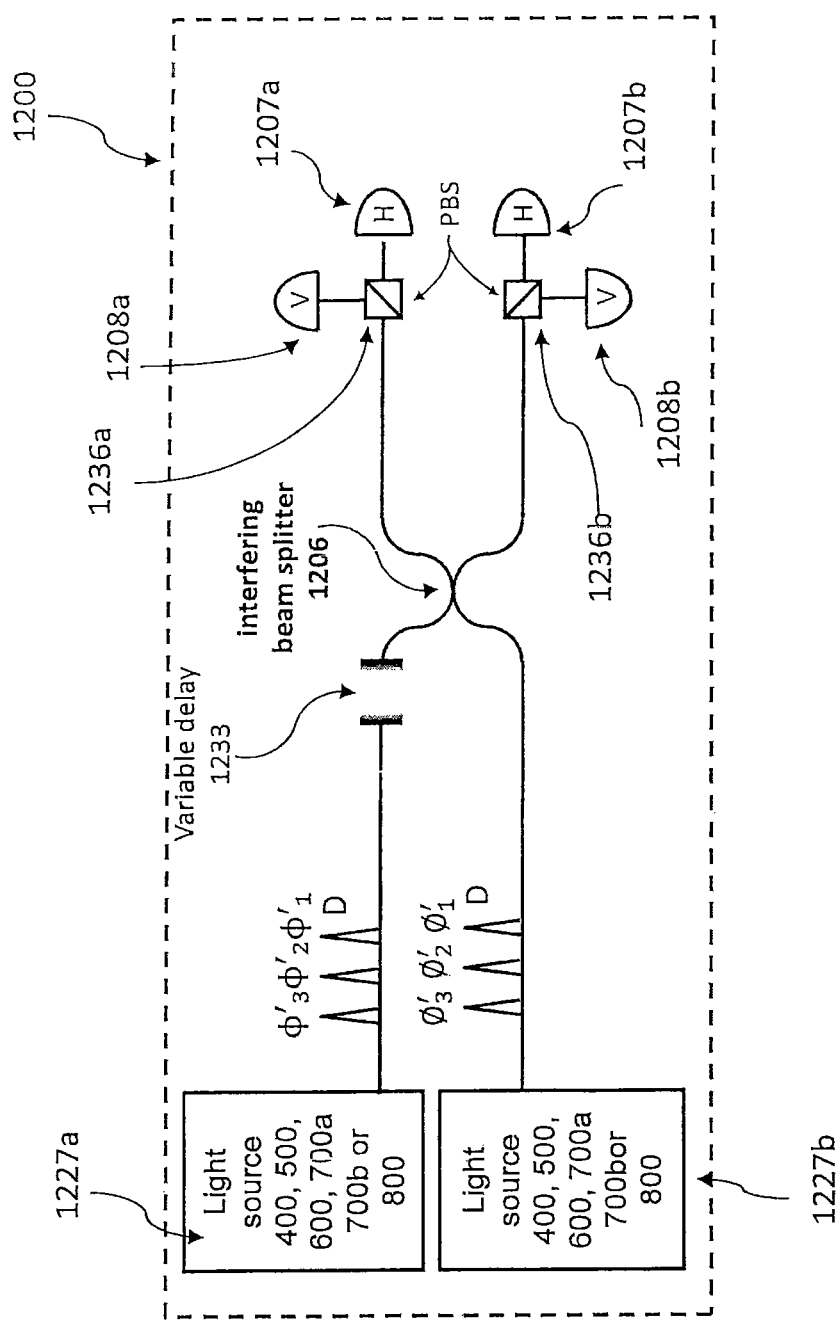
FIG. 12 is a schematic illustration of an interference system in accordance with an embodiment.

FIG. 12 shows a schematic illustration of an interference system 1200 in accordance with an embodiment.

In an embodiment, the components of the first light source 1227*a* are integrated on a first substrate, as described in relation to FIGS. 18 to 36. The components of the second light source 1227*b* may also be integrated onto the first substrate. The beam splitter 1206 and/or detector 1207*a*, detector 1207*b*, detector 1208*a* and detector 1208*b* may also be integrated onto the first substrate. Alternatively, the components of the second light source 1227*b* may be integrated on a second substrate. The beam splitter 1206 and/or detector 1207*a*, detector 1207*b*, detector 1208*a* and detector 1208*b* may be integrated onto a third substrate, for example.

This system is a variant of the system shown in FIG. 11A. In this system, polarizing beam splitters (PBS) are included, which discriminate the horizontal (H) polarization from the vertical (V) polarisation. Light pulses are generated in the diagonal (D) polarization from the two light sources and are incident on the interfering beam splitter. The pulses exiting the interfering beam splitter are then projected onto the H or V polarization by the PBS. In alternative embodiments other polarizations than diagonal are used.

Light sources 1227*a* and 1227*b* emit phase-randomised light pulses. Light source 1227*a* and 1227*b* may comprise optical attenuators. The light pulses emitted from two light sources may have on average less than one photon per pulse. For simplicity, in the following explanation it is assumed that the light sources 1227*a* and 1227*b* are true single-photon sources, emitting only single photons. The detectors are single-photon detectors.

At the beam splitter 1206, indistinguishable photons recognize each other and the Hong-Ou-Mandel effect is observed, meaning that both photons will exit the upper output of the beam splitter 1206 or both will exit the lower output of the beam splitter 1206 when considering the splitter 1206 receives one photon from the top arm and one photon from the bottom arm. By indistinguishable photons it is meant that two photons cannot be distinguished in any degree of freedom, including polarisation, arrival time, and wavelength. It cannot occur that one photon exits one output and the other photon exits the other. As a consequence, only the two upper detectors 1208*a* and 1207*a* both click or the two lower detectors 1208*b* and 1207*b* both click. For example, both "V" detectors 1208*a* and 1208*b* clicking is not observed, as one detector is in the upper path and one is in the lower path.

However, when photons from the top arm and bottom arm can be distinguished, the interference between them will have a lower visibility and Hong-Ou-Mandel effect reduced. The reduced interference will allow one photon to detected in one of the top detectors and one photon to be detected in one of the bottom detectors, which was was strictly forbidden for two indistinguishable photons.

Timing jitter in the source allows distinguish photons from different sources.

A measurement can be made that recognizes these different situations and assigns a corresponding value to the second order correlation function. Measurements can be made as to how many coincidence counts have occurred, i.e. how many times two out of the four detectors clicked simultaneously. All the clicks from each single detector can be registered also, and they will give indications about the first order correlation function.

A measurement can be made to detect several combinations of clicks. For instance, the top V and bottom V detectors can click simultaneously, or the top V and the top H detectors can click simultaneously. All of the counts can be collected in separate classes and later analysed. Different statistics correspond to different physical situations and have different interpretations. In order to make the results more meaningful, it is important to obtain a high visibility in the interference output. The small time jitter and small bandwidth of the interfering pulses as well as the phase randomisation contribute to enhance the interference visibility.

Interference system 1200 comprises a light source 1227*a* and a light source 1227*b*. Light source 1227*a* is a light source such as phase-randomised light source 400 shown in FIG. 4, phase-randomised light source 700*a*, 700*b* or 700*c* shown in FIG. 7 or phase-randomised light source 800 shown in FIG. 8. Any one of these light sources can be used. Light source 1227*b* is a light source such as phase-randomised light source 400 shown in FIG. 4, phase-randomised light source 700*a*, 700*b* or 700*c* shown in FIG. 7 or phase-randomised light source 800 shown in FIG. 8. Any one of these light sources can be used. In other words, the light source 1227*a* and light source 1227*b* each comprise a master light source 403 having an optical connection to a slave light source 402 and may further comprise filters.

Light source 1227*a* is connected to variable delay 1233. The variable delay 1233 can be omitted by electronically tuning the emission time of the light source 1227*a*. The variable delay 1233 is in turn connected to one input of interfering beam splitter 1206. Light source 1227*b* is connected to a second input of interfering beam splitter 1206. The variable delay 1233 is adjusted such that the slave light pulses from light source 1227*a* and light source 1227*b* interfere at the interfering beam splitter 1206. In other words, the variable time delay is adjusted such that a light pulse emitted from light source 1227*a* will enter the interfering beam splitter 1206 at the same time as a light pulse emitted from light source 1227*b*. The low time jitter of the slave light pulses means that there is only small variation in the emission times of the light pulses. Therefore the temporal overlap between the light pulses at the beam splitter is large and thus the interference visibility is good. One output of the interfering beam splitter 1206 is connected to polarising beam splitter 1206. The other output of the interfering beam splitter 1206 is connected to polarising beam splitter 1236*b*.

A first output of polarising beam splitter 1236*a* is connected to detector 1208*a* and a second output is connected to detector 1207*a*. The polarising beam splitter 1236*a* directs light having vertical polarisation to detector 1208*a* and light having horizontal polarisation to detector 1207*a*. A first output of polarising beam splitter 1236*b* is connected to detector 1208*b* and a second output is connected to detector 1207*b*. The polarising beam splitter 1236*b* directs light having vertical polarisation to detector 1208*b* and light having horizontal polarisation to detector 1207*b*.

A train of light pulses are emitted from light source 1227*a* having diagonal polarisation and having phases $\phi'_1$, $\phi'_2$, $\phi'_3$, . . . . A train of light pulses are emitted from light source 1127*b* having diagonal polarisation and having phases $\varnothing'_1$, $\varnothing'_2$, $\varnothing'_3$, . . . . The light pulses emitted from light source 1227*a* enter the variable delay 1233 and then enter the interfering beam splitter 1206. The light pulses from light source 1227*b* enter the interfering beam splitter 1206 at the same time as the light pulses from light source 1227*a*. Each light pulse from light source 1227*a* interferes with a light pulse from light source 1227*b*. The intensity of the light pulse directed to polarising beam splitter 1236*a* and the intensity of the light directed to polarising beam splitter 1236*b* depends on the phase difference between the interfering pulses.

The master light source and slave light source in light source 1227*a* may be synchronised using a controller, for example such as described in relation to FIG. 5 or FIG. 6. The master light source and slave light source in light source 1227*b* may be synchronised using the same controller or using a second controller, for example such as described in relation to FIG. 5 or FIG. 6. The first controller and second controller should be synchronised such that light pulses from the two light sources interfere at the interfering beam splitter 1206. The detectors may be synchronised with the controller(s). For example, the first controller, second controller and photon detectors may all be synchronised to a master clock.

Figure 13:
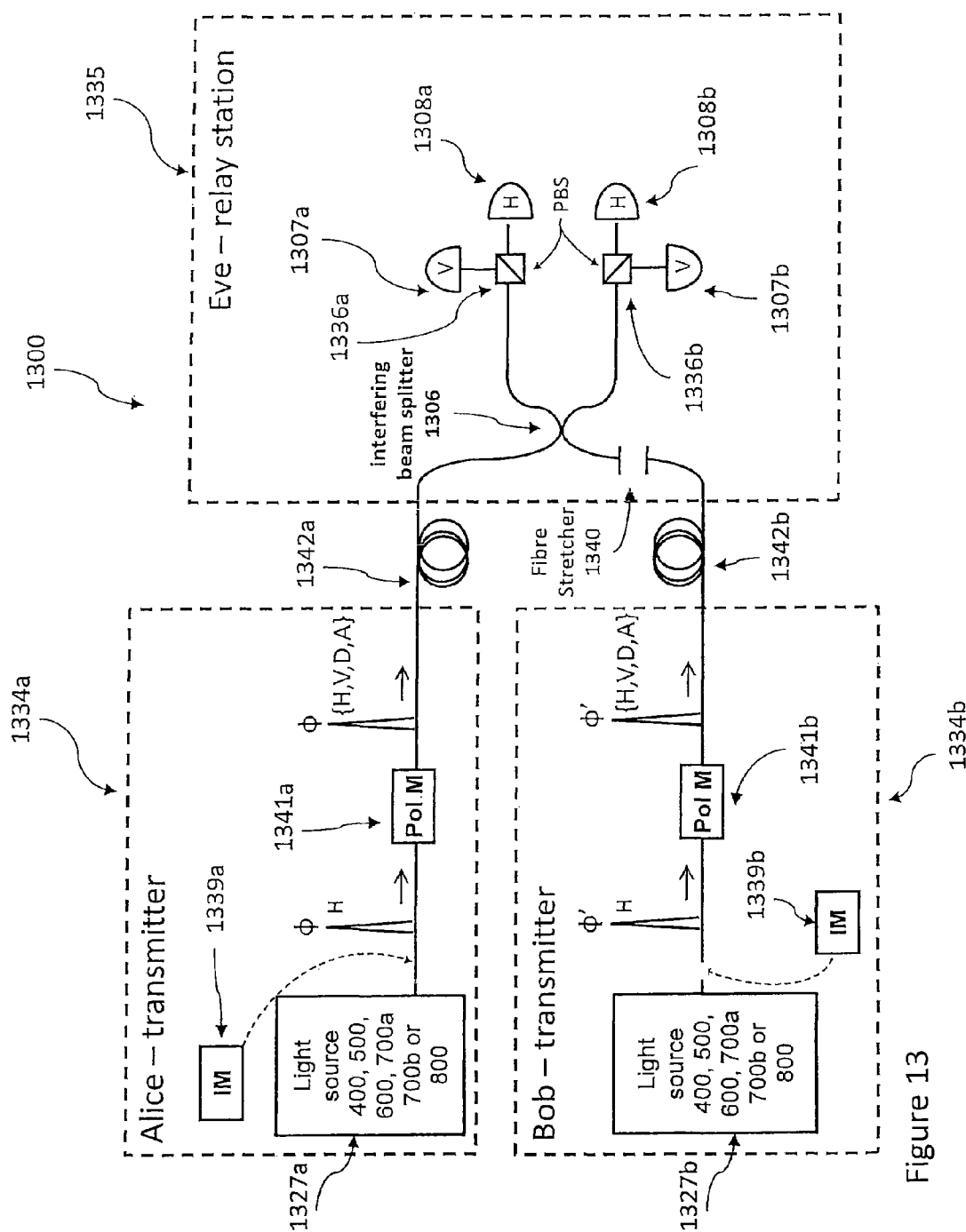
FIG. 13 is a schematic illustration of an interference system in accordance with an embodiment, in which the interference system is used in a measurement device independent QKD system.

FIG. 13 shows a schematic illustration of an interference system 1300 in accordance with an embodiment. The system may be configured for a 2OI measurement. The system is a measurement device independent (MDI) QKD system. MDI-QKD is a technique to force an eavesdropper Eve (who is dishonest but in this case acts as a relay) to collaborate with Alice, Bob (who are both honest). Both Alice and Bob have a transmitter apparatus.

In an embodiment, the components of the first light source 1227*a* are integrated on a first substrate, as described in relation to FIGS. 18 to 36. The polarisation modulator 1341*a* and the intensity modulator 1339*a* may also be integrated onto the first substrate.

The components of the second light source 1227*b* are integrated on a second substrate. The polarisation modulator 1341*b* and the intensity modulator 1339*b* may also be integrated onto the second substrate.

The beam splitter 1306 and/or detector 1307*a*, detector 1307*b*, detector 1308*a* and detector 1308*b* may be integrated onto a third substrate, for example.

Alice and Bob are both transmitters and both encode their information in a manner such as in the BB84 protocol, for example, using the polarization of the light pulses. The light pulses emitted from two light sources have on average less than one photon per pulse. Using polarisation to encode the information, the four states of BB84 are: H (horizontal), V (vertical), D (diagonal) and A (anti-diagonal). H and V are associated with the first basis (the "Z basis") while D and A are associated with the second basis (the "X basis"). The four polarization states are prepared using a light source that always emits a light pulse in a particular polarisation, for example the H polarization, and then modulating the pulse with a polarization modulator (labelled Pol M in the Figure).

Each light pulse emitted by each of the light sources has its own random phase. This is crucial for the final security of the system. The pulses with random phases emitted by Alice and Bob interfere at the interfering beam splitter, owned by Eve, and are eventually detected by Eve's detectors. The fibre-stretcher is used by Eve to align the interfering system and increase the final visibility. In an embodiment in which the beam splitter 1306 is integrated on a substrate, the fibre stretcher is replaced with a heater element as described above in relation to FIG. 9.

Eve declares which detectors have clicked and this, when the bases are matched, allows Alice and Bob to understand what state the other user encoded. Eve however can only learn "relative information". Eve cannot learn the absolute information encoded by Alice and Bob.

An intensity modulator (IM) can be added after the light source to implement decoy-state MDI-QKD. For MDI-QKD using decoy states, phase randomisation is required because use of phase randomization allows the security of decoy-state MDI-QKD to be equivalent to MDI-QKD with a single-photon source. For both decoy state and non-decoy state MDI-QKD, In any case, a reduction of the time jitter improves the interference visibility, thus reducing the QBER and increasing the final secure rate of the system.

The interference system comprises a transmitter apparatus 1334*a*, which is Alice's transmitter, and a second transmitter apparatus 1334*b*, which is Bob's transmitter. The interference system also comprises a relay station 1335. The relay station is an untrusted party (Eve). Alice's transmitter apparatus 1334*a* is connected to the relay station 1335 via an optical fibre cable 1342*a*. Bob's transmitter apparatus 1334*b* is also connected to the relay station 1335 via an optical fibre cable 1342*b*.

Alice's transmitter apparatus 1334*a* comprises a light source 1327*a*. Bob's transmitter apparatus 1334*b* comprises a light source 1327*b*. Light source 1327*a* is a light source such as phase-randomised light source 400 shown in FIG. 4, phase-randomised light source 500 shown in FIG. 5, phase-randomised light source 600 shown in FIG. 6, phase-randomised light source 700*a* or 700*b* shown in FIG. 7 or phase-randomised light source 800 shown in FIG. 8. Any of these light sources could be used. Light source 1327*b* is a light source such as phase-randomised light source 400 shown in FIG. 4, phase-randomised light source 500 shown in FIG. 5, phase-randomised light source 600 shown in FIG. 6, phase-randomised light source 700a or 700b shown in FIG. 7 or phase-randomised light source 800 shown in FIG. 8. Any of these light sources could be used.

Light sources 1327b and 1327a emit phase-randomised light pulses and may comprise optical attenuators. The light pulses emitted from each of the two light sources may have on average less than one photon per pulse. For simplicity, in this following explanation it is assumed that the light sources are true single-photon sources, emitting only single photons. The detectors are single-photon detectors.

Alice's light source 1327a is connected to an input of polarisation modulator 1341a. The polarisation modulator may be an electro-optic polarisation modulator comprising an electrically variable wave plate. The polarisation modulator may comprise a crystal, such as a LiNbO3 crystal, in which the refractive index is a function of electric field strength. An intensity modulator 1339a may optionally be connected between the light source 1327a and polarisation modulator 1341a. Bob's light source 1327b is connected to an input of polarisation modulator 1341b. An intensity modulator 1339b may optionally be connected between the light source 1327b and polarisation modulator 1341b.

Fibre optic cable 1342a connects Alice's transmitter apparatus 1334a to one input of an interfering beam splitter 1306. Fibre optic cable 1342b connects Bob's transmitter apparatus 1334b to a second input of interfering beam splitter 1306.

One output of the interfering beam splitter 1306 is connected to polarising beam splitter 1336a. The other output of the interfering beam splitter 1306 is connected to polarising beam splitter 1336b.

A first output of polarising beam splitter 1336a is connected to detector 1307a and a second output is connected to detector 1308a. The polarising beam splitter 1336a directs light having vertical polarisation to detector 1307a and light having horizontal polarisation to detector 1308a. A first output of polarising beam splitter 1336b is connected to detector 1307b and a second output is connected to detector 1308b. The polarising beam splitter 1336b directs light having vertical polarisation to detector 1307b and light having horizontal polarisation to detector 1308b.

A slave light pulse is emitted from Alice's light source 1327a having horizontal polarisation and having phase $\phi$. A slave light pulse is emitted from Bob's light source 1327b having horizontal polarisation and having phase $\phi'$. The light pulse emitted from Alice's light source 1327a enters the polarisation modulator 1341a. The polarisation modulator 1341a modulates the polarisation of the light pulse to one of four options, H, V, D or A. The light pulse emitted from Bob's light source 1327b enters the polarisation modulator 1341b. The polarisation modulator 1341b modulates the polarisation of the slave light pulse to one of four options, H, V, D or A.

In other words, Alice and Bob prepare phase randomized weak coherent light pulses in one of the four different polarization states H, V, D, A shown in FIG. 13. The polarisation state for each light pulse is selected independently and at random for each signal by means of a polarization modulator (Pol-M). The states H and V are associated with the first basis (the "Z basis") and the states D and A with the first basis (the "X basis"). Alice will use H or D to encode a bit 0 and V or A to encode a bit 1, as in the well-known BB84 protocol. In other words, a polarisation of H or D for Alice's light pulse signifies a bit 0 and a polarisation of V or A for Alice's light pulse signifies a bit 1.

The light pulses are transmitted along the optical fibre cables 1342a and 1342b to the relay station 1335. The light pulses from Bob's transmitter apparatus 1327b travels through a fibre stretcher 1340. The fibre stretcher is adjusted so that the light pulse from Bob's transmitter and the light pulse from Alice's transmitter enter the interfering beam splitter 1306 at the same time. The fibre stretcher can be omitted if the emission time of the transmitter can be electronically tuned.

Inside the measurement device, Eve's relay station 1335, signals from Alice and Bob interfere at the interfering beam splitter 1306. One output of the interfering beam splitter 1306 is connected to a polarizing beam splitter 1336a, the other output of the interfering beam splitter 1306 is connected to polarising beam splitter 1336b. The polarising beam splitters project the input photons into either H or V polarization states. Four single-photon detectors are employed to detect the photons and the detection results are publicly announced. A successful measurement corresponds to the observation of precisely two detectors (associated to orthogonal polarizations) being triggered. A click in the upper H detector 1308a and lower V detector 1307b, or in the upper V detector 1307a and lower H detector 1308b, indicates a projection into the quantum state $|\psi^{(-)}\rangle = (|HV\rangle - |VH\rangle)/\sqrt{2}$, while a click in the upper H detector 1308a and upper V detector 1307a, or in lower H detector 1308b and lower V detector 1307b reveals a projection into the quantum state $|\psi^{(+)}\rangle ) = (|HV\rangle + |VH\rangle)/\sqrt{2}$. Any combination of the polarisations encoded by Alice and Bob except (H H) and (V V) can result in $|\psi^{(+)}\rangle$.

After the results of the measurement have been revealed on a public channel, the users Alice and Bob reveal their choices for the bases, whether first or second (Z or X). The users discard all the data for which they accidentally chose different bases, and retain only those instances for which they chose identical bases, like in the BB84 protocol.

If the state $|\psi^{(-)}\rangle$ was declared in a measurement and both users selected the first, Z basis, they know that their states can only be $|HV\rangle$ or $|VH\rangle$. Therefore, if Bob prepared a state V, he will know for sure that Alice must have prepared a state H; so he will decode the result as a bit 0. If he prepared H, he knows that Alice prepared V; so he will decode the result as a bit 1. This kind of remote key agreement can be repeated for all the 4 polarization states and for both the results obtained and declared by the relay station.

The master light source and slave light source in light source 1327a may be synchronised using a controller, for example such as described in relation to FIG. 5 or FIG. 6. The master light source and slave light source in light source 1327b may be synchronised using a second controller, for example such as described in relation to FIG. 5 or FIG. 6. The first controller and second controller should be synchronised such that light pulses from the two light sources interfere at the interfering beam splitter 1306. The detectors and polarisation modulators may also be synchronised with the controller(s). For example, the first controller, second controller, polarisation modulators and photon detectors may all be synchronised to a master clock.

A pulse-seeded light source can also be used to generate low-jitter SPDC radiation. The generation of SPDC radiation and heralded photons from it can be carried out using coherent, non-phase randomised laser pumps. In order to reduce the time jitter of the pump, bulky, mode-locked lasers can be used. Single photons can be generated using SPDC produced by a coherent laser pump. When the pump is pulsed, bulky mode-locked lasers can be used to achieve low time jitter. Such a system is of a large size. The light from a mode-locked laser may not be coherent. An alternative light source using SPDC is described below.

Figure 14:
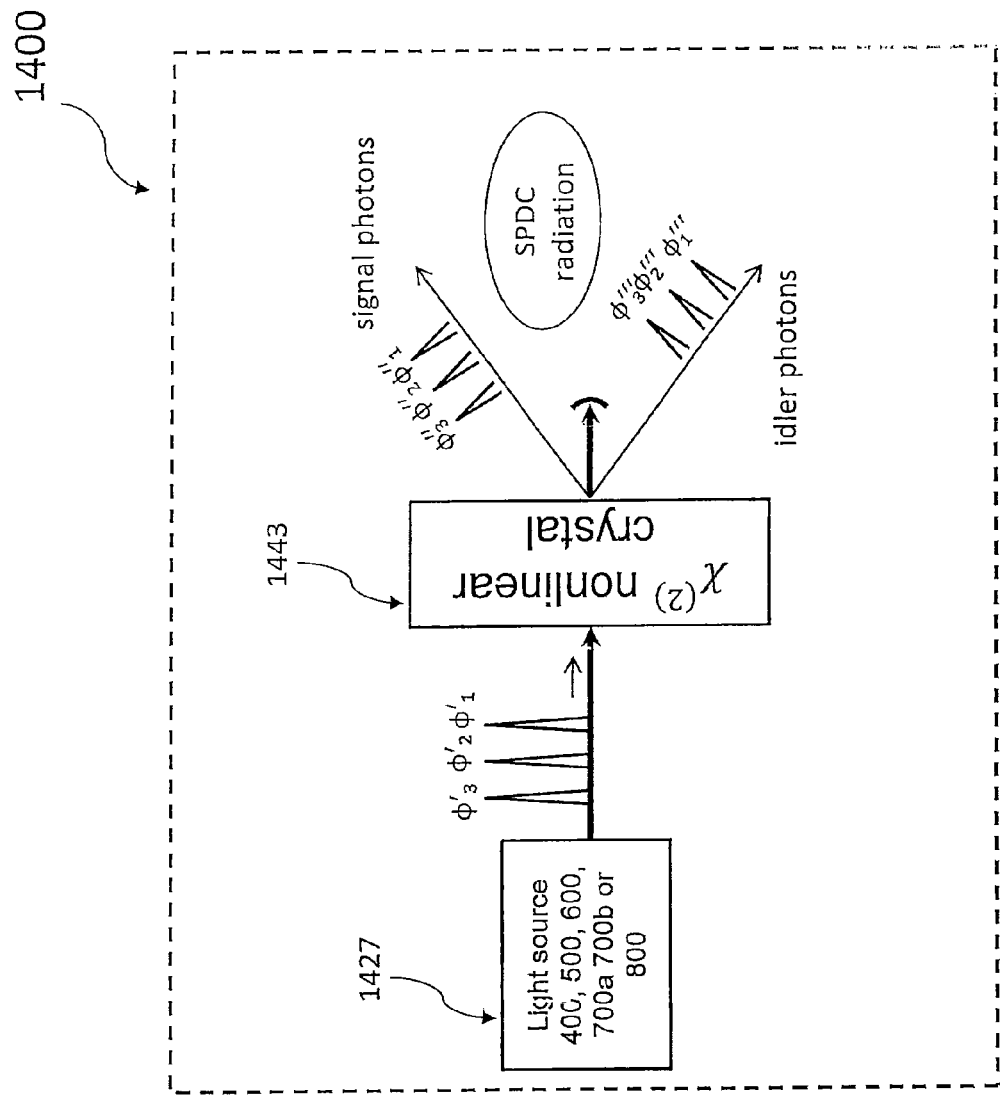
FIG. 14 is a schematic illustration of a spontaneous parametric down conversion (SPDC) light source that can be embedded in an interference system in accordance with an embodiment.

FIG. 14 shows an SPDC light source 1400. A light source 1427 is embedded in a spontaneous parametric down conversion setup. The light source 1427 is a low time jitter phase randomised light source and is used as a pump in a Spontaneous Parametric Down Conversion (SPDC) setup. Slave light pulses with random phases are emitted by the light source 1427. The slave light pulses are injected into a nonlinear crystal with non-zero second order susceptibility $\chi^{(2)}$. Examples of such crystals include BBO crystals (Beta Barium Borate crystals), LiNbO3 crystals (Lithium Niobate crystals) and PPLN crystals (Periodically Poled Lithium Niobate crystals). The slave light pulses act as "pump" photons. Light source 1427 emits phase-randomised light pulses and may comprise optical attenuators. The light pulses emitted from the light source 1427 may have on average less than one photon per pulse. For simplicity, in this following explanation it is assumed that the light source 1427 is true single-photon sources, emitting only single photons.

Under phase-matching conditions, the original pump photon is split into two photons, called "signal" and "idler" photons. The phase-matching conditions correspond to the energy and momentum conservation rules. The relative electromagnetic phase of two adjacent signal photons or idler photons is random, and the time jitter of the generated photons is small. The time jitter of the photon pairs is due to both the emission time from the crystal, and the time jitter of the light source 1427. The light source 1427 has low time-jitter; therefore the main source of time jitter is the crystal. However, if the pump light source has a high time jitter, then it can be the main source of the overall time jitter of the photon pairs.

Light source 1427 is a light source such as phase-randomised light source 400 shown in FIG. 4, phase-randomised light source 500 shown in FIG. 5, phase-randomised light source 600 shown in FIG. 6, phase-randomised light source 700a or 700b shown in FIG. 7 or phase-randomised light source 800 shown in FIG. 8. Any of these light sources could be used. A train of light pulses are emitted from the light source 1427 having phases $\phi_1$, $\phi_2$, $\phi_3$, . . . . The phase of each light pulse has a random relationship to the phase of each subsequently emitted light pulse. The components of the light source 1427 can be integrated on a first substrate, as described in relation to FIGS. 18 to 36. The non-linear crystal 1443 can also be integrated on the substrate by flip chip bonding the light source 1427 and the non-linear crystal onto a foreign substrate as described in relation to FIG. 33 for example.

The light pulses are emitted into nonlinear crystal 1443. The nonlinear crystal splits each of the single photon light pulses into a pair of photons, which are then emitted from the crystal. The pair of photons have combined energy and momentum equal to the energy and momentum of the original photon. The polarisations of the pair of photons can be totally undetermined, if their state is entangled, or they can be the same as the pump photon if they are in a product state, depending on the crystal used and on the pumping conditions. A large range of polarisations and polarisation combinations can be obtained.

One of the photons is a signal photon and one of the photons is the idler photon. The pair of photons is an entangled photon pair, if specific conditions and crystals are used. The signal photons have phases $\phi_1$, $\phi_2$, $\phi_3$, . . . , and the idler photons have phases $\phi''_1$, $\phi''_2$, $\phi''_3$, . . . Within each pair, the photons are correlated in phase. Depending on the crystal and on its angle with respect to the pump, different phase matching conditions are possible, resulting in different emission angles for the idler and signal photons. Collinear and non-collinear emissions are both possible with standard type-I and type-II crystals.

A light source comprises a pump, comprising a slave light source; a master light source configured to periodically generate light pulses such that the phase of each master light pulse has a random relationship to the phase of each subsequently generated master light pulse, further configured to supply said light pulses to said slave light source; and a controller, configured to apply a periodic signal to said at least one slave light source such that just one slave light pulse is generated during each period of time for which a master light pulse is received, such that the phase of each slave light pulse has a random relationship to the phase of each subsequently generated slave light pulse.

The light source further comprises a nonlinear crystal, configured such that when a slave light pulse is incident on the nonlinear crystal, two light pulses can be generated through spontaneous parametric down conversion.

The generation of the two light pulses through a nonlinear process is inefficient and therefore slave light pulses with high intensity may be used.

The master light pulses may be generated with a first time jitter, and the slave light pulses with a second time jitter, the second time jitter being less than the first time jitter.

The SPDC light source 1400 may be broadband even if the pump bandwidth, i.e. the bandwidth of the light source 1427, is small.

Phase-randomised pulses of light can be used in phase-randomised high quality Spontaneous Parametric Down Conversion (SPDC) and heralded single photon generation.

Figure 15:
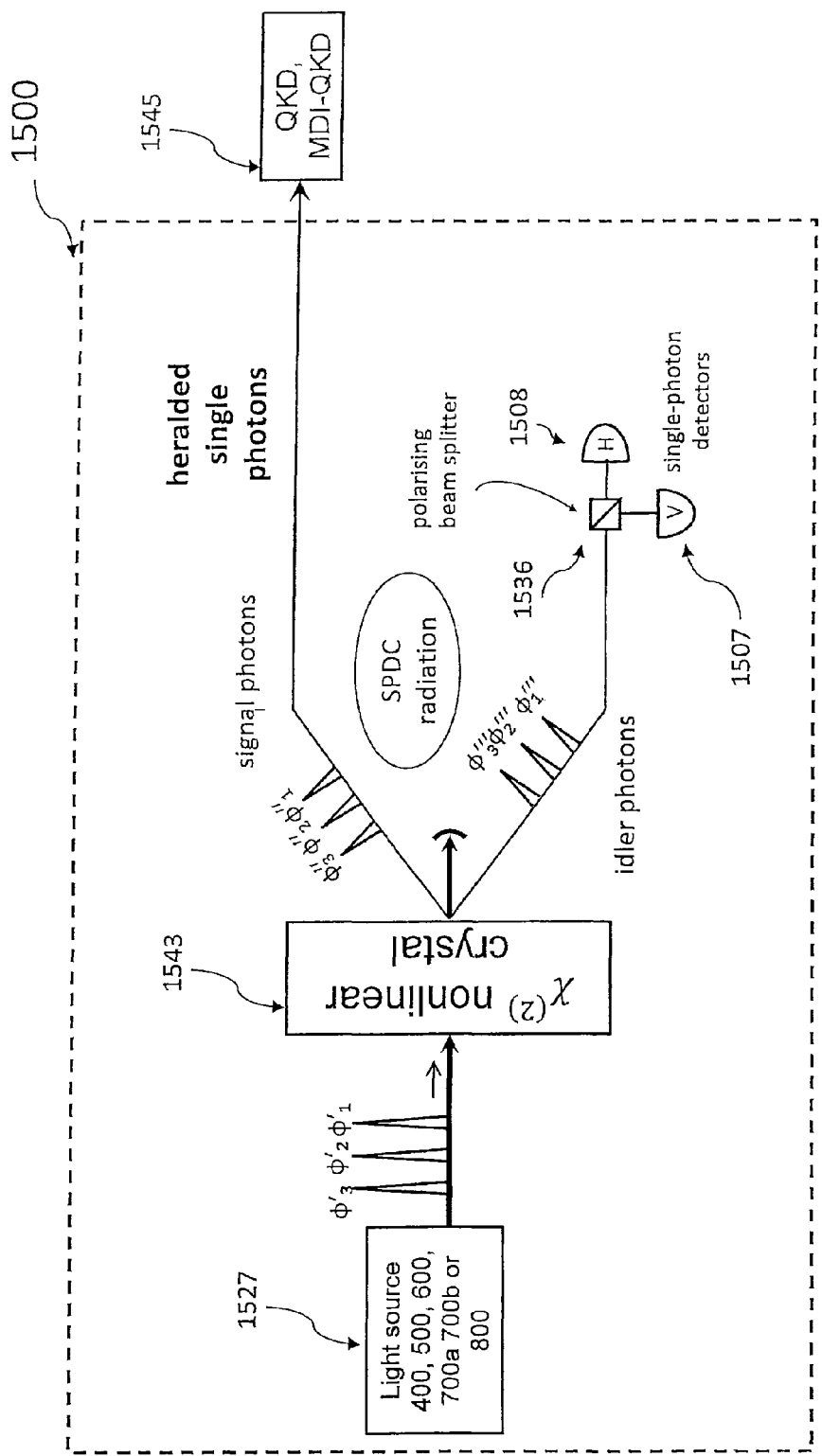
FIG. 15 is a schematic illustration of an interference system in accordance with an embodiment, comprising an SPDC light source.

FIG. 15 shows a schematic illustration of an interference system in accordance with an embodiment. In an embodiment, the components of the light source 1527 can be integrated on a first substrate, as described in relation to FIGS. 18 to 36. The non-linear crystal 1443 can also be integrated on the substrate by flip chip bonding the light source 1427 and the non-linear crystal onto a foreign substrate as described in relation to FIG. 33 for example. The components of the QKD system 1545 may also be integrated onto the substrate. The light source 1527 is embedded in a spontaneous parametric down conversion setup. The light source 1527 is a low time jitter phase randomised light source and is used as a pump in a Spontaneous Parametric Down Conversion (SPDC) setup. Slave light pulses with random phases are emitted by the light source 1527. The slave light pulses are injected into a nonlinear crystal with non-zero second order susceptibility $\chi^{(2)}$. Examples of such crystals include BBO crystals (Beta Barium Borate crystals), LiNbO3 crystals (Lithium Niobate crystals) and PPLN crystals (Periodically Poled Lithium Niobate crystals). The slave light pulses act as "pump" photons. Light source 1527 emits phase-randomised light pulses and may comprise optical attenuators.

Under phase-matching conditions, the original pump photon is split into two photons, called "signal" and "idler" photons. The phase-matching conditions correspond to the energy and momentum conservation rules. The relative electromagnetic phase of two adjacent signal photons or idler photons is random, and the time jitter of the generated photons is small. The time jitter of the photon pairs is due mainly to the time jitter of the light source 1527.

Light source 1527 is a light source such as phase-randomised light source 400 shown in FIG. 4, phase-randomised light source 500 shown in FIG. 5, phase-randomised light source 600 shown in FIG. 6, phase-randomised light source 700*a* or 700*b* shown in FIG. 7 or phase-randomised light source 800 shown in FIG. 8. Any of these light sources could be used. A train of light pulses are emitted from the light source 1527 having phases $\phi'_1$, $\phi'_2$, $\phi'_3$, . . . . The phase of each light pulse has a random relationship to the phase of each subsequently emitted light pulse.

The light pulses are emitted into nonlinear crystal 1543. The nonlinear crystal splits each of the single photon light pulses into a pair of photons, which are then emitted from the crystal. The pair of photons have combined energy and momentum equal to the energy and momentum of the original photon. The polarisations of the pair of photons can be totally undetermined, if their state is entangled, or they can be the same as the pump photon if they are in a product state, depending on the crystal used and on the pumping conditions. A large range of polarisations and polarisation combinations can be obtained.

One of the photons is a signal photon and one of the photons is the idler photon. The pair of photons can be an entangled photon pair, if specific conditions and crystals are used. The signal photons have phases $\phi'_1$, $\phi'_2$, $\phi'_3$, . . . , and the idler photons have phases $\phi''_1$, $\phi''_2$, $\phi''_3$, . . . . Depending on the crystal and on its angle with respect to the pump, different phase matching conditions are possible, resulting in different emission angles for the idler and signal photons. Collinear and non-collinear emissions are both possible with standard type-I and type-II crystals.

The signal photon output is connected to a QKD system 1545. The SPDC light source 1500 is therefore a light source for a QKD system. For example, the SPDC light source 1500 may replace light source 1027 in FIG. 10 or one or both of light sources 1327*a* and 1327*b* in FIG. 13. The idler photons may be discarded.

Alternatively, as shown in FIG. 15, the idler photon output may be connected to a polarising beam splitter 1536. The polarising beam splitter sends vertically polarised light to detector 1507 and horizontally polarised light to detector 1508.

In the system shown in FIG. 15, heralded single photons are generated every time one of the single photon detectors 1507 and 1508 click. The click heralds the preparation of a single photon in a certain polarization state, depending on which detector fired. Photons from the crystal are only emitted in pairs. Therefore, if the idler photon is detected by one of the detectors, this indicates that there is a signal photon on the other path. If proper crystal and conditions are used, then the emerging two photon state can be entangled (for example, similar to the state obtained in the MDI-QKD system described above). The entangled state emerging from the crystal when the proper crystal and conditions are used is $|\psi^{(-)}\rangle = (|HV\rangle - |VH\rangle)/\sqrt{2}$. In this case, if the idler photon is detected at the V detector 1507, then the signal photon must have H polarisation. If the idler photon is detected at the H detector 1508, then the signal photon must have V polarisation.

The SPDC light source 1500, comprising light source 1527, crystal, and the polarising beam splitter and detector arrangement is a single photon source for a QKD system or a MDI-QKD system 1545. The signal photons directly inherit a random phase from the light source 1527 pumping the nonlinear crystal 1543. These photons can then be used immediately in a QKD or MDI-QKD setup with decoy states, for instance, without including further components to randomise their phase.

The light source is a compact and low cost pump source that produces SPDC photons with low time jitter. Pulsed SPDC radiation is generated from a phase randomised pump with low time jitter.

Figure 16A:
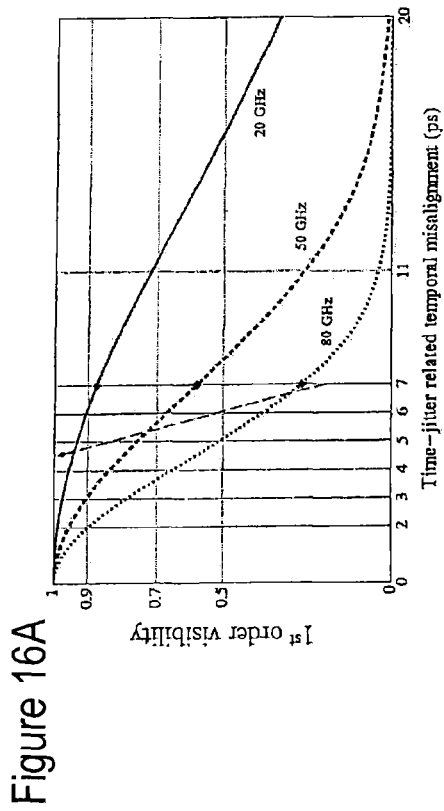
FIG. 16A is a graph of the first order visibility against time jitter related temporal misalignment.

FIG. 16A shows the results of a simulation of the 1st order interference visibility as a function of temporal misalignment between two otherwise indistinguishable transform-limited pulses.

The first-order interference visibility is given by:

$$V = (I_{max} - I_{min})/(I_{max} + I_{min}) \quad \text{(Eq. 4)}$$

where $I_{max}$ and $I_{min}$ are the maximum and minimum intensities registered by one of the detectors, 908 or 907 in FIG. 9. Temporal misalignment reduces the overlap between two interfering optical waves. In extreme cases when temporal misalignment is much larger than the temporal width of the pulses, there will be no temporal overlap and the corresponding visibility will be zero.

The simulation shows how the 1st order visibility improves (i.e. increases) as the temporal misalignment and the bandwidth decrease. As described above, a light source can comprise a master light source which injects light pulses into a slave light source. The generated slave light pulses can then be used in an interference apparatus. The generated slave light pulses will have low time jitter and a small bandwidth, and therefore the 1st order interference visibility will be good.

Light pulses are emitted with a certain frequency spectrum. This spectrum can be Gaussian for example. The bandwidth corresponds to approximately the width of this Gaussian spectrum. Good interference visibility is obtained when there are two indistinguishable pulses. If the bandwidth is large, pulses contain many different frequencies. On the contrary, for a narrow bandwidth, the pulses are more indistinguishable. For only a single frequency bandwidth, the pulses are necessarily indistinguishable.

The vertical axis is 1st order visibility, which is shown from 0 to 1, on a logarithmic scale. The horizontal axis is time jitter related temporal misalignment (ps), which is shown from 0 to 20, again on a logarithmic scale. The time jitter related misalignment is the difference in the arrival time of the two interfering pulses at the interference apparatus (for example a beam splitter). The figure shows how the visibility of the interfering pulses is affected by the temporal misalignment caused by, for example, time jitter, for three different bandwidths $\Delta v = \{20, 50, 80\}$ GHz. The solid line shows the visibility for pulses having a 20 GHz bandwidth. The dashed line shows the visibility for pulses having a 50 GHz bandwidth. The dotted line shows the visibility for pulses having a 80 GHz bandwidth.

For all three lines, the 1st order visibility for 0 temporal misalignment is 1. For all three lines, the 1st order visibility decreases as the temporal misalignment increases. Specifically, the 1st order visibility decreases as long as the time misalignment increases. The 1st order visibility is also poorer the larger the bandwidth. For the 80 GHz bandwidth, the 1st order visibility decreases the fastest, for 20 GHz the slowest.

The dashed arrow shows how the 1st order visibility is affected by pulsed seeding. It pulsed seeding of the light source has a twofold effect: it reduces the time jitter related temporal misalignment and it also reduces the light bandwidth. These effects combined can lead to a 1st order visibility considerably higher than without pulsed seeding. In other words, the 1st order visibility increases when laser seeding is used, because it makes both the time jitter and the bandwidth smaller.

The filtering technique described in relation to FIG. 8 can also reduce the bandwidth. As described above, the filtering technique does not affect the time jitter.

Figure 16B:
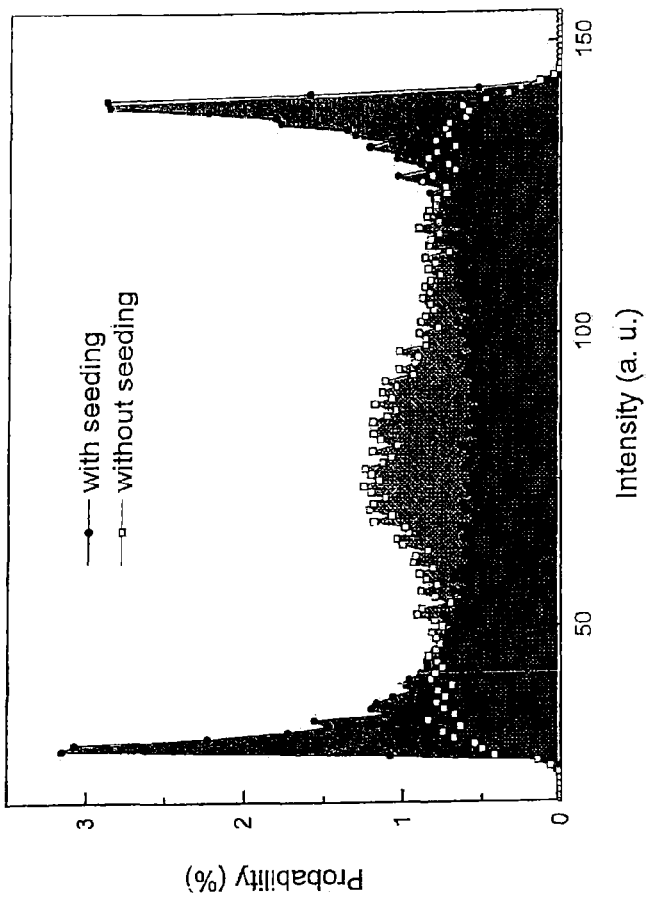
FIG. 16B is a graph of the probability of a measurement of each value of intensity.
Figure 17B:
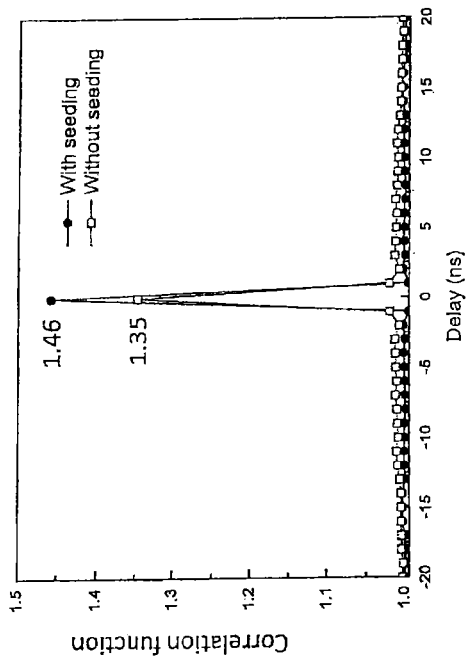
FIG. 17B is a graph of the second order correlation function against the time delay.

FIG. 16B and FIG. 17B shows measurements from interference experiments performed using the apparatus described in relation to FIG. 9 above. The interference measurements were performed using a 1 GHz clock rate, and an asymmetrical Mach-Zehnder interferometer with a 1-ns delay. No spectral filtering was used. Laser pulses of adjacent clocks interfere at the output of the Mach-Zehnder interferometer. Interference measurements are made both with seeding and without seeding and compared. The time jitter is reduced by more than 25%, from 7.5 ps without seeding to 5.5 ps with seeding. The bandwidth of the light is also reduced, and the overall visibility is improved from a value of 70% without seeding to a value of 92% with seeding.

FIG. 16B shows how the expected visibility peak approaches its maximum when laser seeding is used. The horizontal axis shows the intensity in a.u. of the light measured at one of the detectors (for example detector 908). The intensity is shown from 0 to 150. These intensity scales are just for schematic understanding. "0" intensity shown is not meant to be the absolute 0 intensity. The vertical axis shows the percentage probability from 0 to 3% of each intensity being measured by the detector.

The open squares show the probability of each intensity being measured. A single pulsed light source without seeding is used to supply the light pulses (for example a light source such as light source 102 in FIG. 1). The probability is around 1% across the intensities. The closed circles show the probability of each intensity being measured with seeding (i.e. including a master light source which injects pulses into the slave light source, and where the slave light pulses are used for interference). The probability peaks at around 3% for the maximum and minimum intensity. The peaks are observed because the dependence of intensity on the phase (x) has the form of a $\cos^2 x$ function, which is higher for x=0, $\pi$ and is lower for x=$\pi/2$.

Figure 17A:
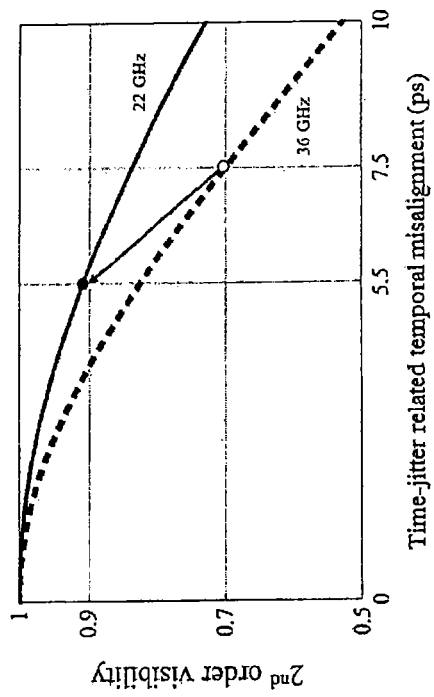
FIG. 17A is a graph of the second order visibility against time jitter related temporal misalignment.

FIG. 17A is a simulation showing how the 2nd order interference visibility increases when laser seeding is used. The 2OI visibility can be measured using a setup shown in FIG. 2 or FIG. 11 using a single fast photodiode. Suppose detector 207 is a high bandwidth photodiode, which samples the interference outcome synchronously with the clock of lasers. For example, the sampling rate is 1 GHz if the laser diode is operated in 1 GHz. The measurement outcomes are a series of intensity values I(1), I(2) ... I(n) ..., where n represents the clock number of sampling. We can compute the second order correlation function (CF) using:

$$CF = \langle I^2(n) \rangle / \langle I(m)I(n) \rangle \quad \text{(Eq. 5)}$$

where $\langle \cdot \rangle$ means statistical average and m≠n.

The second order visibility (V) and the second order correlation function (CF) are related by the relation CF=1+V/2.

The laser seeding makes both the time jitter and the bandwidth smaller, thus increasing the 2nd order interference visibility. Without seeding, the bandwidth of the light is 36 GHz, with seeding it is reduced to 22 GHz. Data from the correlation function described in relation to FIG. 17B below, measurement of the bandwidth for pulses with an without seeding and data from the simulation shown in FIG. 16A are all used to draw the curves in this figure.

The vertical axis is 2nd order visibility, which is shown from 0.5 to 1, on a logarithmic scale. The horizontal axis is time jitter related temporal misalignment (ps), which is shown from 0 to 10, again on a logarithmic scale. The solid line shows the 2nd order visibility for pulses with seeding, having a 22 GHz bandwidth. The dashed line shows the 2nd order visibility for pulses without seeding having a 36 GHz bandwidth.

For both lines, the 2nd order visibility for 0 temporal misalignment is 1. For both lines, the visibility decreases as the temporal misalignment increases. Specifically, the visibility decreases as long as the time misalignment increases. The visibility is also poorer the larger the bandwidth. For the 36 GHz bandwidth, the 2nd order visibility decreases the fastest, for 22 GHz the slowest.

The arrow shows how the 2nd order visibility is affected by pulsed seeding. Pulsed seeding of the light source has a twofold effect: it reduces the time jitter related temporal misalignment and it also reduces the light bandwidth. These effects combined can lead to a 2nd order visibility considerably higher than without pulsed seeding. In other words, the visibility increases when laser seeding is used, because it makes both the time jitter and the bandwidth smaller. The arrow links an initial point obtained without seeding (shown by the empty circle on the 36 GHz bandwidth curve) to a final point obtained with seeding (shown by the filled circle on the 22 GHz curve). The pulsed seeding technique enhances the visibility of the experiment from around 70% to around 92%.

FIG. 17B shows the correlation functions for the results obtained with seeding (filled circles) and without seeding (open squares). The measurement was measured at a clock rate of 1 GHz using a setup shown in FIG. 2 using a single fast photodiode. The data shown are:

$$\langle I(n+\Delta)I(n) \rangle / \langle I(m)I(n) \rangle,$$

Where $\Delta$ is the clock number difference corresponding to the delay shown in the horizontal axis, and m and n (m≠n) are arbitrary integers representing sampling times. The brackets indicate the statistical average. The vertical axis is the correlation function, shown from 1 to 1.5. At 0 ns delay, the ideal value for the correlation function is 1.5. Without seeding, only a value of up to 1.35 can be achieved (empty squares). With seeding, this value is increased up to 1.46 (filled circles). The correlation functions show that the expected visibility peak approaches its maximum when seeding is activated. The maximum of the correlation function is 1.5. Using seeding a value of 1.46 is obtained.

Generation of phase randomised light pulses by gain-switched lasers can be affected by time jitter. Light in lasers is initially generated by spontaneous emission, which is a random, unpredictable process. The light is amplified by stimulated emission. The laser pulses are emitted at random times, due to the spontaneous emission contribution. In many applications, a deterministic emission time is beneficial. The time jitter of a slave gain-switched laser can be reduced by seeding it with another gain-switched laser, the master laser. The emission of the slave laser is triggered by the seeding pulse of the master laser, rather than by spontaneous emission, and therefore the emission time jitter is reduced. The phase randomisation is maintained because the master laser itself is still triggered by spontaneous emission.

The above described light sources can be used in phase randomised quantum and classical optical interference with high performance in terms of visibility, speed and efficiency.

The light sources have good visibility, time resolution and spectral resolution, without system complexity, and with phase-randomised light pulses.

Pulsed injection seeding is used with interference applications. The reduced time jitter and bandwidth of the pulses generated with pulsed injection seeding improves the interference visibility. The randomised phase of the injected pulses means that the generated slave pulses have randomised phases. This contributes to increasing the security of QKD and MDI-QKD systems, especially if implemented with decoy states.

FIG. 18 shows a schematic illustration of a light source that is part of an interference system in accordance with an embodiment, in which a master light source 1804 and a slave light source 1801 are integrated on a semiconductor substrate 1847. The master light source 1804 and the slave light source 1801 are edge emission lasers, and are laterally combined on the substrate 1847. Light is emitted in the plane of the layers, i.e. in a direction perpendicular to the stacking direction of the layers.

The master light source 1804 and slave light source 1801 are semiconductor lasers, for example gain switched lasers or light emitting diodes.

The master light source 1804 and the slave light source 1801 are integrated onto a first surface of the substrate 1847. The master light source 1804 and the slave light source 1801 are arranged relative to each other in a first plane, which is substantially parallel to the first surface of the substrate 1847. Light is emitted from the master light source 1804 and the slave light source 1801 in the first plane. The master light source 1804 and the slave light source 1801 are configured such that light emitted from the master light source 1804 enters an aperture of the slave light source 1801. The master light source 1804 is configured to intermittently generate master light pulses such that the phase of each master light pulse has a random relationship to the phase of each subsequently generated master light pulse, and supplies the master light pulses to the slave light source 1801. A controller is configured to apply a time varying drive signal to the slave light source 1801 such that just one slave light pulse is generated during each period of time for which a master light pulse is received, such that the phase of each slave light pulse has a random relationship to the phase of each subsequently generated slave light pulse.

The optical device shown in FIG. 18 can be grown by metal organic vapour phase epitaxy (MOVPE). MOVPE is suitable due to the multiple overgrowth steps in the process. The device can be grown using a monolithically integrated approach or alternatively can be flip-chip bonded on a foreign carrier, as described in relation to FIG. 33.

The optical device may optionally comprise a tuning element 1849 also integrated onto the substrate 1847. The tuning element may be arranged in the first plane, between the master light source 1804 and the slave light source 1801.

The tuning element 1849 may be a phase modulator for example. Where the tuning element 1849 is a phase modulator, changing the voltage across this section changes the index of refraction and therefore the phase of the light which is injected into the slave light source 1801. This allows phase modulation of the slave light pulses to be achieved without an external phase modulator. The phase modulator can also be positioned after the slave light source 1801, such that the slave light source 1801 is between the phase modulator and the master light source 1804.

Alternatively, the tuning element 1849 may be an intensity modulator.

The tuning element may be a thin slab of material to attenuate the light coming from the master laser, or a microscopic lens for example.

Further sections may be included. For example the device may comprise an intensity tuning element for generating decoy states, and an intensity tuning element for generating vacuum states. The device may comprise two or more intensity modulators, where one is used to generate the decoy level, for example, and the second one to generate the vacuum level. Alternatively, the device can comprise a single intensity modulator, and both levels are generated with the single intensity modulator.

In one embodiment, the substrate is InP. InP substrates can be used for devices operating at telecom wavelengths, as its crystallographic structure allows emission at energies from telecom bands. Alternatively, it is possible to use GaAs as a substrate. GaAs can be used to form emitters at 1.3 um. In one embodiment, the individual components are grown on InP and then flip-chip bonded to a different substrate.

One or more electrical contacts may be formed to the master light source 1804 and slave light source 1801. In an embodiment, AuGeNi may be used as an n-type contact metal and the p-contact metal may be any one of PdZnAu, AuCrAuZnAu or AuBe. An n-type electrode is formed comprising the n-contact and a p-type electrode is formed comprising the p-contact.

For fabrication of the device, wet etching of InP based materials can be used, for example with $Cl_2$ based etching at high temperatures diluted with Ar or $N_2$, $CH_4$ based etching or $SiCl_4Ar$ based etching. Dielectric dry etching may also be used, and can be performed using $CHF_3$ or $CF_4$ based chemistry, with a dielectric hard mask formed using $Si_3N_4$ or $SiO_2$. Further details of methods of fabrication of specific examples of such devices are described below.

Various lateral shapes of the master light source 1804 and the slave light source 1801 can be formed, for example rectangular or square cross-section.

The optical device may comprise an integrated heat sink, which may be synthetic diamond for example.

In one embodiment, either or both of the master light source 1804 and the slave light source 1801 are distributed feedback (DFB) lasers, distributed Bragg reflector (DBR) lasers or ridge lasers. Ridge lasers are also referred to as stripe lasers. A Fabry-Perot laser is a type of ridge or stripe laser. The terms stripe and ridge refer to the form of the laser waveguide. Fabry-Perot refers to the form of the laser cavity i.e. two parallel mirrors made up by the end faces of the waveguide.

Figure 21:
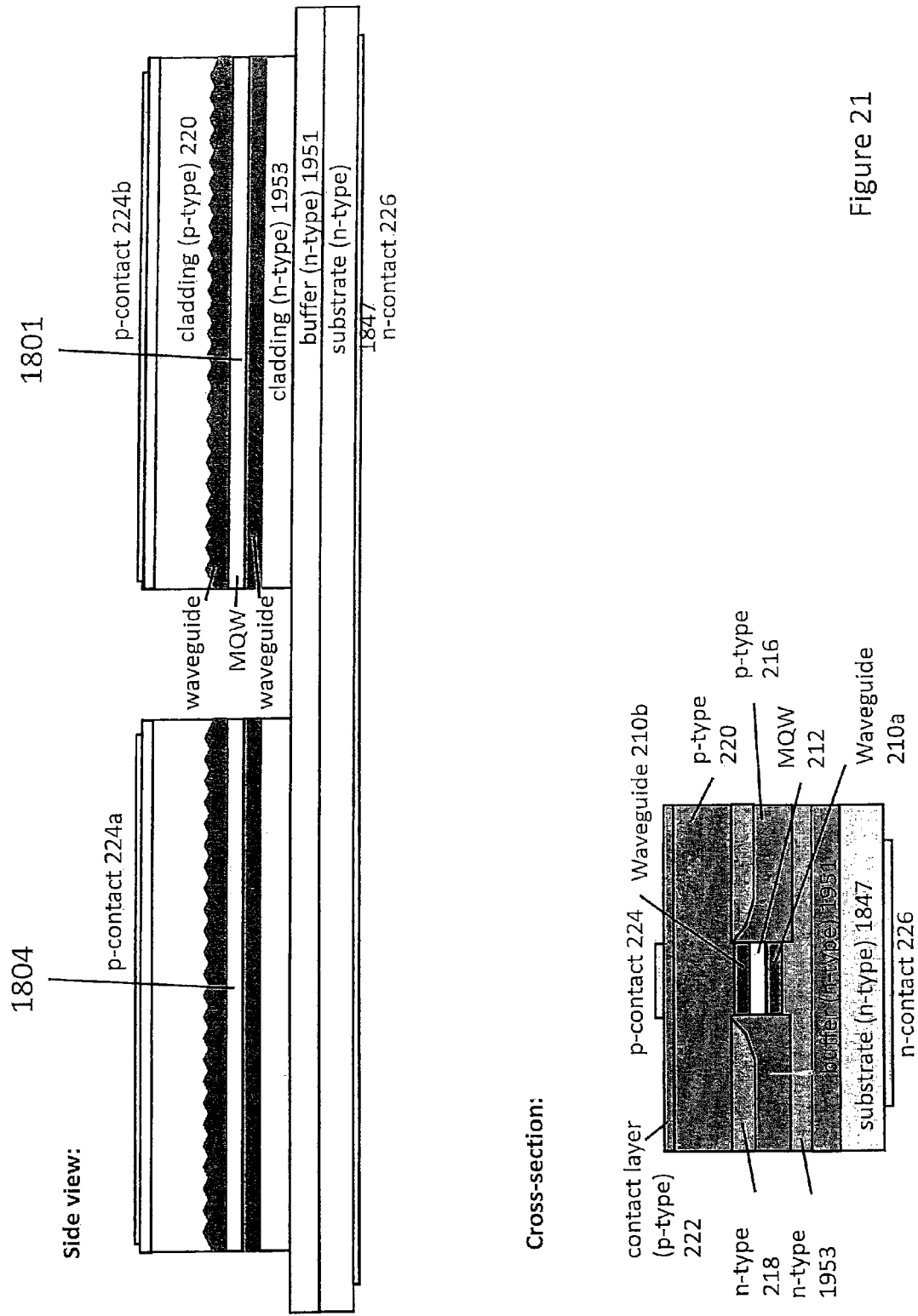
FIG. 21 shows a schematic illustration of a light source that is part of an interference system in accordance with an embodiment, in which the master light source and the slave light source are both DFB lasers, in a vertical junction and in a lateral combination.

The lasers may comprise grating. The grating region may be separate from the active region or the active region may comprise the grating. A laser where the active region and grating are separate is referred to as DBR (distributed Bragg reflector) laser. A DBR is shown in FIG. 20. A laser where the active region comprises the grating is a DFB laser. A DFB laser is shown in FIG. 21.

The device may further comprise an intensity modulator. An intensity modulator may modulate the intensity of the light by changing the absorption coefficient of the material in the modulator, for example an electro-absorption modulator. An electro-absorption modulator is a semiconductor device for which the voltage applied to the device changes the absorption coefficient, and therefore the intensity of light travelling through the device. In another embodiment, the intensity modulator is based on a Mach-Zehnder interferometer. A Mach-Zehnder based intensity modulator changes the phase difference between the two arms of the interferometer to modulate the output intensity.

Where two different devices, such as a slave light source 1804 and an intensity modulator, are monolithically grown, a physical gap is created between them, which may be achieved by etching trenches for example. This gap can be filled with a material with a similar index of refraction, after the trenches are etched.

Figure 19A:
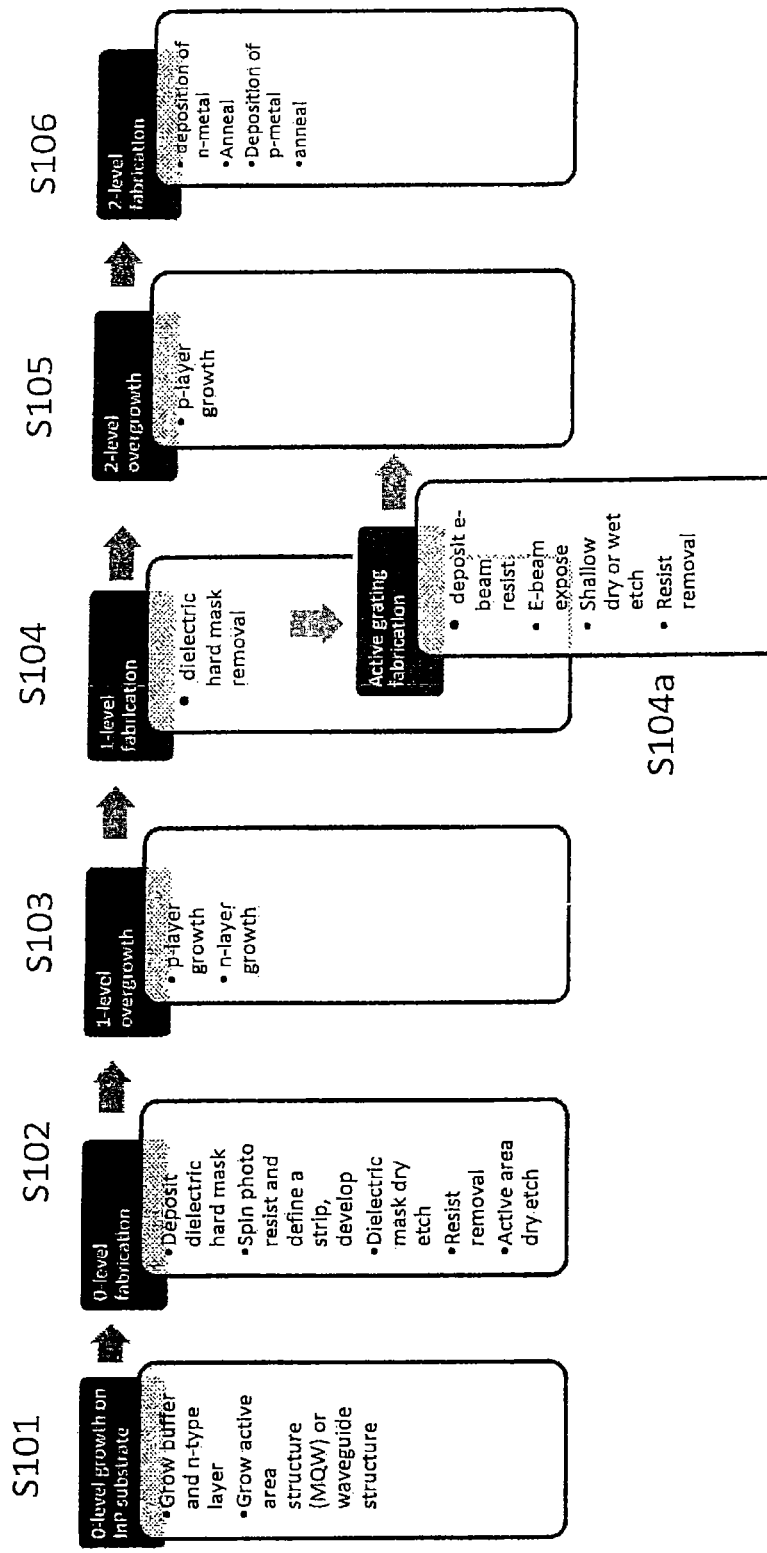
FIG. 19A is a flow chart of a method of growth and fabrication of a monolithically integrated master light source and slave light source in a vertical junction and a lateral combination, which is part of a method of fabricating an interference system in accordance with an embodiment.

FIG. 19A is a flow chart of a method of growth and fabrication of a monolithically integrated master light source 1804 and slave light source 1801 in a vertical junction, which is part of a method of fabricating an interference system in accordance with an embodiment. The method can be used to fabricate an optical device having a master light source 1804 and a slave light source 1801 which are the same type, for example both DFB lasers or both stripe lasers, in a lateral combination. The method may be used to fabricate a light source such as described in relation to any of FIGS. 2 to 15.

In devices fabricated by this method, both the master light source 1804 and the slave light source 1801 are integrated monolithically on a substrate. In an embodiment, the substrate is an n-type InP substrate.

In step S101, a buffer layer 1951 is grown on the substrate 1847, followed by an active area structure. The active area structure may be referred to as an active region. In one embodiment, the buffer layer is 200 nm thick. In one embodiment, the buffer layer is n-type InP. The active area structure may be a multi quantum well (MQW) structure, where the method is used to fabricate DFB lasers or stripe lasers. A MQW structure is described in more detail in relation to FIG. 20 below. The active structure may comprise an n-type layer 1953, a first waveguide layer 210a, a MQW layer 212 and a second waveguide layer 210b. This stage may be referred to as "0-level growth". The waveguide layers 210a and b may be InGaAs layers. The cladding layers, i.e. n-type layer 1953 and p-type layer above the waveguide region 210b may be InAlAs, lattice matched to InP. The MQW active area within the waveguide may be InAs/InGaAs.

For a stripe laser, a p-type layer 220 is grown overlying and in contact with the second waveguide layer 210b and a p-type layer 222 is grown overlying and in contact with the p-type layer 220. The p-type layer 222 is a heavily doped p-type material, in which the carrier concentration is higher than layer 220. This can be omitted providing layer 220 has sufficient doping.

In step S102, the device is removed from the growth machine for "0-level fabrication". This step comprises deposition of a dielectric hard mask 214, which may be a $Si_3N_4$ or a $SiO_2$ layer for example. The thickness of this dielectric layer may be dependent on the thickness of the active area and the dry etch selectivity. A photo resist is then spun on the dielectric layer, and a strip is defined in the photo resist by optical lithography. In one embodiment, the strip is 1.5-2.5 µm in width and 500 µm length. For a DFB laser, the strip may be longer to include the grating length. The depth will depend on the wafer design. After development, the strip pattern defined in the resist is transferred to the dielectric layer through dry etching based on $CF_4$ or $CHF_3$ chemistry, for example. Next, the remaining resist on the surface is removed, for example in a resist remover solution or by $O_2$ plasma ashing. Next, a semiconductor dry etch is carried out. $Cl_2$ based chemistry may be used to provide good quality vertical sidewalls. The etch is performed down to the n-type layer 1953 for a DFB laser. For a stripe laser, the etch is performed down to the p-type layer 220.

The sample is then ready for step S103: "1-level overgrowth". The dielectric hard mask 214 is left on the strip area for this step. This prevents local overgrowth on top of the active area. A p-type layer 216 followed by an n-type layer 218 are then grown. The etched area of the device is planarized. Planarization is a growth process performed at certain conditions in order to fill the etched areas with new epitaxial material. The top of the ridge is covered with a dielectric mask so growth does not occur there. The adatoms will preferentially form a layer at the bottom of the trench etched in the previous step.

Step S104 is "1-level fabrication". In this step, the dielectric hard mask 214 is removed. This may involve dipping the sample in HF or dry etching.

At this stage, step S104a, "active grating fabrication", may optionally follow if a DFB laser or a DBR laser is being fabricated. Alternatively, the fabrication method may proceed directly from step S102 to step S106 for a stripe laser.

Step S104a involves spinning the sample with an electron beam lithography resist and defining the grating pattern with electron beam lithography. The grating dimensions may depend on the laser output wavelength. After development the pattern is transferred by wet or dry shallow etching. Gratings are formed by etching part of the waveguide layer 210b off, for example by etching trenches in the waveguide layer 210b. The trenches may have a groove-shaped pattern. The dimensions of the grating are calculated according to the operation wavelength of the device. The grating on the surface of the waveguide layer 210b opposing the surface overlying and in contact with the MQW layer acts in a similar manner to a mirror. For a DBR laser, a grating may be formed at both ends of the component to create a cavity. The gratings at each end may have different reflectivity to enable output of the light from one end. For a DFB laser, a grating may be formed throughout the active region.

Step S105 is "2-level overgrowth". This involves growing an epitaxial p-type layer 220, which may be patterned by grating if optional step S104a has been performed. In an embodiment, this layer is 200 nm thick. Although the p-type layer 220 is grown across the entire device, due to the n-type layer 218 and p-type layer 216 the current is provided only to the active area.

Step S106 is "2-level fabrication", which involves definition of contact areas with optical lithography, depositions of n and p metal contacts and annealing. The n metal contact is deposited on the opposite surface of the substrate 1847 to the master light source 1804 and slave light source 1801. The p metal contact is deposited on the p-type layer 220.

In the case where the device comprises two stripe lasers, vertical trenches are etched at each end of the master light source 1804 and the slave light source 1801 to provide end mirrors.

Similar devices can be fabricated in two independent runs, diced and then flip chip mounted and aligned on a foreign platform. For example two InP-based lasers can be mounted on a common Si carrier substrate. This is described in relation to FIG. 33.

Figure 19B:
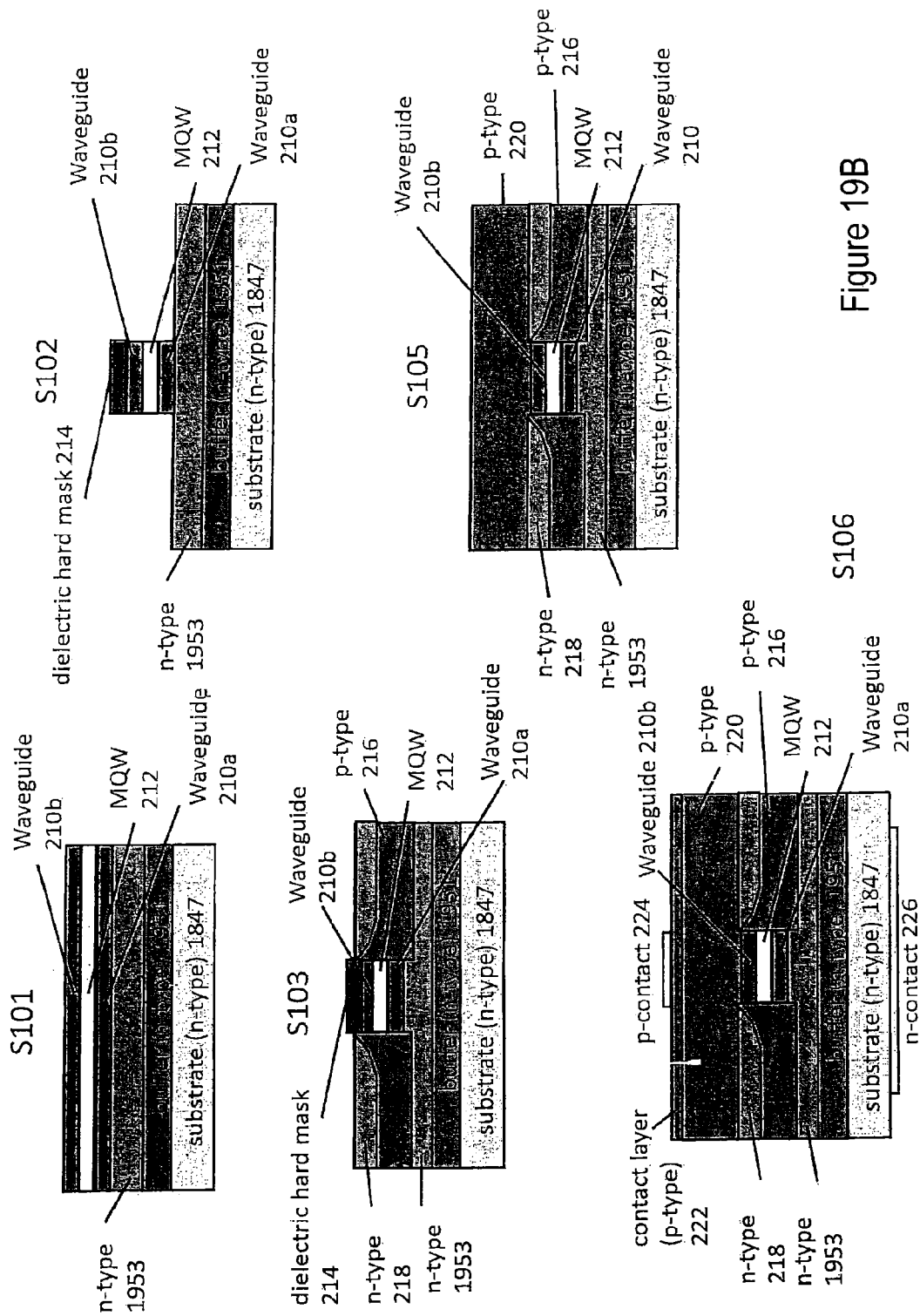
FIG. 19B shows the structure of the device after selected steps of the method of FIG. 19A, for an optical device having two DFB lasers.

FIG. 19B shows the structure of the sample after the steps of FIG. 19A, for an optical device having two DFB lasers.

After step S101, the sample comprises a substrate 1847, a buffer layer 1951 overlying and in contact with the substrate 1847, an n-type layer 1953 overlying and in contact with the buffer layer 1951, a first waveguide layer 210a overlying and in contact with the n-type layer 1953, an MQW layer 212 overlying and in contact with the first waveguide layer 210a and a second waveguide layer 210b overlying and in contact with the MQW layer 212.

After step S102, the dielectric hard mask 214, second waveguide layer 210b, MQW layer 212 and first waveguide layer 210a are a ridge which is overlying and in contact with the n-type layer 1953.

After step S103, the p-type layer 216 is overlying and in contact with the n-type layer 1953 either side of the ridge, and the n-type layer 218 is overlying and in contact with the p-type layer 216.

After step S105, the dielectric hard mark 214 has been removed, and the p-type layer 220 is overlying and in contact with the ridge and the n-type layer 218.

After step S106, a p-type contact layer 222 is overlying and in contact with the p-type layer 220. A p-contact metal 224 is overlying and in contact with the p-type contact layer 222. An n-contact metal 226 is in contact with the opposite surface of the substrate to the p-contact metal 224.

Figure 19C:
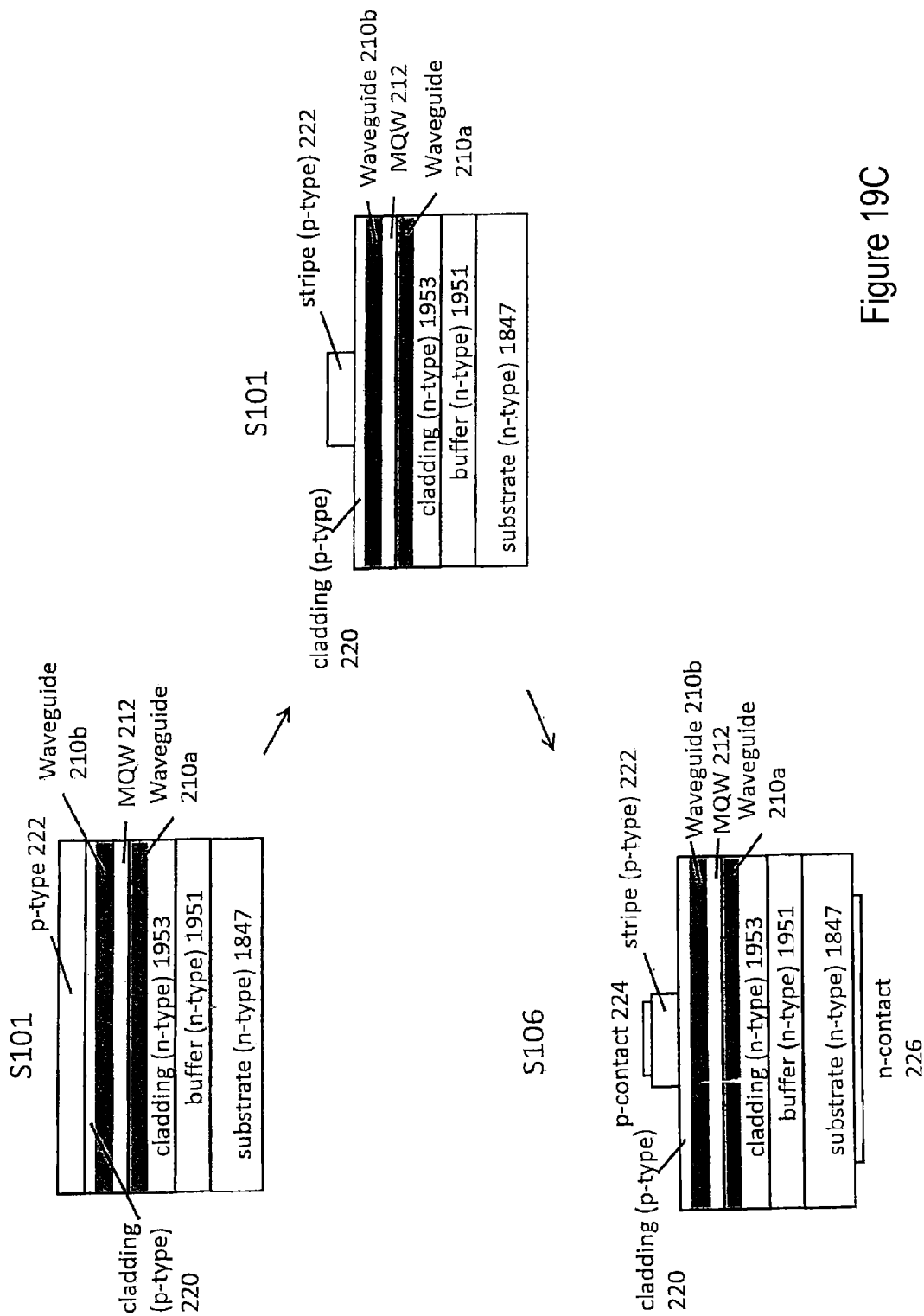
FIG. 19C shows the structure of the device after selected steps of the method of FIG. 19A, for an optical device having two stripe lasers.

FIG. 19C shows the structure of the sample after each step for two stripe lasers. After step S101, the sample comprises a substrate 1847, a buffer layer 1951 overlying and in contact with the substrate 1847, an n-type layer 1953 overlying and in contact with the buffer layer 1951, a first waveguide layer 210a overlying and in contact with the n-type layer 1953, an MQW layer 212 overlying and in contact with the first waveguide layer 210a and a second waveguide layer 210b overlying and in contact with the MQW layer 212, a p-type layer 220 overlying and in contact with the second waveguide layer 210b and a p-type layer 222 overlying and in contact with the p-type layer 220.

After step S102, the p-type layer 222 is a ridge which is overlying and in contact with the p-type layer 220.

After step S106, a p-contact metal 224 is overlying and in contact with the p-type layer 222. An n-contact metal 226 is in contact with the opposite surface of the substrate to the p-contact metal 224.

FIG. 20 shows a schematic illustration of a light source that is part of an interference system in accordance with an embodiment, in which the master light source 1804 and the slave light source 1801 are both DBR lasers, in a vertical junction and in a lateral combination. The figure shows a side view along the length of the device, i.e. along the direction along which light is emitted and a cross-section through a direction perpendicular to the direction along which light is emitted are shown.

The active area in each DBR laser comprises a multi quantum well region (MQW). The MQW region comprises a plurality of quantum well layers. In an embodiment, in which a DBR laser is configured for 1.55 um operation, the MQW region comprises alternating layers of materials such as, for example: AlInGaAs/InP, AlInGaAs/AlInAs, InGaAsP/InP, InGaAsP/AlInAs or InGaAs/AlInGaAs. All these layers are lattice matched to the InP substrate.

The device comprises a substrate 1847. On one surface of the substrate is an n-contact 226. Overlying and in contact with the opposite surface to the substrate 1847 is the buffer layer 1951. Both the substrate 1847 and the buffer layer 1951 are n-type layers. Alternatively, the structure can be reversed, such that the substrate 1847 is a p-type layer. The layers may be n-doped InP. Overlying and in contact with the buffer layer 1951 is the n-type layer 1953. The n-type layer 1953 may be n-doped InP. Overlying and in contact with a strip of the n-type layer 1953 is a first waveguide material 210a. Overlying and in contact with the first waveguide material 210a is a MQW layer 212. Overlying and in contact with the MQW layer 210 is a second waveguide material 210b. On either side of the strip and overlying and in contact with the n-type material 1953 is a p-type material 216, which may be p-doped InP. The n-type layer 218 is overlying and in contact with the p-type layer 216, and may be n-doped InP. The p-type layer 220 is overlying and in contact with the second waveguide layer 210b and the n-type layer 218, and may be p-doped InP. A p-type contact layer 222 is overlying and in contact with the p-type layer 220. In one embodiment, the p-type contact layer 222 is heavily doped InP, i.e. having a dopant concentration higher than that of layer 220. A p-contact metal 224 is overlying and in contact with part of the p-contact layer 222.

As shown in the side view, the MQW strip runs along the length of the device. There is a first p-type contact layer 224a over part of the MQW strip. On either side of the part of the strip under the first p-contact 224a along the direction in which light is emitted, there is a diffraction grating in the second waveguide material. This forms the master light source 1804. A second p-type contact 224b is configured over a second part of the MQW strip, which is further along the length of the device from the master light source 1804. On either side of the part of the strip under the second p-contact 224b in the direction in which light is emitted, there is a diffraction grating in the second waveguide material. This forms the slave light source 1801.

A current is applied between the first p-contact 224a and the n-contact 226 in order to generate light in the MQW strip of the master light source 1804. Light generated in the MQW strip of the master light source 1804 is emitted along the MQW layer. The light is laterally confined by the p-type layer 216 and vertically confined by the waveguide layers 210a and b. The light enters the MQW layer of the slave light source 1801. A time varying current is applied between the second p-contact 224b and the n-contact 226. The light travels between the master light source 1804 and the slave light source 1801 in a waveguide region in this device.

FIG. 21 shows a schematic illustration of a light source that is part of an interference system in accordance with an embodiment, in which the master light source 1804 and the slave light source 1801 are both DFB lasers, in a vertical junction and in a lateral combination. The figure shows a side view along the length of the device, i.e. along the direction along which light is emitted and a cross-section through a direction perpendicular to the direction along which light is emitted are shown.

The structure of the device is similar to the device shown in FIG. 20. However, FIG. 21 shows two DFB lasers, in which the grating is along the entire structure on the surface of the waveguide region 210b. The DFB lasers do not have discrete mirrors, instead the grating provides optical feedback distributed over the active region and the light is reflected by the grating. This is different to FIG. 20, which shows DBR lasers in which discrete mirrors are formed by gratings at the ends of the laser, and the active regions and gratings are separate.

There is a gap between the master light source 1804 and the slave light source 1801. The gap may extend across the entire device in the direction perpendicular to the direction in which light is emitted. The gap extends down to the buffer layer 1951. Light travels between the master light source 1804 and the slave light source 1801 though free space in the gap. The gap is etched during fabrication of the device.

Figure 22:
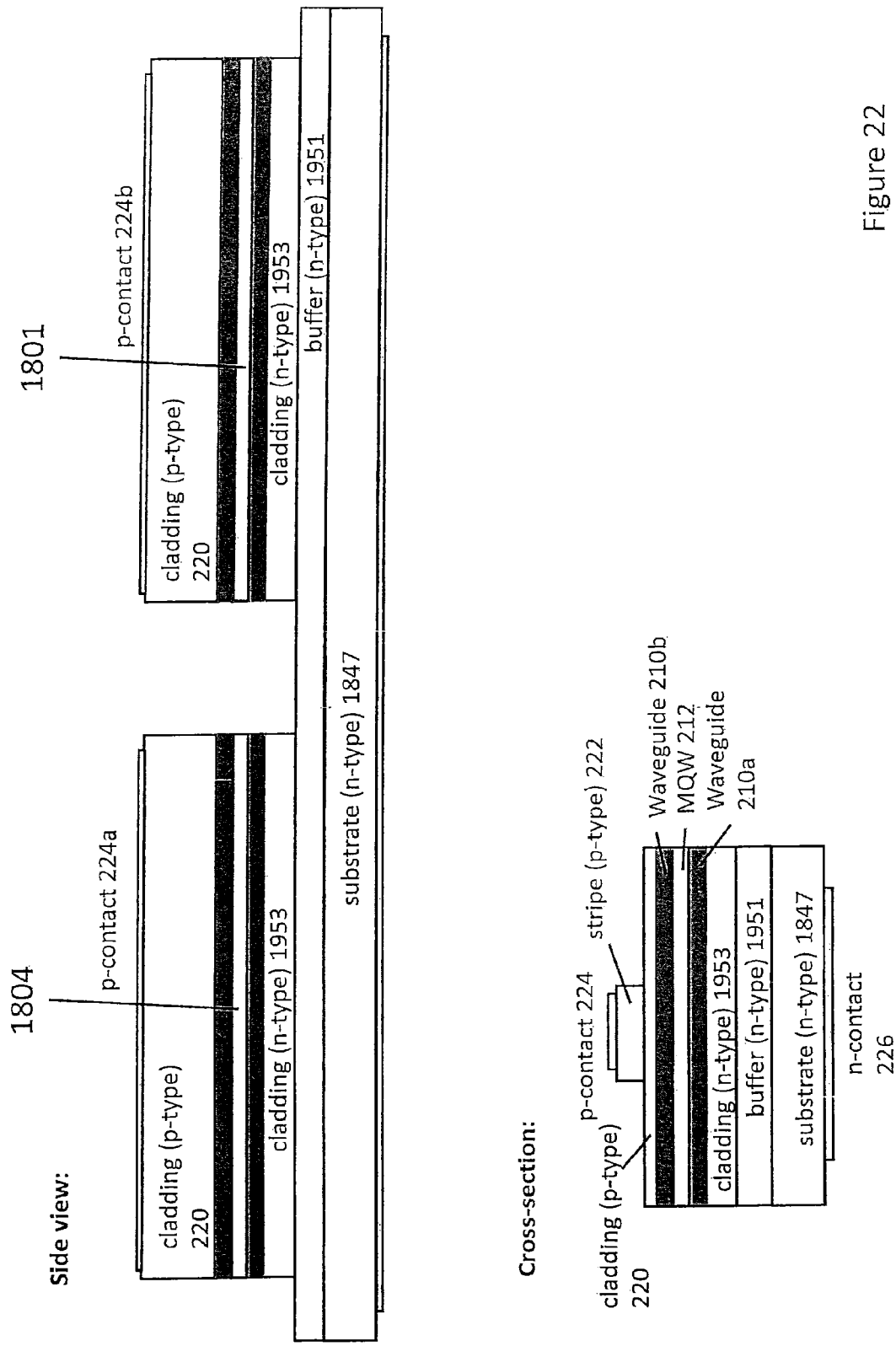
FIG. 22 shows a schematic illustration of a light source that is part of an interference system in accordance with an embodiment, in which the master light source and the slave light source are both ridge lasers or stripe lasers, in a vertical junction and in a lateral combination.

FIG. 22 shows a schematic illustration of a light source that is part of an interference system in accordance with an embodiment, in which the master light source 1804 and the slave light source 1801 are both ridge lasers or stripe lasers, in a vertical junction and in a lateral combination. The figure shows a side view along the length of the device, i.e. along the direction along which light is emitted and a cross-section through a direction perpendicular to the direction along which light is emitted are shown.

In one embodiment, the ridge lasers are waveguides with well-defined facets. The material structure comprises a core surrounded by cladding material which is lattice matched to an InP substrate 1847. In one embodiment, the cladding material is InP and the core is AlInGaAs, for example. AlInGaAs may be used because it has a higher refractive index compared to InP.

The device comprises a substrate 1847. On one surface of the substrate is an n-contact 226. Overlying and in contact with the opposite surface to the substrate 1847 is the buffer layer 1951. Both the substrate 1847 and the buffer layer 1951 are n-type. Alternatively, the device may have a reversed structure, in which the substrate 1847 is p-type. Overlying and in contact with the buffer layer 1951 is the n-type, cladding layer 1953. Overlying and in contact with the n-type layer 1953 is a first waveguide material 210a. Overlying and in contact with the first waveguide material 210a is a MQW layer 212. Overlying and in contact with the MQW layer 210 is a second waveguide material 210b. A p-type, cladding layer 220 is overlying and in contact with the second waveguide layer 210b. The cladding layer may be InAlAs. A ridge of a p-type material 222 is overlying and in contact with the p-type layer 220. A p-contact metal 224 is overlying and in contact with the ridge 222. In one embodiment, the p-type contact layer 222 is InGaAs.

As shown in the side view, there is a gap between the master light source 1804 and the slave light source 1801. The gap may extend across the entire device in the direction perpendicular to the direction in which light is emitted. The gap extends down to the substrate 1847.

A current is applied between the p-contact 224a and the n-contact 226 in order to generate light. Light generated in the MQW strip of the master light source 1804 is emitted along the MQW layer. The light is vertically confined by the waveguide layers 210a and b. The laser mode is guided beneath the etched stripe, i.e. layer 222 in FIG. 22. Light travels between the master light source 1804 and the slave light source 1801 though free space in the gap. The light enters the MQW layer of the slave light source 1801. A time varying current is applied between the p-contact 224b and the n-contact 226.

Figure 23:
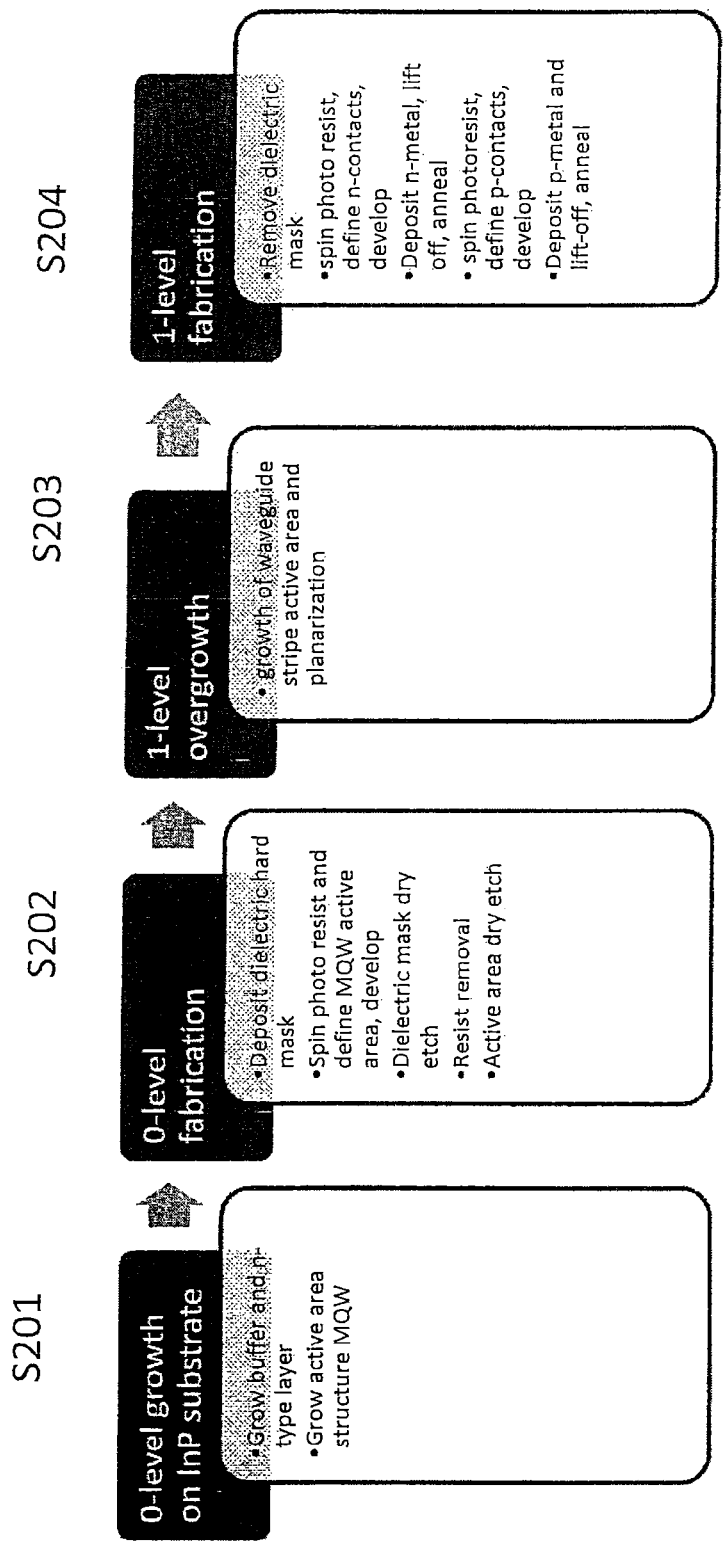
FIG. 23 shows a flow chart of a method of growth and fabrication of a monolithically integrated master light source and slave light source in a vertical junction and a lateral combination, which is part of a method of fabricating an interference system in accordance with an embodiment.

FIG. 23 shows a flow chart of a method of growth and fabrication of a monolithically integrated master light source 1804 and slave light source 1801 in a vertical junction which is part of a method of fabricating an interference system in accordance with an embodiment. The method can be used to fabricate an optical device having a master light source 1804 and a slave light source 1801 which are different types, or which are the same type but which are in combination with further devices, in a lateral combination. The method may be used to fabricate a device such as described in relation to FIG. 24 or 25.

In devices fabricated by this method, both the master light source 1804 and the slave light source 1801 are integrated monolithically on a substrate. In an embodiment, the substrate is an n-type InP substrate. One of the master light source 1804 and the slave light source 1801 may be a DFB laser and the other may be a stripe laser, for example. Alternatively, the method may be used where both the master light source 1804 and the slave light source 1801 are the same type, but a further element is included in the device.

In step S201, "0-level growth", a buffer layer 1951 is grown on the substrate 1847, followed an active area structure, for example a MQW region 212. In one embodiment, the buffer layer 1951 is 200 nm. The buffer layer may be an n-type InP layer.

In step S202, the sample is then taken out of the growth machine for "0-level fabrication". This step comprises deposition of a dielectric hard mask, which could be a $Si_3N_4$ or $SiO_2$ layer for example. The thickness of this dielectric layer may be dependent on the thickness of the active area grown and the dry etch selectivity. Next a photo resist is spun and a strip is defined by optical lithography. After development, the strip pattern defined in the resist is transferred to the dielectric layer through dry etching based on $CF_4$ or $CHF_3$ chemistry. Next, the remaining resist on the surface is removed in a resist remover solution or by $O_2$ plasma ashing. Next, a semiconductor dry etch is carried out. $Cl_2$ based chemistry may be used to provide good quality vertical sidewalls. This forms the "body" of one of the master light source 1804 or slave light source 1801, which may be, for example, a DFB laser. For a DFB laser, the steps for growing the p-type layer 216 and n-type layer 218 as described in relation to FIG. 19 may be included. In this stage, trenches are formed, by selectively removing the MQW area by etching.

The sample is then ready for step S203, "1-level overgrowth". The dielectric hard mask is left on the strip area. This will prevent local overgrowth on top of the device active area. In this step "the body" of the other of the master light source 1804 and slave light source 1801, which may be for example a stripe laser, is grown followed by planarization. The second laser structure is grown in the pre-defined trenches formed in step S202.

Where the master light source 1804 and slave light source 1801 are the same type, both are grown in step S202. A further component of a different type, for example a light guiding region, may then be grown in step S203.

In step S204, "1-level fabrication", the dielectric hard mask is removed. This involves dipping the sample in HF or dry etching. For the DFB laser, a diffraction grating should be formed at this stage by spinning the sample with an electron beam lithography resist and defining the grating pattern with electron beam lithography. The grating dimensions may depend on the laser output wavelength. After development the pattern is transferred by wet or dry shallow etching.

Next, fabrication is carried out, which involves spinning the optical resist and defining the n-contact 226. After development of the resist the n-metal is deposited and lifted off and annealed. A similar procedure is applied to define the p-contacts 224.

For the stripe laser, vertical trenches should be etched at either end of the stripe laser to provide end mirrors.

Similar devices can be fabricated in two independent runs, diced and then flip chip mounted and aligned on a foreign platform. For example two InP-based lasers may be mounted on a common Si carrier substrate.

Figure 24:
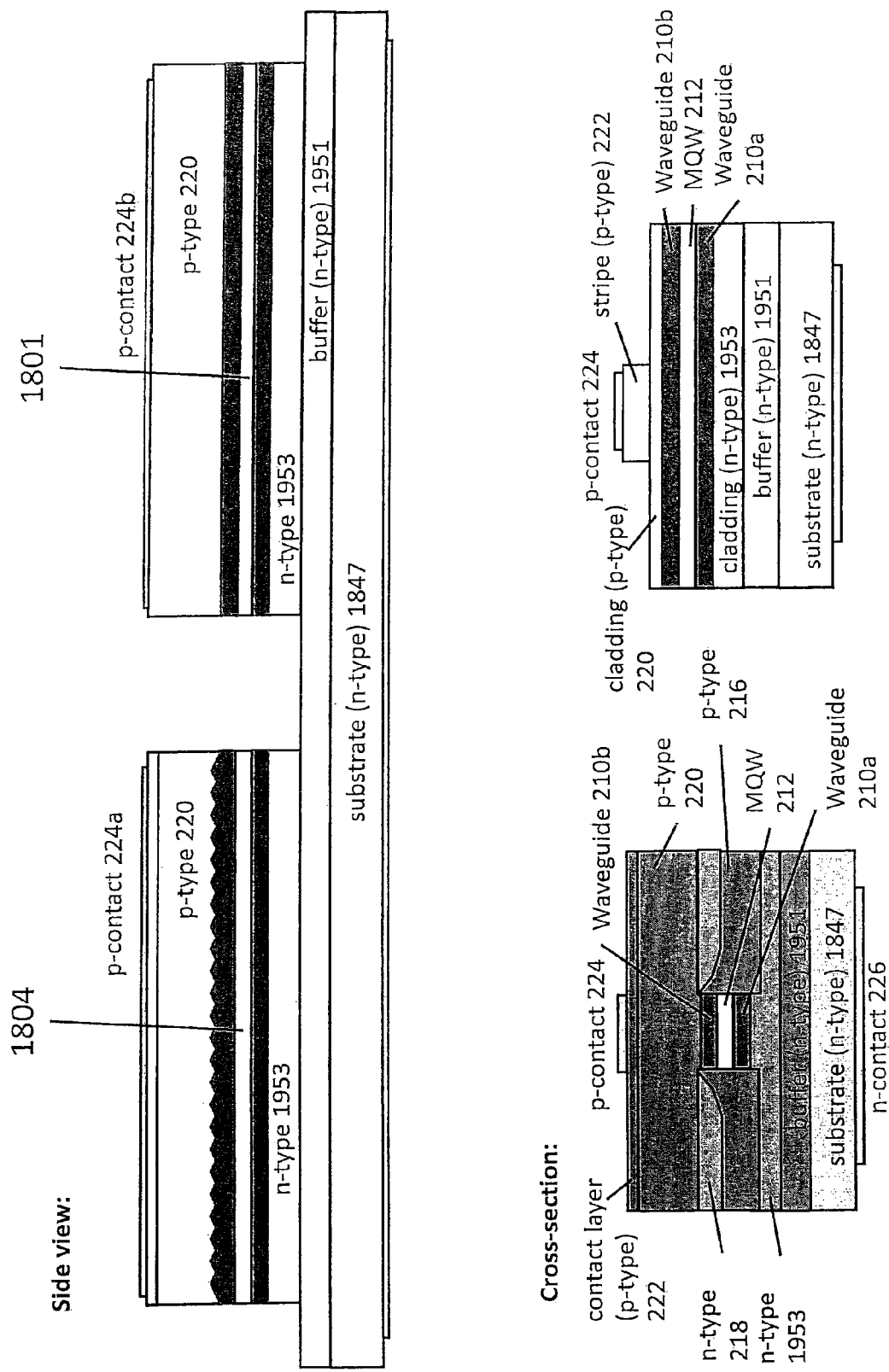
FIG. 24 shows a schematic illustration of a light source that is part of an interference system in accordance with an embodiment, in which the master light source is a DFB laser and the slave light source is a stripe laser, in a vertical junction and in a lateral combination.

FIG. 24 shows a schematic illustration of a light source that is part of an interference system in accordance with an embodiment, in which the master light source 1804 is a DFB laser and the slave light source 1801 is a stripe laser, in a vertical junction and in a lateral combination. The figure shows a side view along the length of the device, i.e. along the direction along which light is emitted and a cross-section through a direction perpendicular to the direction along which light is emitted.

The DFB laser has the structure described in relation to FIG. 21. The stripe laser has the structure described in relation to FIG. 22. There is a gap between the master light source 1804 and the slave light source 1801. The gap may extend across the entire device in the direction perpendicular to the direction in which light is emitted. The gap extends down to the substrate 1847. Light travels between the master light source 1804 and the slave light source 1801 though free space in the gap.

Figure 25:
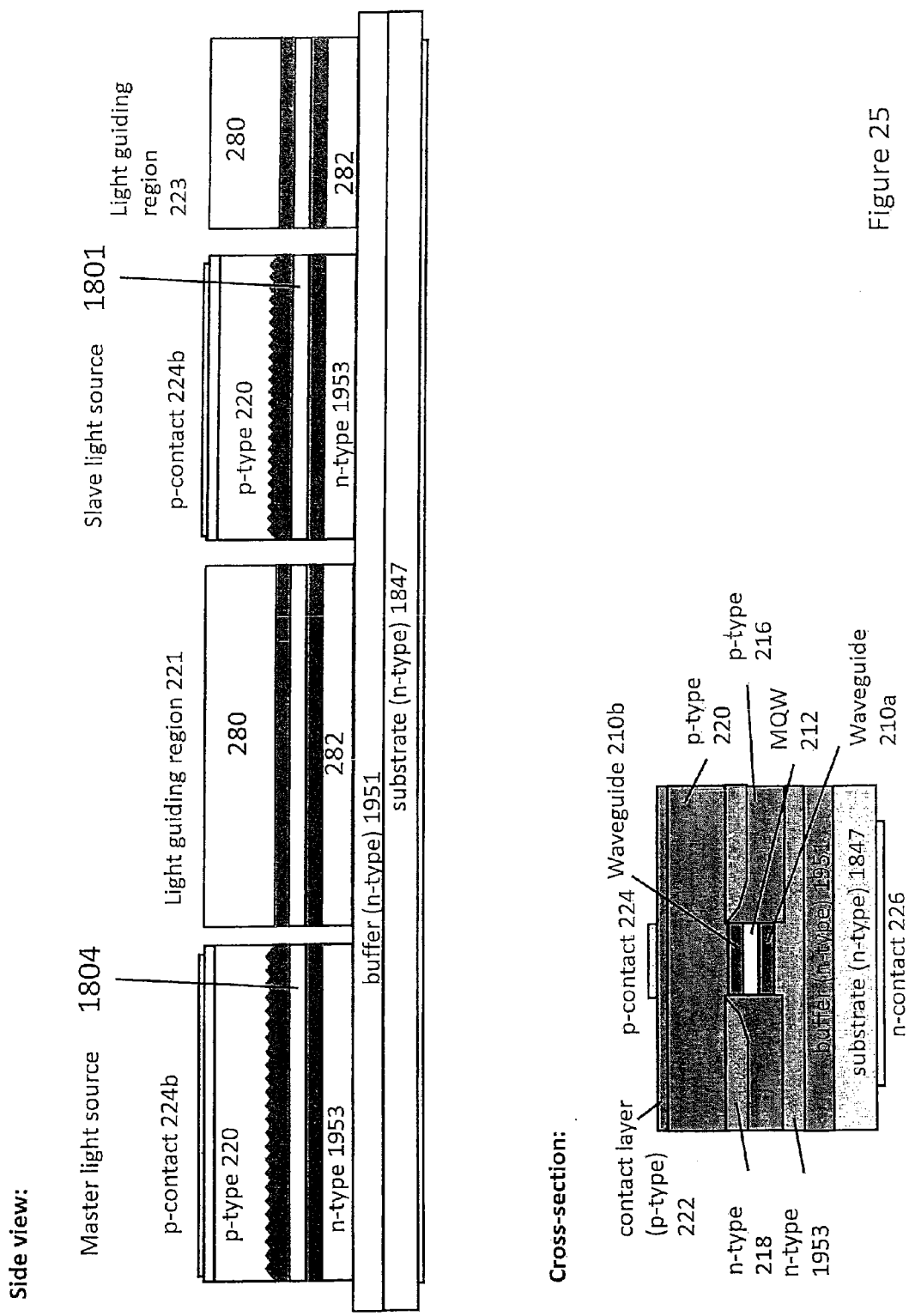
FIG. 25 shows a schematic illustration of a light source that is part of an interference system in accordance with an embodiment, in which the master light source and the slave light source are both DFB lasers and comprising light guiding regions, in a vertical junction and in a lateral combination.

FIG. 25 shows a schematic illustration of a light source that is part of an interference system in accordance with an embodiment, in which the master light source 1804 and the slave light source 1801 are both DFB lasers and comprising light guiding regions, in a vertical junction and in a lateral combination. The figure shows a side view along the length of the device, i.e. along the direction along which light is emitted and a cross-section through a direction perpendicular to the direction along which light is emitted are shown.

The DFB lasers have the structure described in relation to FIG. 21. There is a light guiding region 221 between the master light source 1804 and the slave light source 1801. There is a gap between the master light source 1804 and the light guiding region 221, and a gap between the light guiding region 221 and the slave light source 1801. There is a second light guiding region 223 positioned on the opposite side of the slave light source 1801 to the first light guiding region 221. There is a gap between the slave light source 1801 and the second light guiding region 223. The gaps may extend across the entire device in the direction perpendicular to the direction in which light is emitted. The gaps extend down to the buffer layer 1951. Light travels between the master light source 1804 and the slave light source 1801 though free space in the gaps and the light guiding region 221.

The light guiding regions comprise a first layer 280 overlying and in contact with the buffer layer 1951, a waveguide region overlying and in contact with the first layer 280 and a second layer 282 overlying and in contact with the waveguide region. Light is confined vertically and laterally in the waveguide region. The first layer 280 and second layer 282 may be InP for example. The waveguide region may comprise an InGaAs layer with InAlAs cladding regions.

Figure 26A:
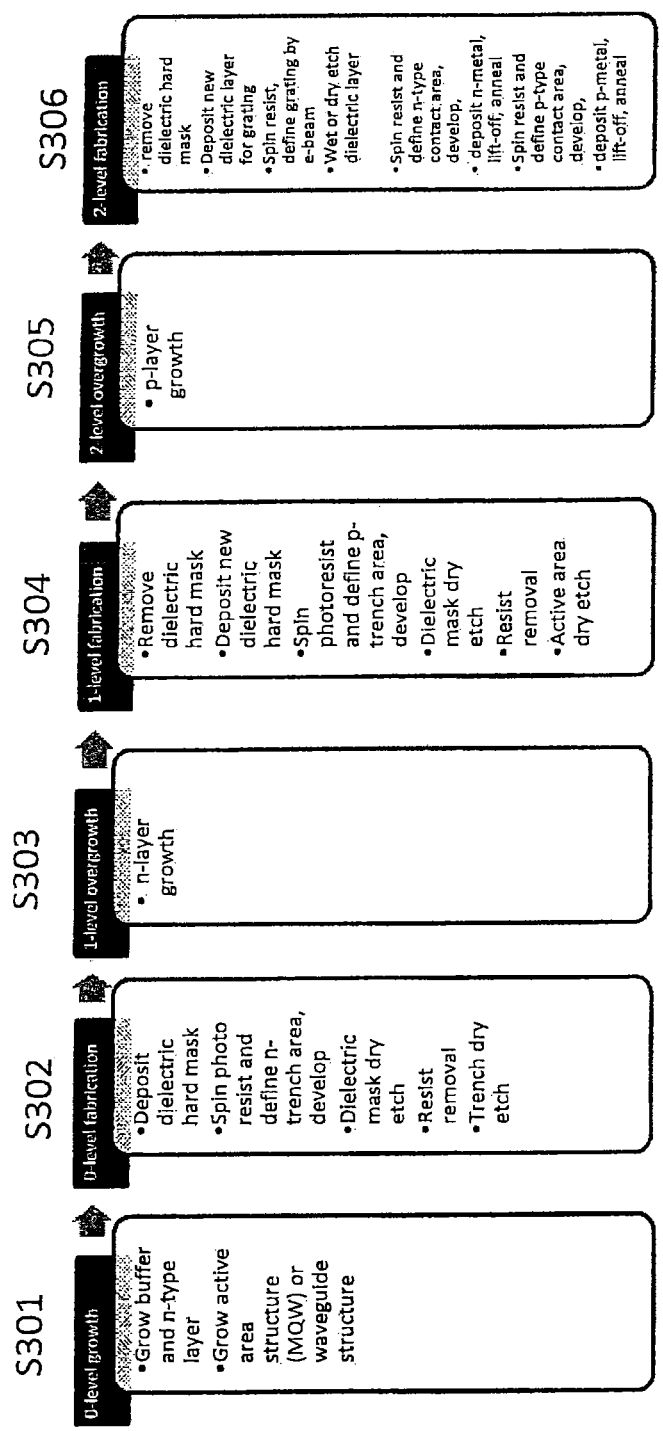
FIG. 26A shows a flow chart of a method of growth and fabrication of monolithically integrated master light source and slave light source in a lateral junction and a lateral combination, which is part of a method of fabricating an interference system in accordance with an embodiment.

FIG. 26A shows a flow chart of a method of growth and fabrication of monolithically integrated master light source 1804 and slave light source 1801 in a lateral junction which is part of a method of fabricating an interference system in accordance with an embodiment. The method can be used to fabricate an optical device having a master light source 1804 and a slave light source 1801 which are the same types in a lateral combination. The method may be used to fabricate a device such as described in relation to FIG. 27.

In devices fabricated by this method, both the master light source 1804 and the slave light source 1801 are integrated monolithically on a substrate, for example a Si—InP substrate. A Si—InP substrate is used to create a lateral junction, in which all the current flows between the lateral n- and p-contacts.

In step S301, a buffer layer 1951 is grown followed by an active area structure. In one embodiment, the buffer layer is 200 nm thick. In one embodiment, the buffer layer is semi insulating InP. The active area structure could comprise a multi quantum well (MQW) structure as described in relation to previous figures. This step is referred to as "0-level growth".

The sample is then taken out of the growth machine for step S302, "0-level fabrication". This involves deposition of a dielectric hard mask, which can be a $Si_3N_4$ or $SiO_2$ layer. The thickness of this dielectric layer may be dependent on the thickness of the active area grown and the dry etch selectivity. Next, a photo resist is spun and an n-trench area is defined by optical lithography. After development, the pattern defined in the resist is transferred to the dielectric layer, for example through dry etching based on $CF_4$ or $CHF_3$ chemistry. Next, the remaining resist on the surface is removed in resist remover solution or by $O_2$ plasma ashing. Next, a semiconductor dry etch is carried out. $Cl_2$ based chemistry may be used to provide good quality vertical sidewalls.

The sample is then ready for step S303, "1-level overgrowth". The dielectric hard mask is left on the area outside of the n-trench. This will provide selective area growth. The n-type layer 228 is grown in the n-trench and the etched area is planarized. The n-type layer 228 may be InP for example.

In step S304, "1-level fabrication" the dielectric hard mask is removed. This involves dipping the sample in HF or dry etching. At this point a new dielectric layer is deposited that will act as a new hard mask for dry etching. Again, the thickness of this layer may be dependent on the thickness of the active area grown and the dry etch selectivity. A photoresist is spun to define a p-trench area by optical lithography and developed. The pattern is transferred to dielectric layer by dry etching, for example based on $CHF_3$ or $CF_4$ chemistry. The resist is then removed, as before. The p-trench area is then dry etched based on $Cl_2$ chemistry.

Step S305, "2-level overgrowth" involves growing an epitaxial p-type layer 230 on top of the etched p-trench area. The p-type layer 230 may be InP for example. The dielectric layer left in previous growth steps enables selective area epitaxy.

Step S306, "2-level fabrication" involves removing the dielectric hard mask by HF dip or dry etching. For a DFB laser, a new dielectric layer is deposited which is then spun with resist and electron beam patterned with grating pattern. This is then dry or wet etched into the dielectric area.

In the final steps n- and p-type contacts are defined on top of the n- and p-type trenches respectively by optical lithography. Appropriate metals for n- and p-contacts are deposited, lifted off and annealed.

Similar devices can be fabricated in two independent runs, diced and then flip chip mounted and aligned on a foreign platform. For example, two InP-based lasers can be flip chip mounted onto a common Si carrier substrate.

Figure 26B:
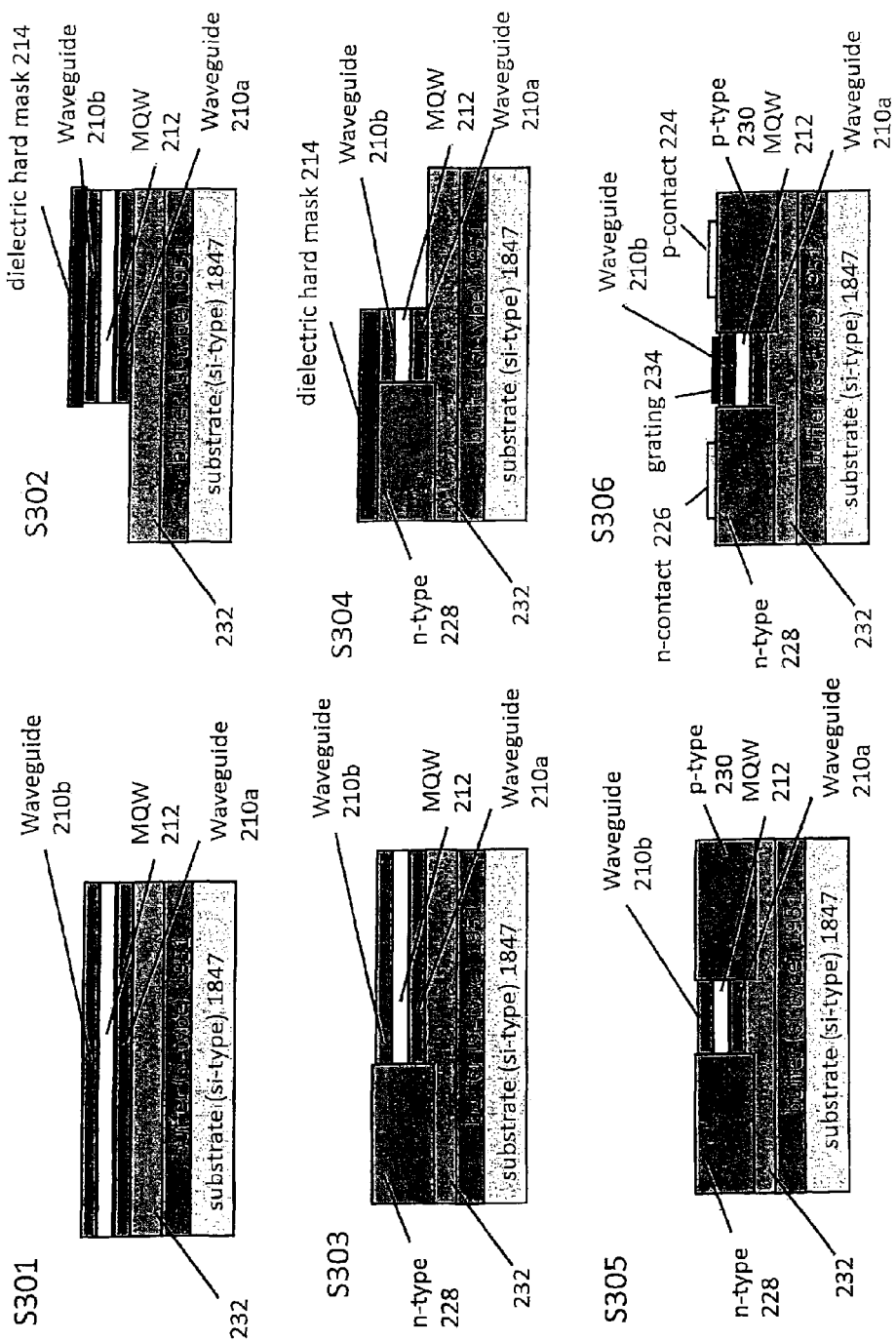
FIG. 26B shows the structure of the device after selected steps of the method of FIG. 26A, for an optical device having two DFB lasers.

FIG. 26B shows the structure of the sample after the steps of FIG. 26A, for an optical device having two DFB lasers.

After step S301, the sample comprises a substrate 1847, a buffer layer 1951 overlying and in contact with the substrate 1847, a layer 232 overlying and in contact with the buffer layer 1951, a first waveguide layer 210*a* overlying and in contact with the layer 232, an MQW layer 212 overlying and in contact with the first waveguide layer 210*a* and a second waveguide layer 210*b* overlying and in contact with the MQW layer 212.

After step S302, a plateau comprising the dielectric hard mask 214, second waveguide layer 210*b*, MQW layer 212 and first waveguide layer 210*a* is overlying and in contact with part of the layer 232.

After step S303, the n-type layer 228 is overlying and in contact with the layer 232, adjacent to the plateau, and the dielectric hard mask 214 has been removed.

After step S304, there is a plateau comprising the dielectric hard mask 214, overlying and in contact with the n-type layer 228 and the stack comprising the second waveguide layer 210*b*, MQW layer 212 and first waveguide layer 210*a*. The plateau is overlying and in contact with part of the layer 232.

After step S305, the n-type layer 228; stack comprising the second waveguide layer 210*b*, MQW layer 212 and first waveguide layer 210a; and the p-type layer 230 are overlying and in contact with the layer 232. The n-type layer 228 is adjacent to one side of the stack and the p-type layer 230 is adjacent to the opposite side of the stack.

After step S306, a grating is formed on the second waveguide layer 210b. A p-contact metal 224 is overlying and in contact with the p-type layer 230. An n-contact metal 226 is overlying and in contact with the n-type layer 228.

Figure 27:
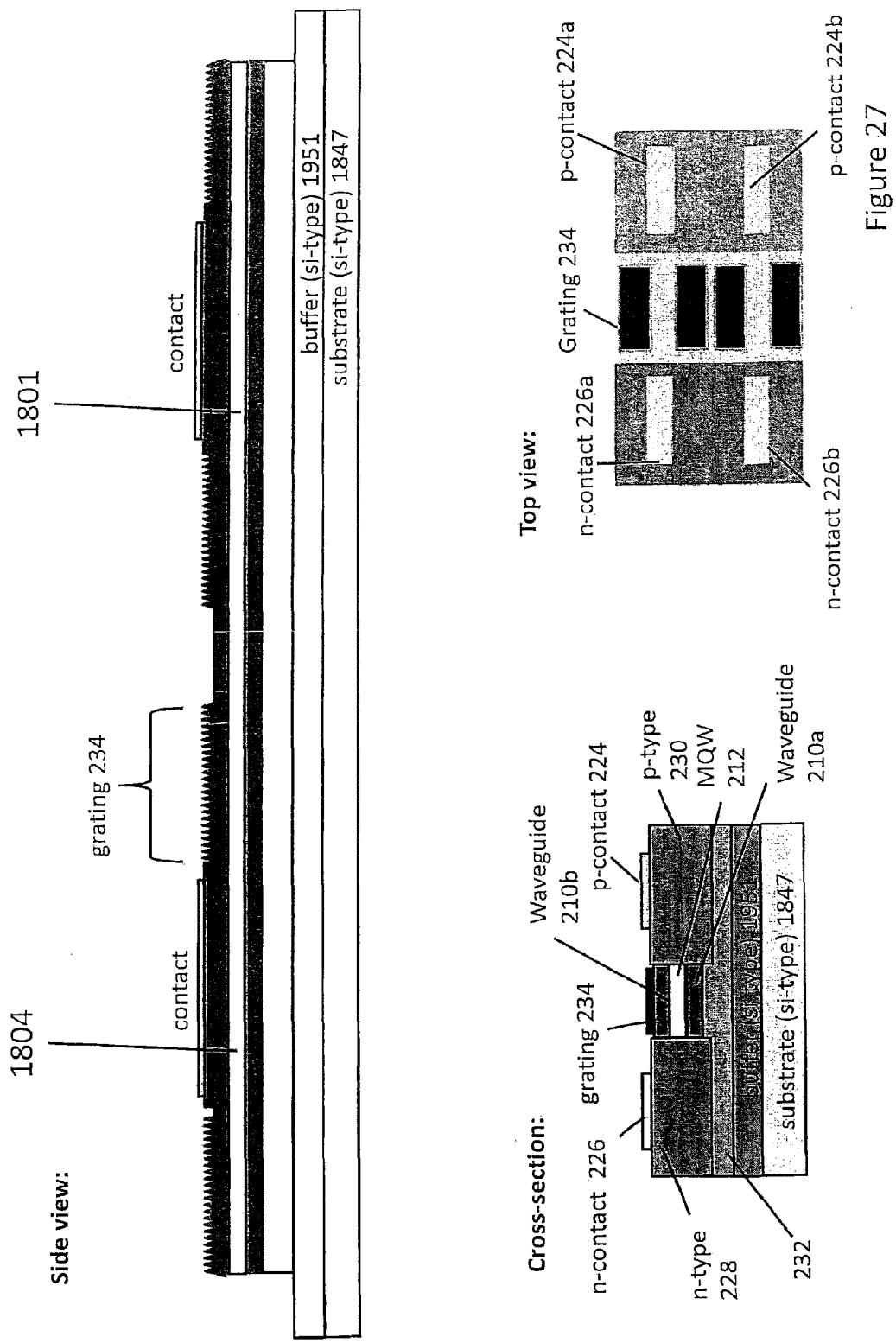
FIG. 27 shows a schematic illustration of a light source that is part of an interference system in accordance with an embodiment, in which the master light source and the slave light source are both DFB lasers, in a lateral junction and in a lateral combination.

FIG. 27 shows a schematic illustration of a light source that is part of an interference system in accordance with an embodiment, in which the master light source 1804 and the slave light source 1801 are both DBR lasers, in a lateral junction and in a lateral combination. Alternatively, the master light source 1804 and the slave light source 1801 could be DFB lasers. The figure shows a side view along the length of the device, i.e. along the direction along which light is emitted, a cross-section through a direction perpendicular to the direction along which light is emitted are shown, and a top view down on the device from above, i.e. in the stacking direction of the layers.

The device comprises a substrate 1847, a buffer layer 1951 overlying and in contact with the substrate 1847 and a layer 232 overlying and in contact with the buffer layer 1951. The layer 232 is an extension of the buffer layer. The n-type layer 228; stack comprising the second waveguide layer 210b, MQW layer 212 and first waveguide layer 210a; and the p-type layer 230 are overlying and in contact with the layer 232. The stack is between the n-type layer 228 and the p-type layer 230. The n-type layer 228 is adjacent to one side of the stack and the p-type layer 230 is adjacent to the opposite side of the stack. A p-contact metal 224 is overlying and in contact with the p-type layer 230. An n-contact metal 226 is overlying and in contact with the n-type layer 228.

As shown in the side view and top view, the MQW strip runs along the length of the device. A first p-contact 224a and n-contact 226a are on either side of part of the MQW strip in the direction perpendicular to the direction of emission of light. On either side of the part of the strip in the direction of the emission of light there is a diffraction grating in the second waveguide material. This forms the master light source 1804. A second p-contact 224b and n-contact 226b are on either side of a second part of the MQW strip in the direction perpendicular to the direction of emission of light, which is further along the length of the device from the master light source 1804. On either side of the second part of the strip in the direction of the emission of light, there is a diffraction grating in the second waveguide material. This forms the slave light source 1801.

The top view shows the first p-contact 224a on one side of the strip and the first n-contact 226a on the other side of the strip, in the direction perpendicular to the emission of light. These contacts form part of the master light source 1804. The second p-contact 224b on one side of the strip and the second n-contact 226b on the other side of the strip, in the direction perpendicular to the emission of light form the slave light source 1801.

A current is applied between the first p-contact 224a and the first n-contact 226a in order to generate light at the master light source. Light generated in the MQW strip of the master light source 1804 is emitted along the MQW layer. The light is laterally confined by the p-type layer 230 and the n-type layer 228, and vertically confined by the waveguide layers 210a and b. The light enters the MQW layer of the slave light source 1801. A time varying current is applied between the second p-contact 224b and the second n-contact 226b of the slave light source 1801.

Figure 28A:
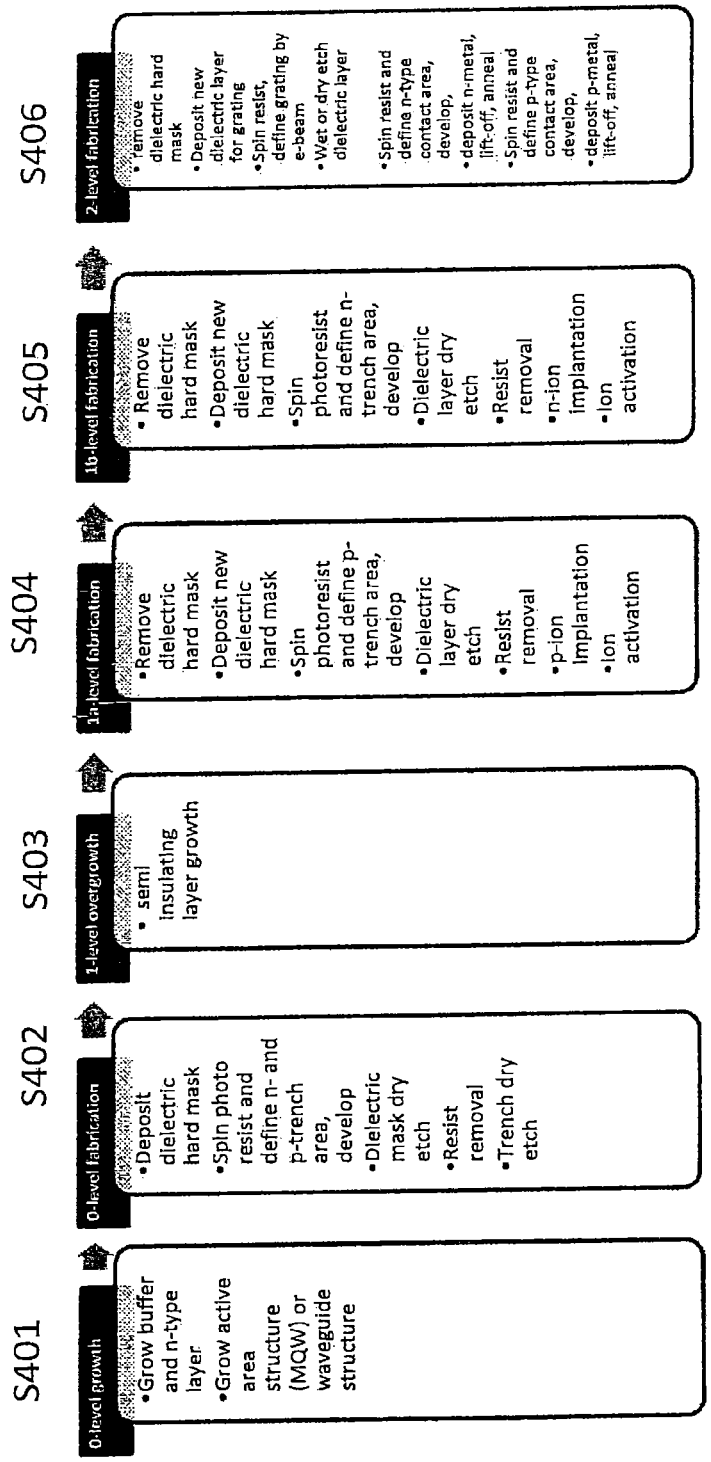
FIG. 28A shows a flow chart of a method of growth and fabrication of a monolithically integrated master light source and slave light source in a lateral junction via ion implantation, which is part of a method of fabricating an interference system in accordance with an embodiment.

FIG. 28A shows a flow chart of a method of growth and fabrication of a monolithically integrated master light source 1804 and slave light source 1801 in a lateral junction via ion implantation, which is part of a method of fabricating an interference system in accordance with an embodiment. The method can be used to fabricate an optical device having a master light source 1804 and a slave light source 1801 which are the same types in a lateral combination. The method may be used to fabricate a device such as described in relation to FIG. 29.

In a device fabricated by this method, both the master light source 1804 and slave light source 1801 devices are integrated monolithically on a substrate. In an embodiment, the substrate is Si—InP In step S401, a buffer layer is grown followed by an active area structure. In an embodiment, the buffer layer is 200 nm. In an embodiment, the buffer layer is Si—InP. The active area structure could be multi quantum well (MQW) structure as described in relation to FIG. 20 above. This step is referred to as "0-level growth".

The sample is then taken out of the growth machine for step S402, "0-level fabrication". This involves deposition of a dielectric hard mask, which could be a $Si_3N_4$ or $SiO_2$ layer for example. The thickness of this layer may be dependent on the thickness of the active area grown and the dry etch selectivity. Next, a photo resist is spun and the n- and p-trench areas are defined by optical lithography. After development, the pattern defined in the resist is transferred to the dielectric layer through dry etching, based on $CF_4$ or $CHF_3$ chemistry for example. Next, the remaining resist on the surface is removed in a resist remover solution or by $O_2$ plasma ashing. Next, a semiconductor dry etch is carried out. $Cl_2$ based chemistry may be used to provide good quality vertical sidewalls. The depth of the etch may be dependent on the thickness of the active area.

The sample is then ready for step S403, "1-level overgrowth". The dielectric hard mask is left on the device area. This provides selective area growth. The semi insulating layer is grown and the etched area planarized. The semi-insulating layer may be InP for example.

In the step S404, "1a-level fabrication", the dielectric hard mask is removed. This involves dipping the sample in HF or dry etching. At this point a new dielectric layer is deposited that will act as a new hard mask for dry etching. Again, the thickness of this layer may be dependent on the thickness of the active area grown and the dry etch selectivity. A photoresist is spun to define a p-trench area by optical lithography and developed. The pattern is transferred to the dielectric layer by dry etching based on $CHF_3$ or $CF_4$ chemistry. This is selective area etch of the dielectric mask. The resist is then removed. The p-trench area is then implanted with ions which are then activated to create p-doping in the semi insulating layer. Wherever the mask is removed the ions are implanted into the semi-insulating layer. Where the mask remains, the ions will not be implanted.

In the step S405, "1b-level fabrication" the dielectric hard mask is removed. This involves dipping the sample in HF or dry etching. At this point a new dielectric layer is deposited that will act as a new hard mask for dry etching. Again, the thickness of this layer may be dependent on the thickness of the active area grown and dry etch selectivity. A photoresist is spun to define an n-trench area by optical lithography and developed. The pattern is transferred to dielectric layer by dry etching based on $CHF_3$ or $CF_4$ chemistry. The resist is then removed. The n-trench area is then implanted with ions which are then activated to create n-doping in the semi insulating layer.

Step S406, "2-level fabrication", involves removing the dielectric hard mask by HF dip or dry etching. For fabrication of a DFB laser, a new dielectric layer is deposited which is then spun with resist and electron beam patterned with a grating pattern. This is then dry or wet etched into the dielectric area.

In the final steps n- and p-type contacts are defined on top of n- and p-type trenches accordingly by optical lithography. Appropriate metals for n- and p-contacts are deposited, lifted off and annealed.

Similar devices can be fabricated in two independent runs, diced and then flip chip mounted and aligned on a foreign platform. For example two InP-based lasers can be flip chip mounted on a common Si carrier substrate.

Figure 28B:
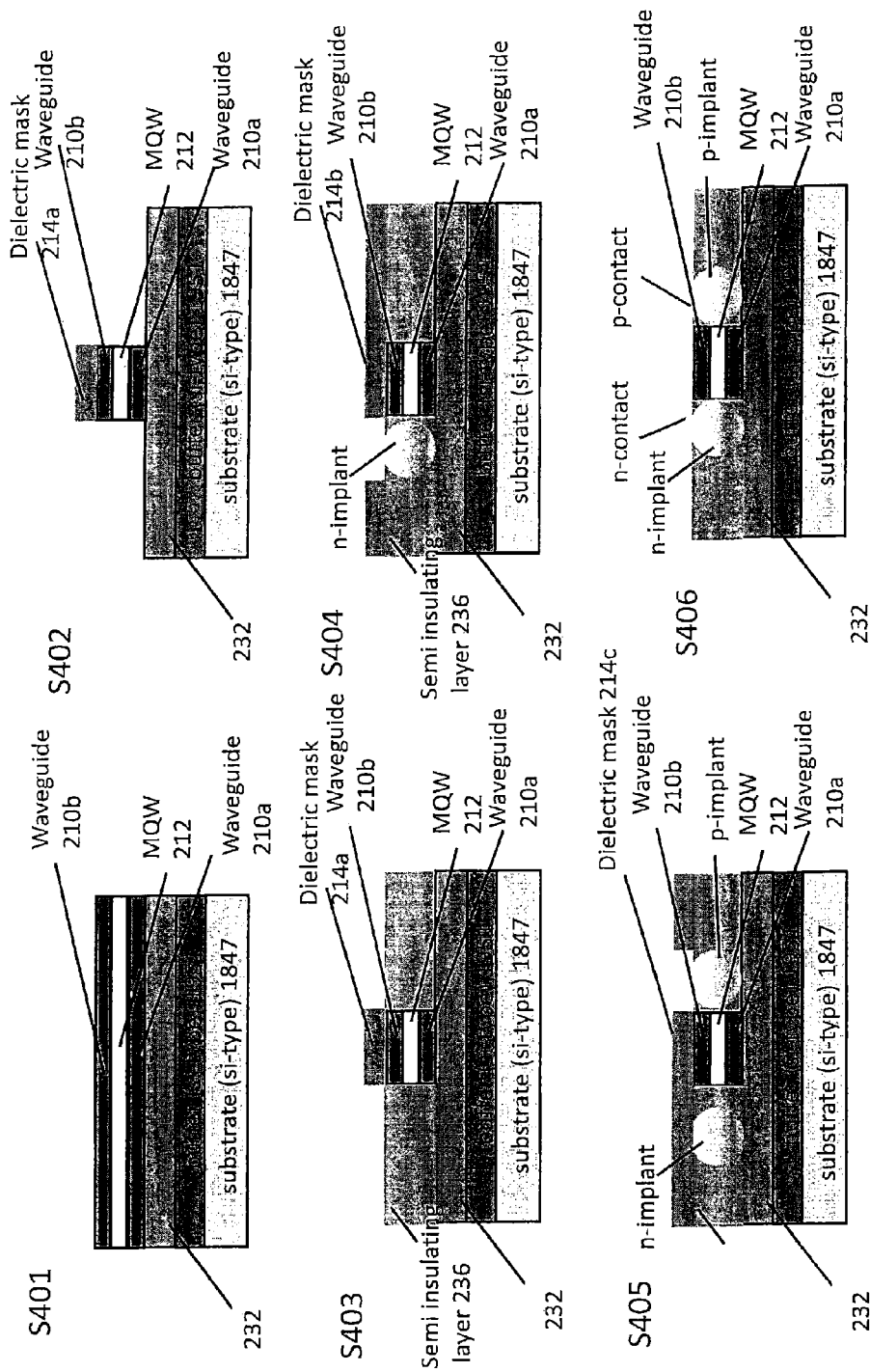
FIG. 28B shows the structure of the device after selected steps of the method of FIG. 28A.

FIG. 28B shows the fabrication stages of the method described in relation to FIG. 28A.

After step S401, the sample comprises a substrate 1847, a buffer layer 1951 overlying and in contact with the substrate 1847, an layer 232 overlying and in contact with the buffer layer 1951, a first waveguide layer 210a overlying and in contact with layer 232, an MQW layer 212 overlying and in contact with the first waveguide layer 210a and a second waveguide layer 210b overlying and in contact with the MQW layer 212.

After step S402, the dielectric hard mask 214a, second waveguide layer 210b, MQW layer 212 and first waveguide layer 210a are a ridge which is overlying and in contact with the layer 232.

After step S403, the semi-insulating layer 236 is overlying and in contact with the layer 232 either side of the ridge.

After step S404, a second dielectric hard mask 214b is overlying and in contact with the ridge, the semi-insulating layer 236 on one side of the ridge and part of the semi-insulating layer 236 on the other side of the ridge. There is a region of n-doping in the part of the semi-insulating layer 236 not under the dielectric hard mask 214b.

After step S405, a third dielectric hard mask 214b is overlying and in contact with the ridge, the semi-insulating layer 236 with the n-doping region on one side of the ridge and part of the semi-insulating layer 236 on the other side of the ridge. There is a region of p-doping in the part of the semi-insulating layer 236 not under the dielectric hard mask 214c.

After step S406, a p-type contact is overlying and in contact with the p-doping region in the semi-insulating layer 236. An n-contact is overlying and in contact with the n-doping region in the semi-insulating layer 236.

Figure 29:
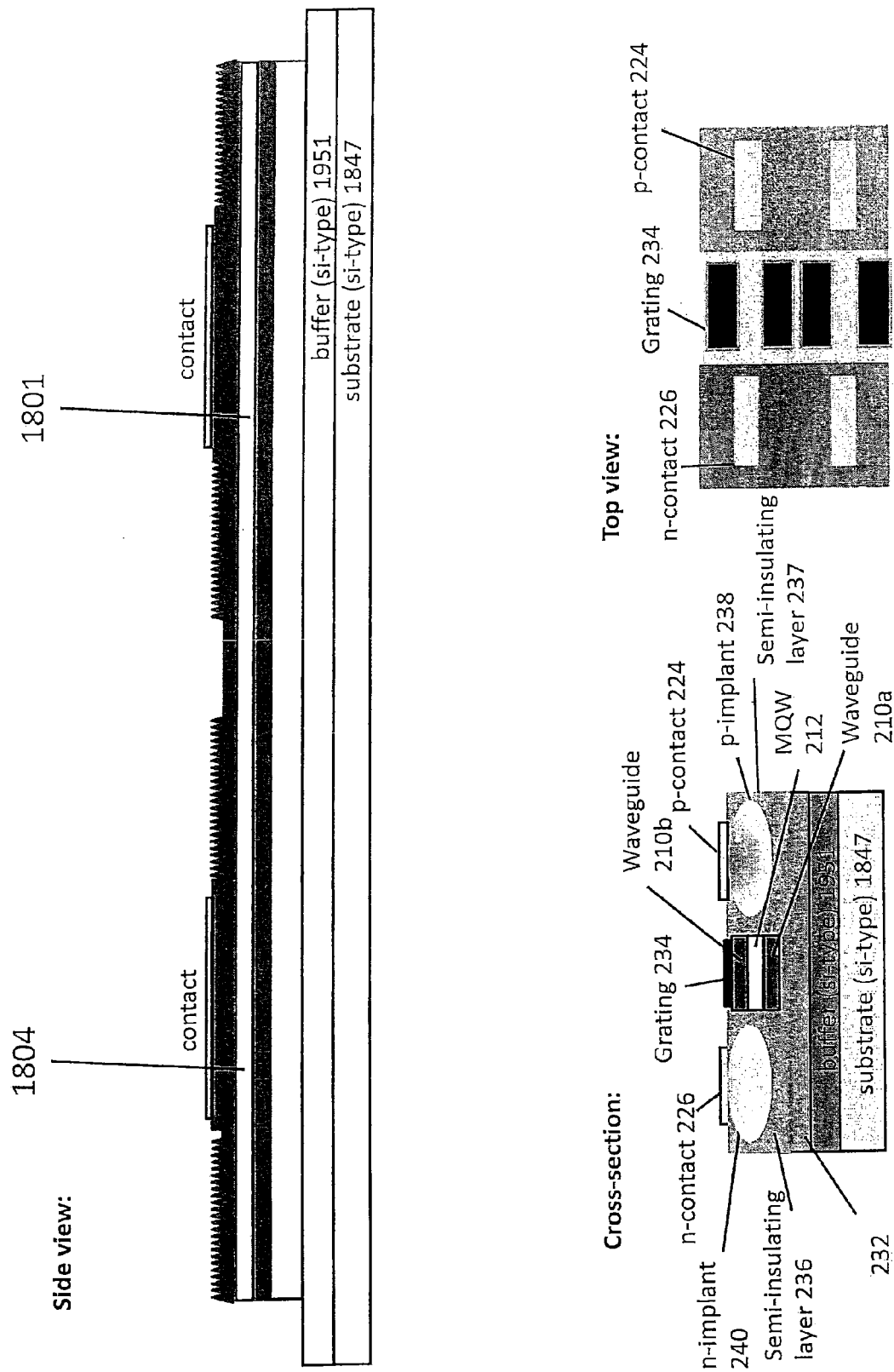
FIG. 29 shows a schematic illustration of a light source that is part of an interference system in accordance with an embodiment, in which the master light source and the slave light source are both DFB lasers, in a lateral junction and in a lateral combination and fabricated via ion implantation.

FIG. 29 shows a schematic illustration of a light source that is part of an interference system in accordance with an embodiment, in which the master light source 1804 and the slave light source 1801 are both DBR lasers, in a lateral junction and in a lateral combination and fabricated via ion implantation. Alternatively, the master light source 1804 and the slave light source 1801 could be DFB lasers. The figure shows a side view along the length of the device, i.e. along the direction along which light is emitted, a cross-section through a direction perpendicular to the direction along which light is emitted are shown and a top view down on the device from above, i.e. in the stacking direction of the layers.

The device comprises a substrate 1847, a buffer layer 1951 overlying and in contact with the substrate 1847 and a layer 232 overlying and in contact with the buffer layer 1951. A semi-insulating layer 237; stack comprising the second waveguide layer 210b, MQW layer 212 and first waveguide layer 210a; and the semi-insulating layer 237 are overlying and in contact with the layer 232. The stack is between the semi-insulating layer 236 and the semi-insulating layer 237. The semi-insulating layer 236 is adjacent to one side of the stack and the semi-insulating layer 237 is adjacent to the opposite side of the stack. The semi-insulating layer 236 comprises n-implant region 240 and the semi-insulating layer 237 comprises p-implant region 238. A p-contact metal 224 is overlying and in contact with the semi-insulating layer 237. An n-contact metal 226 is overlying and in contact with the semi-insulating layer 236.

As shown in the side view and top view, the MQW strip runs along the length of the device. A first p-contact 224a and n-contact 226a are on either side of part of the MQW strip in the direction perpendicular to the direction of emission of light. On either side of the part of the strip in the direction of the emission of light there is a diffraction grating in the second waveguide material. This forms the master light source 1804. A second p-contact 224b and n-contact 226b are on either side of a second part of the MQW strip in the direction perpendicular to the direction of emission of light, which is further along the length of the device from the master light source 1804. On either side of the second part of the strip in the direction of the emission of light, there is a diffraction grating in the second waveguide material. This forms the slave light source 1801.

The top view shows the p-contact 224a on one side of the strip and the n-contact 226a on the other side of the strip, in the direction perpendicular to the emission of light. These contacts form part of the master light source 1804. The p-contact 224b on one side of the strip and the n-contact 226b on the other side of the strip, in the direction perpendicular to the emission of light form the slave light source 1801.

A current is applied between the first p-contact 224a and the first n-contact 226a in order to generate light at the master light source 1804. Light generated in the MQW strip of the master light source 1804 is emitted along the MQW layer. The light is laterally confined by the semi-insulating layers 236 and 237, and vertically confined by the waveguide layers 210a and b. The light enters the MQW layer of the slave light source 1801. A time varying current is applied between the second p-contact 224b and the second n-contact 226b of the slave light source 1801.

Figure 30:
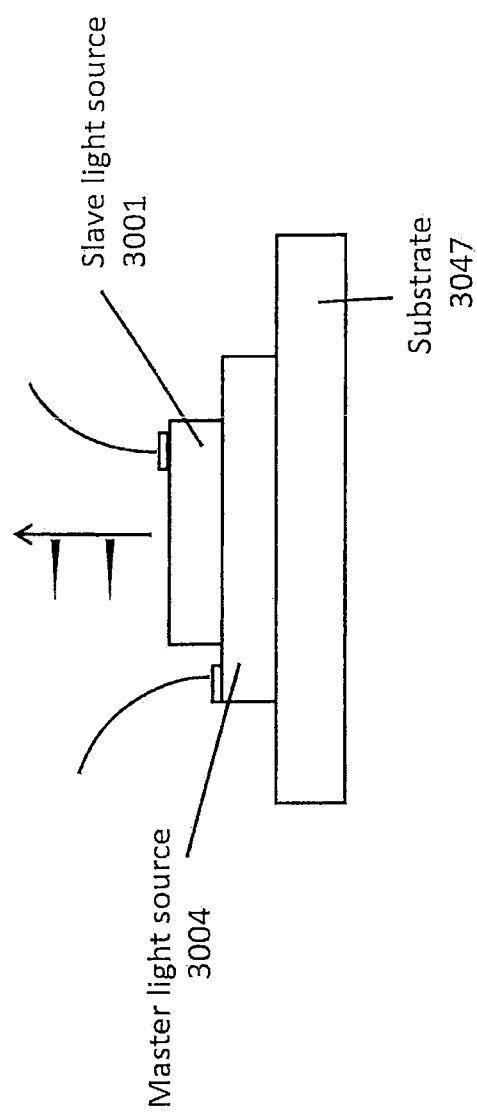
FIG. 30 shows a schematic illustration of a light source that is part of an interference system in accordance with an embodiment, in which a master light source and a slave light source are integrated on a substrate in a vertical combination.

FIG. 30 shows a schematic illustration of a light source that is part of an interference system in accordance with an embodiment, in which a master light source 3004 and a slave light source 3001 are integrated on a substrate 3047. The master light source 3004 and the slave light source 3001 are vertical cavity lasers. Light is emitted in a direction out of the plane of the layers, i.e. in a direction parallel to the stacking direction of the layers.

The optical device may optionally comprise a tuning element also integrated onto the substrate 3047. The tuning element may be arranged between the master light source 3004 and the slave light source 3001.

The master light source 3004 and the slave light source 3001 are integrated onto a first surface of the substrate 3047. The master light source 3004 and the slave light source 3001 are arranged relative to each other in a second plane which is substantially perpendicular to the first surface of the substrate 3047. Light is emitted from the master light source 3004 and the slave light source 3001 in the second plane. The master light source 3004 and the slave light source 3001 are configured such that light emitted from the master light source 3004 enters an aperture of the slave light source 3001. The slave light source 3001 is stacked on top of the master light source 3004, in other words, the master light source 3004 is between the slave light source 3001 and the substrate 3047.

A structure such as shown in FIG. 30 can be grown by MOVPE. MOVPE is suitable due to the multiple overgrowth steps in the process. The device can be grown using a monolithically integrated approach.

In one embodiment, the substrate is InP.

One or more electrical contacts may be formed to the master light source 3004 and the slave light source 3001. AuGeNi may be used as an n-type contact metal and the p-contact metal may be any one of PdZnAu, AuCrAuZnAu or AuBe. An n-type electrode is formed comprising an n-contact and a p-type electrode is formed comprising a p-contact.

Wet etching of InP based materials can be performed using $Cl_2$ based etching at high temperatures diluted with Ar or $N_2$, $CH_4$ based etching or $SiCl_4Ar$ based etching. Dielectric dry etching may be performed using $CHF_3$ or $CF_4$ based chemistry, with a dielectric hard mask formed using $Si_3N_4$ or $SiO_2$. Further details of methods of device fabrication are described below.

Various lateral shapes of the master light source 3004 and the slave light source 3001 can be formed. The cross-section of the master light source 3004 and the slave light source 3001 may be circular for example.

The optical device may comprise an integrated heat sink, which may be synthetic diamond for example.

In one embodiment, either or both of the master light source 3004, and the slave light source 3001, are VCSELs.

The lasers may comprise grating. The grating region may be separate from the active region or the active region may comprise the grating. A laser where the active region and grating are separate is referred to as DBR (distributed Bragg reflector) laser. A VCSEL is a type of DBR laser.

Figure 31A:
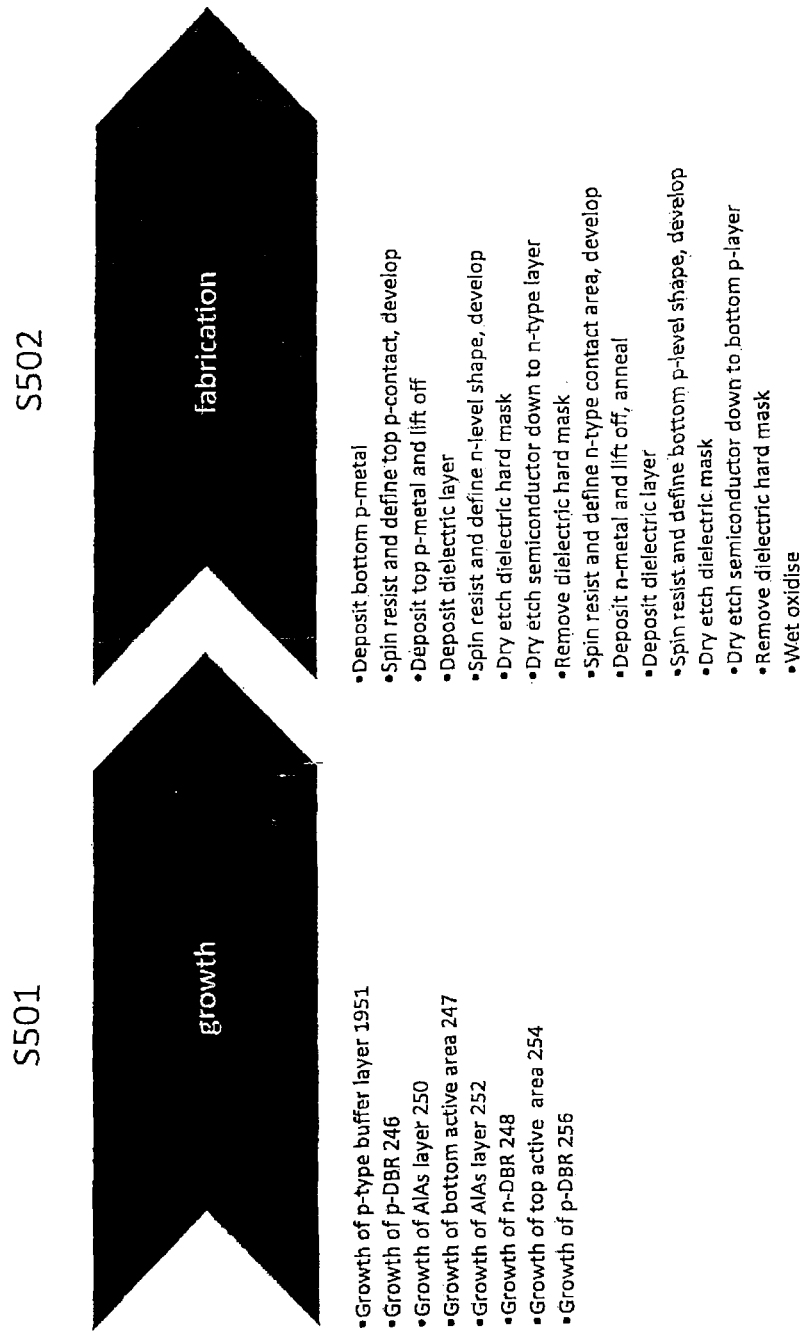
FIG. 31A shows a flow chart of a method of growth and fabrication of monolithically integrated master light source and slave light source in a vertical junction, which is part of a method of fabricating an interference system in accordance with an embodiment.

FIG. 31A shows a flow chart of a method of growth and fabrication of monolithically integrated master light source 3004 and slave light source 3001 in a vertical junction, which is part of a method of fabricating an interference system in accordance with an embodiment. The method can be used to fabricate an optical device having a master light source and a gain switched laser which are both VCSELs, in a vertical combination. The method may be used to fabricate a device such as described in relation to FIG. 32, in which the slave light source 3001 is stacked vertically on top of the master light source 3004.

The device is monolithically grown in step S501. The growth phase, step S501, is completed before any fabrication starts in step S502.

In an embodiment, the substrate 3047 is p-type InP. The substrate 3047 is overgrown with a buffer layer. In an embodiment, the buffer layer is 200 nm thick. In an embodiment, the buffer layer is a p-type layer. Then a p-doped distributed Bragg reflector (DBR) 246 is grown. The DBR 246 comprises multiple layers of alternating materials with varying refractive index. The materials may be InP/AlInGaAs, InP/InGaAsP or AlInGaAs/AlInAs, all being lattice matched to InP for example. As the DBR 246 is located at the "bottom" of the device, i.e. closest to the substrate 3047, in one embodiment it is configured to have greater than 95% reflectivity. A layer 250 of high Al content material is then grown. In one embodiment, the material has an Al content of greater than 60%. This material may be AlAs for example. A bottom active area 247 layer is then grown. The bottom active area 247 may comprise a MQW structure. A second layer 252 of high Al content material is then grown. Next, an n-type DBR 248 is grown. This n-DBR 248 is less reflective than bottom p-DBR 246. The bottom active area 247 is thus separated from the DBRs by two layers of high Al content material, for example AlAs, 250 and 252, that will be used for selective area oxidation during processing. Next, the top active area 254 followed by p-type DBR 256, which has the lowest reflectivity, are grown.

In an embodiment, the reflectivity relation for the three DBRs follows the relation below:

$$R(\text{bottom } p\text{-DBR } 246) > R(n\text{-DBR } 248) > R(\text{top } p\text{-DBR } 256)$$

The fabrication step S502 starts with deposition of the p-type contact 260 at the back of the wafer, i.e. on the opposite side of the substrate 3047 to the buffer layer 1951. Then the resist is spun on top of the wafer to define optically the top p-type contact 261. After resist development, p-metal is deposited and lifted off. The top p-contact 261 is on the p-DBR layer 256. Then both p-type contacts are annealed at the same time.

Then a dielectric layer is deposited, which can be a $Si_3N_4$ or $SiO_2$ layer for example. This layer acts as a hard mask for etching. Next, an optical resist is spun to define the top shape/size of the device. After development the hard mask is etched based on $CHF_3$ or $CF_4$ chemistry for example. The remaining resist is then removed, in resist remover solution for example. The semiconductor wafer is then etched down to a depth x. The depth x is below the top active area 254, and above the bottom of the n-DBR layer 248. In other words, the wafer is etched down to part way through the n-DBR layer 248. The etching may be based on $Cl_2$-chemistry. The dielectric mask is then removed by HF for example.

An optical resist is then spun, and an n-type contact area is defined and developed. Next the n-metal is deposited, lifted off and annealed. The n-contact 262 is on the etched surface of the n-DBR layer 248.

Next, another dielectric layer is deposited, which could be a $Si_3N_4$ or $SiO_2$ layer for example. The dielectric layer acts as a hard mask for etching. The optical resist is spun and the bottom level shape is defined. After development the dielectric mask is dry etched followed by a semiconductor etch down to partway through the bottom p-DBR 246. This is a depth y from the point x. The dielectric hard mask is then removed. This etch is performed to create a flat surface to make an n-contact to layer 248.

The sample is then wet oxidised. This process turns AlAs selective wet oxidation areas into dielectric layers which restrict current flow through the device. A wet furnace may be used in order to oxidise the sample. The AlAs layers are oxidised from the lateral sides progressively inwardly through the device. The process duration controls the size of the ring of oxidised material.

Figure 31B:
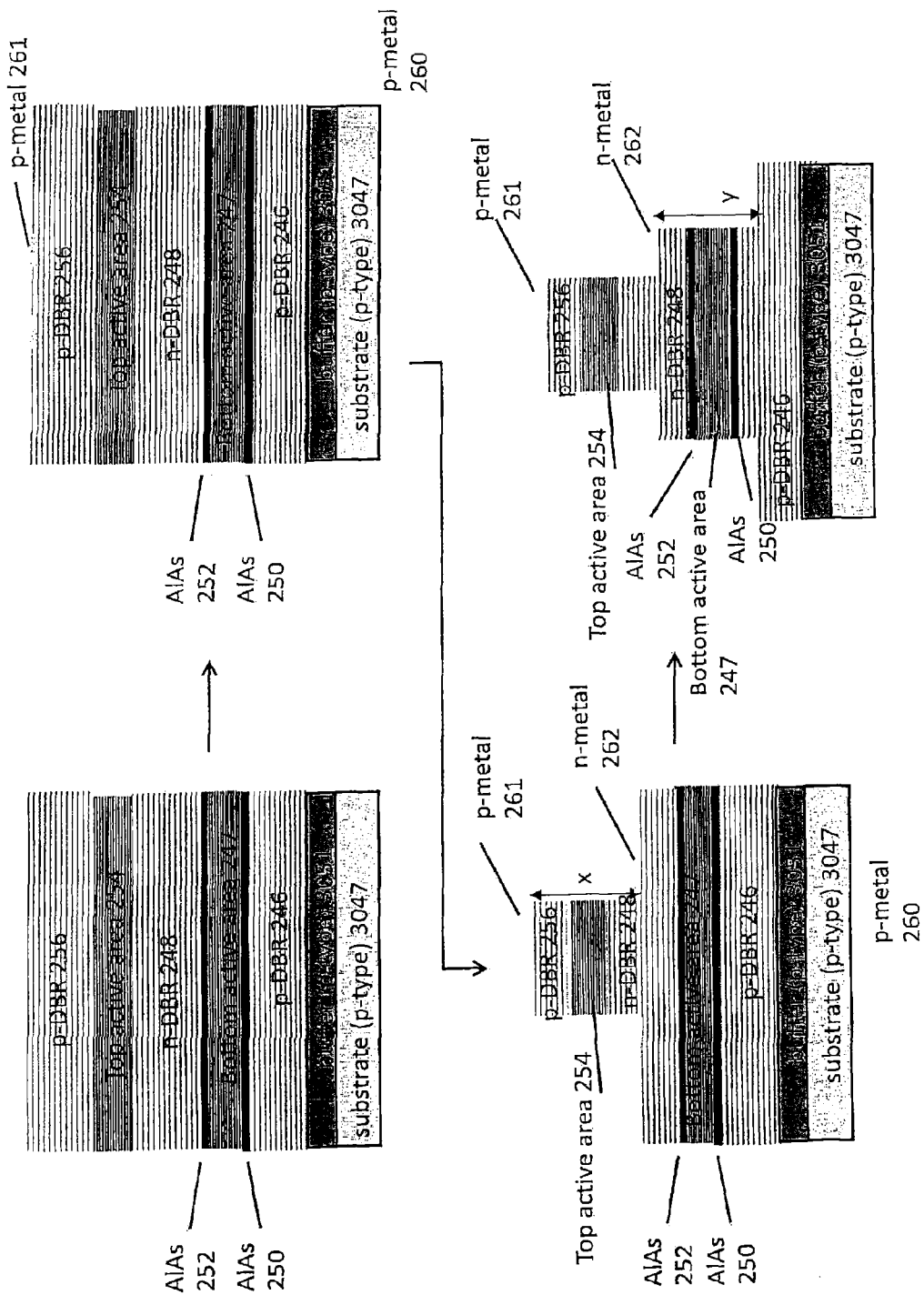
FIG. 31B shows the structure of the sample after selected steps of the method of FIG. 31A, for an optical device having two VCSEL lasers.

FIG. 31B shows the structure of the sample after the steps of FIG. 31A, for an optical device having two VCSEL lasers.

After step S501, the sample comprises a substrate 3047, a buffer layer 1951 overlying and in contact with the substrate 3047, p-DBR 246 overlying and in contact with the buffer layer 1951, an AlAs layer 250, overlying and in contact with the p-DBR 246, a bottom active layer 247 overlying and in contact with the AlAs layer 250, an AlAs layer 252 overlying and in contact with the bottom active layer 247, an n-DBR 248 overlying and in contact with the AlAs layer 252, a top active layer 254 overlying and in contact with the AlAs layer 252, and a p-DBR 256 overlying and in contact with the top active layer 254.

The next figure shows the device after the p-contacts 260 and 261 have been deposited. There is a p-metal contact 260 in contact with the opposite surface of the substrate 3047 to the buffer layer 1951, and two further p-metal contacts 261 overlying and in contact with the p-DBR 256.

The next figure shows the device after etching to the depth x and deposition of the n-contacts. There is a ridge formed by the p-DBR 256, top active area 254 and part of the n-DBR. Two n-metal contacts 262 are in contact with the surface of the n-DBR 248 either side of the ridge.

The next figure shows the device after etching to the depth y and oxidation of the AlAs layers 250 and 252. The device has a "stepped" shape, with the substrate 3047, buffer layer 1951 and part of the p-DBR layer 246 forming a first "step" of the device, the other part of the p-DBR layer 246, AlAs layer 250, bottom active layer 247 and part of the n-DBR layer 248 forming a second "step" of the device, and the other part of the n-DBR layer 248, top active area 254 and p-DBR 256 forming a third "step" of the device.

Figure 32:
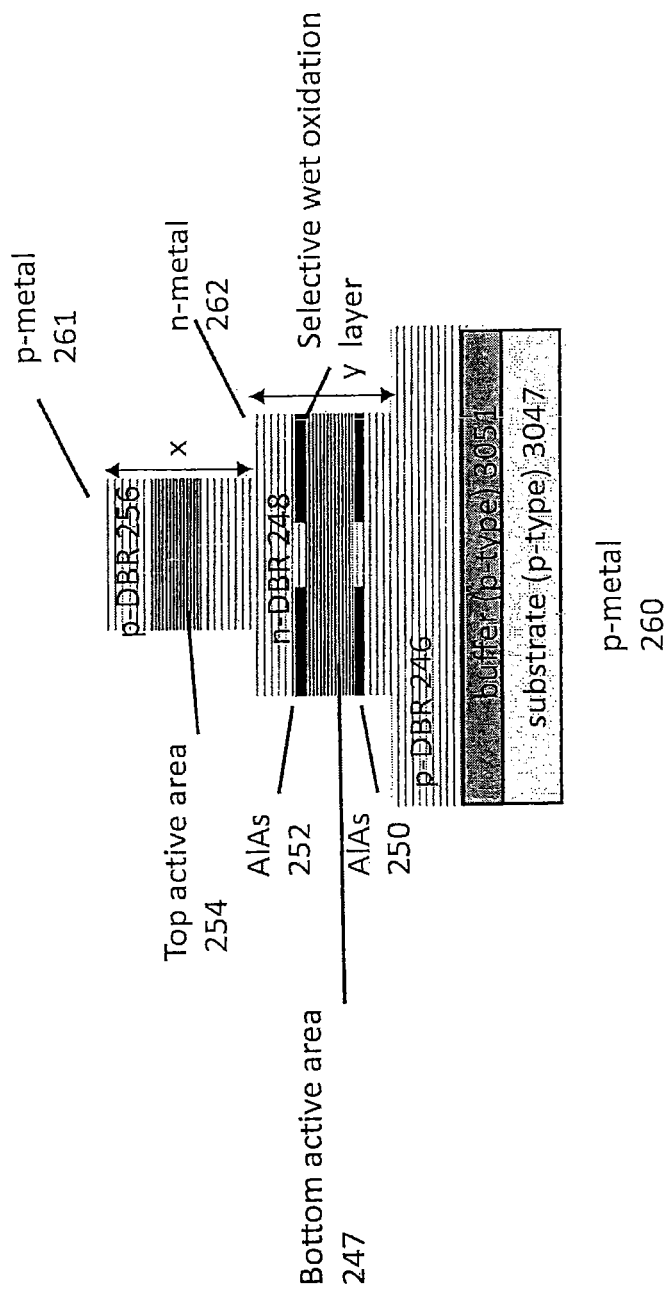
FIG. 32 shows a schematic illustration of a light source that is part of an interference system in accordance with an embodiment, in which the master light source and the slave light source are both VCSELs, in a vertical junction and in a vertical combination.

FIG. 32 shows a schematic illustration of a light source that is part of an interference system in accordance with an embodiment, in which the master light source 3004 and the slave light source 3001 are both VCSELs, in a vertical junction and in a vertical combination. The figure shows a cross-section through the layers.

The device comprises a substrate 3047, a buffer layer 1951 overlying and in contact with the substrate 3047, p-DBR 246 overlying and in contact with the buffer layer 1951, an AlAs layer 250, overlying and in contact with the p-DBR 246, a bottom active layer 247 overlying and in contact with the AlAs layer 250, an AlAs layer 252 overlying and in contact with the bottom active layer 247, an n-DBR 248 overlying and in contact with the AlAs layer 252, a top active layer 254 overlying and in contact with the AlAs layer 252, and a p-DBR 256 overlying and in contact with the top active layer 254.

There is a p-metal contact 260 in contact with the opposite surface of the substrate 3047 to the buffer layer 1951, and two further p-metal contacts 261 overlying and in contact with the p-DBR 256.

The device has a "stepped" shape, with the substrate 3047, buffer layer 1951 and part of the p-DBR layer 246 forming a first "step" of the device, the other part of the p-DBR layer 246, AlAs layer 250, bottom active layer 247 and part of the n-DBR layer 248 forming a second "step" of the device, and the other part of the n-DBR layer 248, top active area 254 and p-DBR 256 forming a third "step" of the device. Two n-metal contacts 262 are in contact with the surface of the n-DBR 248 either side of the third step.

A current is applied between the p-contact 260 and the n-contact 262 in order to generate light at the master light source 3004. Light generated in the bottom active area 247 of the master light source 3004 is emitted in the stacking direction of the layers, thorough the n-DBR layer 248. The light enters the top active area 254 of the slave light source 3001. A time varying current is applied between the p-contact 261 and the n-contact 262 of the slave light source 3001. The light is laterally confined by the oxidised AlAs layers 250 and 252.

Figure 33:
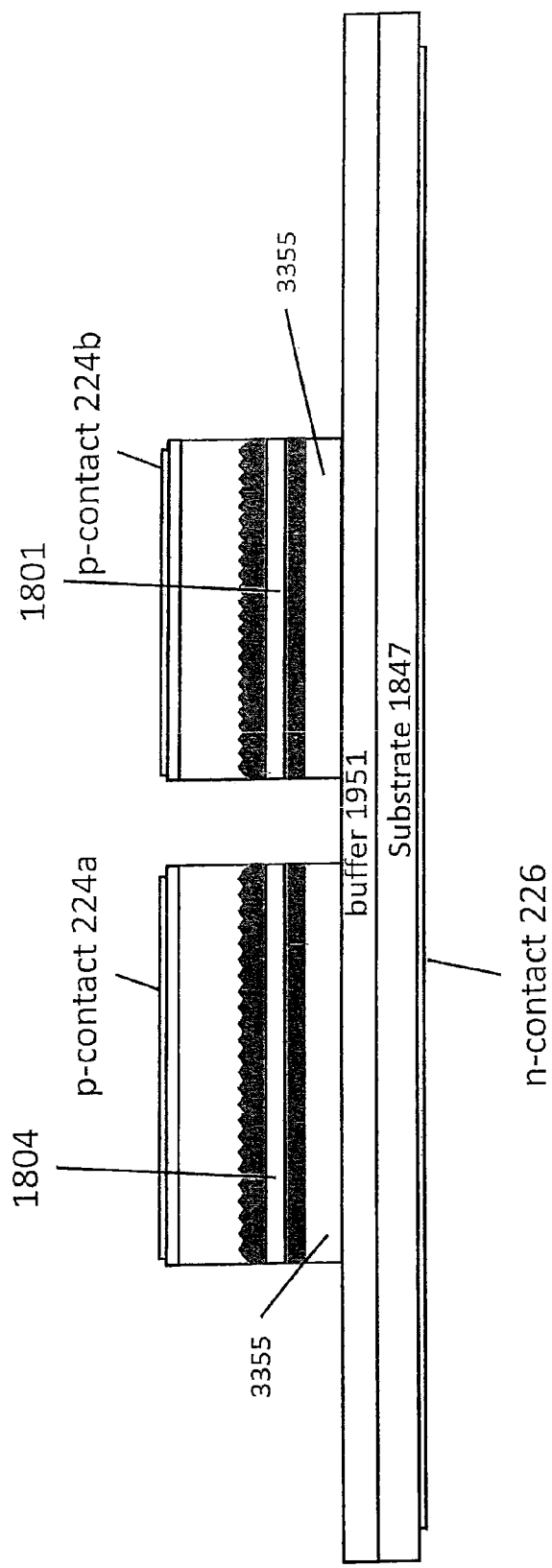
FIG. 33 shows a schematic illustration of a light source that is part of an interference system in accordance with an embodiment, in which the master light source and the slave light source are in a lateral combination and are separate chips flip-chip bonded to a common substrate.

FIG. 33 shows a schematic illustration of a light source that is part of an interference system in accordance with an embodiment, in which the master light source 1804 and the slave light source 1801 are in a lateral combination and are separate chips flip-chip bonded to a common substrate 1847.

In this case, the master light source 1804 and slave light source 1801 are DFB lasers. However, one or more of the master light source 1804 and slave light source 1801 may be a stripe laser for example.

The master light source 1804 is fabricated as described in relation to FIG. 19A above. The diffraction grating is configured such that a single DFB laser is formed, as opposed to two lasers. The master light source 1804 may be formed on an InP substrate for example. The slave light source 1801 is fabricated separately, again as described in relation to FIG. 19A above. The diffraction grating is again configured such that a single DFB laser is formed, as opposed to two lasers. The slave light source 1801 may also be formed on an InP substrate for example. The result of these processes is two separate InP based DFB lasers.

Each DFB laser is then diced and flip chip mounted and aligned on a foreign platform. The foreign platform may be a Si substrate. Each DFB laser wafer is diced and each individual DFB laser is placed on a foreign substrate. The DFB lasers are aligned accurately. The devices are then thermally or pressure bonded to the platform. Adhesion can be provided by a metal layer for example, using metal to metal bonding.

The figure shows a side view along the length of the device, i.e. along the direction along which light is emitted.

The device comprises a substrate 1847. On one surface of the substrate is an n-contact 226. Overlying and in contact with the opposite surface to the substrate 1847 is the buffer layer 1951. Overlying and in contact with the buffer layer 1951 is the master light source 1804 and the slave light source 1801. The layers 3355 at the surface of the master light source 1804 and slave light source 1801 overlying and in contact with the buffer layer 1951 are InP.

As shown in the side view, there is a gap between the master light source 1804 and the slave light source 1801. The gap may extend across the entire device in the direction perpendicular to the direction in which light is emitted. The gap extends down to the buffer layer 1951.

A current is applied between the p-contact 224a over the master light source 1804 and the n-contact 226 in order to generate light. Light generated in the MQW strip of the master light source 1804 is emitted along the MQW layer. The light is vertically confined by the waveguide layers 210a and b. Light travels between the master light source 1804 and the slave light source 1801 though free space in the gap. The light enters the MQW layer of the slave light source 1801. A time varying current is applied between the p-contact 224b slave light source 1801 and the n-contact 226.

Figure 34:
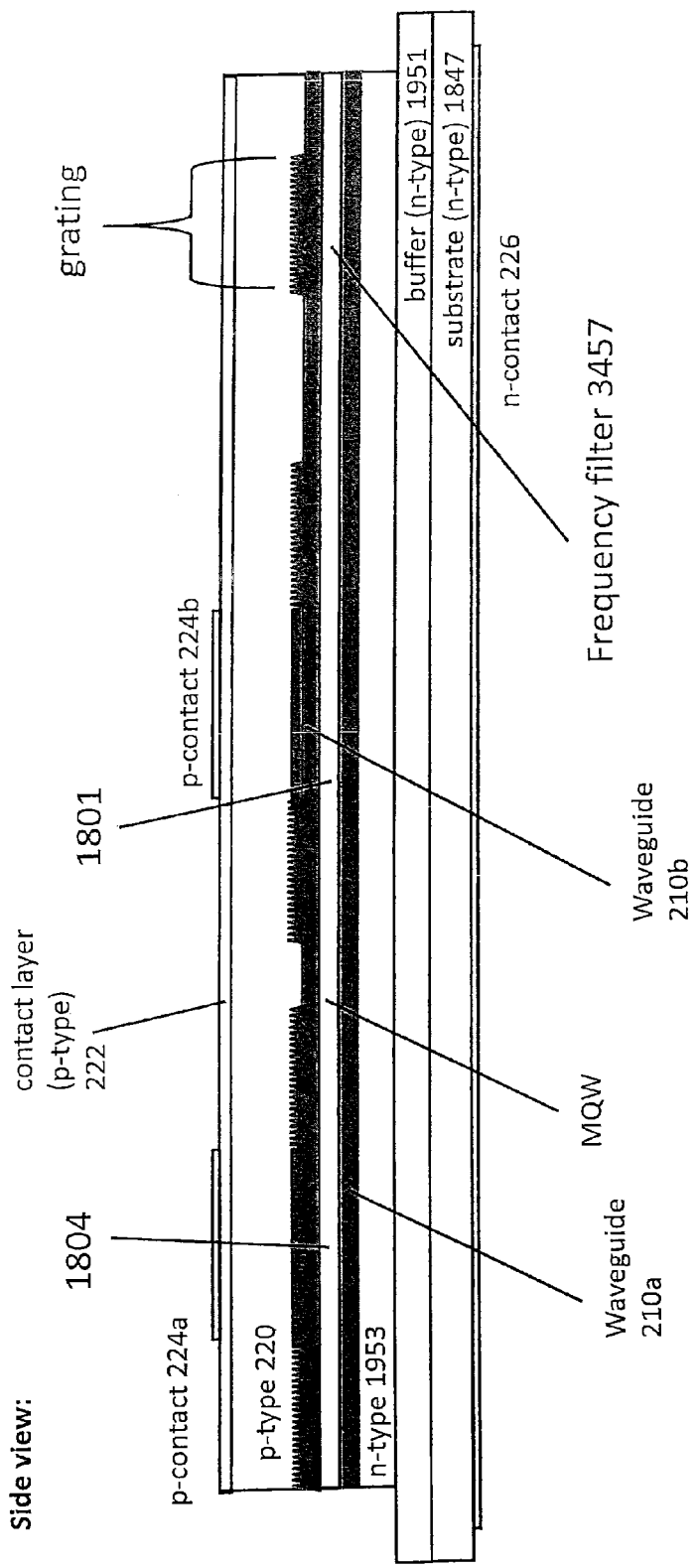
FIG. 34 shows a schematic illustration of a light source that is part of an interference system in accordance with an embodiment, in which the master light source and the slave light source are both DFB lasers, in a vertical junction and in a lateral combination, and comprising a frequency filter also integrated onto the substrate.

FIG. 34 shows a schematic illustration of a light source that is part of an interference system in accordance with an embodiment, comprising a frequency filter 3457, as described in relation to FIG. 8 for example.

In the device shown in FIG. 34, the master light source 1804 and the slave light source 1801 are both DBR lasers, in a vertical junction and in a lateral combination, as described in relation to FIG. 20 for example. However, a frequency filter 3457 as shown can be combined with any of the devices shown in FIGS. 18 to 33 for example.

The figure shows a side view along the length of the device, i.e. along the direction along which light is emitted.

The active area in each DBR laser comprises a multi quantum well region (MQW). The MQW region comprises a plurality of quantum well layers. In an embodiment, in which a DBR laser is configured for 1.55 um operation, the MQW region comprises alternating layers of materials such as, for example: AlInGaAs/InP, AlInGaAs/AlInAs, InGaAsP/InP, InGaAsP/AlInAs or InGaAs/AlInGaAs. All these layers are lattice matched to the InP substrate.

The device comprises a substrate 1847. On one surface of the substrate is an n-contact 226. Overlying and in contact with the opposite surface to the substrate 1847 is the buffer layer 1951. Both the substrate 1847 and the buffer layer 1951 are n-type layers. Alternatively, the structure can be reversed, such that the substrate 1847 is a p-type layer. The layers may be n-doped InP. Overlying and in contact with the buffer layer 1951 is the n-type layer 1953. The n-type layer 1953 may be n-doped InP. Overlying and in contact with a strip of the n-type layer 1953 is a first waveguide material 210*a*. Overlying and in contact with the first waveguide material 210*a* is a MQW layer 212. Overlying and in contact with the MQW layer 210 is a second waveguide material 210*b*. On either side of the strip and overlying and in contact with the n-type material 1953 is a p-type material 216 (not shown), which may be p-doped InP. An n-type layer 218 (not shown) is overlying and in contact with the p-type layer 216, and may be n-doped InP. The p-type layer 220 is overlying and in contact with the second waveguide layer 210*b* and the n-type layer 218, and may be p-doped InP. A p-type contact layer 222 is overlying and in contact with the p-type layer 220. In one embodiment, the p-type contact layer 222 is heavily doped InP, i.e. having a dopant concentration higher than that of layer 220. A p-contact metal 224 is overlying and in contact with part of the p-contact layer 222.

As shown in the side view, the MQW strip runs along the length of the device. There is a first p-type contact layer 224*a* over part of the MQW strip. On either side of the part of the strip under the first p-contact 224*a* along the direction in which light is emitted, there is a diffraction grating in the second waveguide material. This forms the master light source 1804. A second p-type contact 224*b* is configured over a second part of the MQW strip, which is further along the length of the device from the master light source 1804. On either side of the part of the strip under the second p-contact 224*b* in the direction in which light is emitted, there is a diffraction grating in the second waveguide material. This forms the slave light source 1801.

A further diffraction grating in the second waveguide material forms the frequency filter 3457. The frequency filter 3457 thus comprises a further DBR grating formed directly on the chip. The further diffraction grating is spaced a distance apart from the slave light source 1801. The slave light source 1801 is between the frequency filter 3457 and the master light source 1804.

The further diffraction grating is also fabricated in optional step S104*a*, which involves spinning the sample with an electron beam lithography resist and defining the grating pattern with electron beam lithography. The grating dimensions may depend on the desired bandwidth of the filter. After development the pattern is transferred by wet or dry shallow etching. Gratings are formed by etching part of the waveguide layer 210*b* off, for example by etching trenches in the waveguide layer 210*b*. The trenches may have a groove-shaped pattern. The dimensions of the grating are calculated according to the desired bandwidth of the filter. The dimensions depend on several factors: the operation wavelength, the material, which may be InP/AlInGaAs or InP/InGaAsP for example, the AlInGaAs or InGaAsP composition, the temperature and the incident angle. Grating periodicity at 1.55 μm may be 1-10 μm for example.

During operation of the device, a current is applied between the first p-contact 224*a* and the n-contact 226 in order to generate light in the MQW strip of the master light source 1804. Light generated in the MQW strip of the master light source 1804 is emitted along the MQW layer. The light is laterally confined by the p-type layer 216 and vertically confined by the waveguide layers 210*a* and *b*. The light enters the MQW layer of the slave light source 1801. A time varying current is applied between the second p-contact 224*b* and the n-contact 226. The light travels between the master light source 1804 and the slave light source 1801 in a waveguide region in this device.

Seeded light generated in the MQW strip of the slave light source 1801 is emitted along the MQW layer. The light is laterally confined by the p-type layer 216 and vertically confined by the waveguide layers 210*a* and *b*. The light enters the MQW layer of the frequency filter 3457. The light travels between the slave light source 1801 and the frequency filter 3457 in a waveguide region in this device. At the frequency filter 3457, a specific wavelength may be selected.

Figure 35:
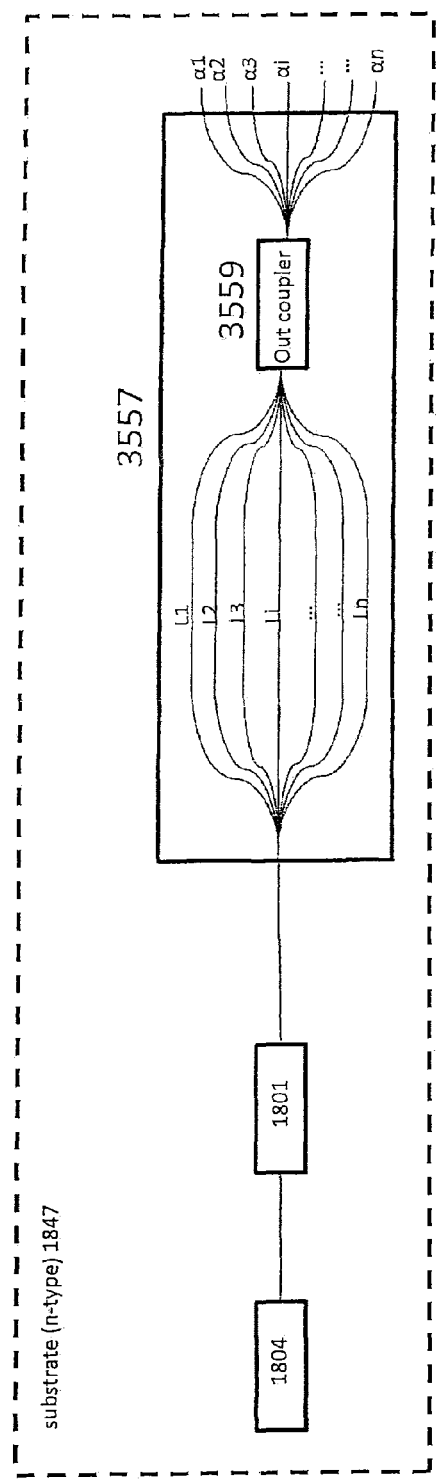
FIG. 35 shows a schematic illustration of a light source that is part of an interference system in accordance with an embodiment, in which the master light source and slave light source are integrated on a semiconductor substrate in a lateral combination, and comprising an arrayed waveguide grating frequency filter also integrated onto the substrate.

FIG. 35 shows a schematic illustration of a light source that is part of an interference system in accordance with an embodiment, comprising a frequency filter 3557, as described in relation to FIG. 8 for example. The figure shows a plan view of the device.

The device comprises a substrate 1847. A master light source 1804 and slave light source 1801 are integrated on the substrate. Any of the master light sources 1804 and slave light sources 1801 shown in FIGS. 18 to 29 can be integrated for example. Light generated in the master light source 1804 enters the slave light source 1801. The light travels between the master light source 1804 and the slave light source 1801 in a waveguide region in this device. Seeded light generated in the slave light source 1801 is emitted along a second waveguide region and enters the frequency filter 3557.

The frequency filter 3557 is an arrayed waveguide grating (AWG) frequency filter. The frequency filter 3557 comprises a plurality of waveguides L1, . . . , Ln, which are all coupled to the second waveguide region. The plurality of waveguides L1, . . . , Ln, and the second waveguide region may be coupled by a region of free space for example. Light emitted from the slave light source 1801 along the second waveguide region thus enters the plurality of waveguides L1, . . . , Ln. The waveguides L1, . . . , Ln have different lengths and thus apply a different phase shift at the exit of the waveguides. The exits of the waveguides are coupled to an out coupler 3559. The out coupler 3559 may be a region of free space, for example. The light exiting the waveguides then traverses the out coupler 3559. A plurality of exit waveguides α1, . . . , αn are coupled to the out coupler 3559. The light traversing the out coupler 3559 interferes at the entries of the output waveguides α1, . . . , αn in such a way that each output channel receives only light of a particular frequency. The exit waveguide αi corresponding to the desired frequency can be coupled to the interference apparatus. Thus in the AWG frequency filter 3557, due to the different waveguide paths L1 to Ln, the output signal is frequency filtered.

The waveguides L1, . . . , Ln and exit waveguides α1, . . . , αn may be InP/AlInGaAs or InP/InGaAsP waveguides etched by a dry etching process. The dry etching process can be used to etch waveguides having "vertical" sidewalls, i.e. sidewalls which are perpendicular to the substrate. The height above the substrate of the core of the waveguide is aligned with the height of the active area of the master laser 1804 and slave laser 1801. Depending on the master laser 1804 and slave laser 1801 structures, the waveguides L1, . . . , Ln and exit waveguides α1, . . . , αn could be fabricated in the selective area epitaxy growth step i.e. step S103 in FIG. 19A for example. The width of the waveguide may depend on the operation wavelength, temperature, material and composition for example.

In an embodiment, other filters, such as the other filters 826 described in relation to FIG. 8 are also integrated onto the substrate. For example, a polariser may also be integrated onto the substrate. A polariser may comprise a polarising beam splitter. Polarising beam splitters can be fabricated on a substrate, for example, by fabricating a Mach-Zehnder interferometer with birefringence in the waveguides, i.e. the refractive index inside of the waveguide depends on the polarisation of the light. At the output beam splitter of the interferometer, one polarisation mode interferes constructively and the other mode destructively, because the two modes have an unequal phase difference due to the birefringence. Therefore one polarisation mode exits the output beam splitter in one arm, and the second polarisation mode in the second arm. If only one arm of the output beam splitter is connected, then such a device acts as a polariser.

Figure 36:
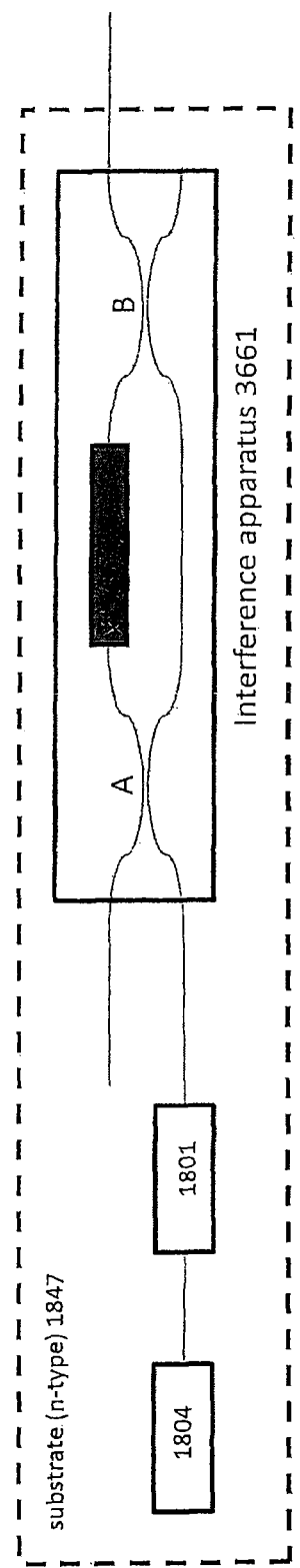
FIG. 36 shows a schematic illustration of an interference system in accordance with an embodiment, in which the master light source 1804 and slave light source 1801 are integrated on a semiconductor substrate in a lateral combination, and comprising an interference apparatus also integrated onto the substrate.

FIG. 36 shows a schematic illustration of an interference system in accordance with an embodiment, comprising an interference apparatus 3661. The figure shows a plan view.

The device comprises a substrate 1847. A master light source 1804 and slave light source 1801 are integrated on the substrate 1847. Any of the master light sources 1804 and slave light sources 1801 shown in FIGS. 18 to 29 can be integrated on the substrate for example. Light generated in the master light source 1804 enters the slave light source 1801. The light travels between the master light source 1804 and the slave light source 1801 in a waveguide region in this device. Seeded light generated in the slave light source 1801 is emitted along a second waveguide region and enters the interference apparatus 3661.

The interference apparatus 3661 comprises an input beam splitter A. A first input of the input beam splitter A is coupled to the second waveguide. Light emitted along the second waveguide region will be split at the input beam splitter A via evanescent beam coupling. A first output of the input beam splitter A is coupled to a third waveguide region, which forms the first arm of an interferometer, and a second output of the input beam splitter A is coupled to a fourth waveguide region, which forms a second arm of an interferometer. The first arm of the interferometer comprises a section of waveguide X. The section of waveguide X may be a longer section of waveguide, meaning that the first arm has a longer optical path length than the second arm of the interferometer. Alternatively, the section of waveguide X may be a phase modulator, meaning that a phase shift is applied to light travelling along the first arm. Alternatively, the section of waveguide X may be an amplitude modulator.

The third waveguide is coupled to the first input of an output beam splitter B and the fourth waveguide is coupled to the second input of the output beam splitter B.

The waveguides may be InP/AlInGaAs or InP/InGaAsP waveguides etched by a dry etching process. The dry etching process can be used to etch waveguides having "vertical" sidewalls, i.e. sidewalls which are perpendicular to the substrate. The height above the substrate of the core of the waveguide is aligned with the height of the active area of the master laser 1804 and slave laser 1801. Depending on the master laser 1804 and slave laser 1801 structures, the waveguides could be fabricated in the selective area epitaxy growth step i.e. step S103 in FIG. 19A for example. In this case a good etched end facet of the interfering apparatus and the slave laser 1801 can be achieved to provide good light coupling. The width of the waveguide will depend on the operation wavelength, temperature, material and its composition.

The interference apparatus 3661 is similar to the interference apparatus described in relation to FIG. 9. Interference apparatuses such as described in relation to FIG. 2, 10, 11(a), 11(b), 12 or 13 for example above can be integrated onto a substrate in a similar manner however.

One or more variable or fixed beam splitters, spectral filters, phase modulators, intensity modulators and slow attenuators can also be integrated onto a semiconductor substrate with the master light source and the slave light source.

An attenuator can be fabricated by fabricating a Mach-Zehnder interferometer. By tuning the phase, the amount of light coupling out of a selected output of the output beam splitter can be varied. The phase tuning is slow, similar to that obtained from tuning the temperature of one arm of the Mach-Zehnder interferometer.

An Indium phosphide based phase modulator can be integrated on a substrate. The phase shift in an Indium phosphate based phase modulator is induced though the 'Quantum Confined Stark Effect' in a multiple quantum well structure. In an Indium phosphate based phase modulator, a voltage is applied to change the index of refraction, which in turn causes a phase shift to the light travelling through the phase modulator.

Furthermore, one or more detectors, circulators, isolators, fast phase modulators or intensity modulators, polarisation modulators, polarisation rotators, splitters or combiners can also be integrated onto a semiconductor substrate with the master light source and the slave light source.

Polarisation rotators, splitters or combiners can be fabricated on an InP substrate. For example, a polarisation rotator, often called a "converter", may comprise a waveguide having one "vertical" sidewall, i.e. a sidewall perpendicular to the substrate, and one slanted sidewall, i.e. one sidewall at an angle other than 90 degrees to the substrate. This may be fabricated for example by etching a slope. Other methods of fabricating a polarisation rotator include fabricating periodically loaded waveguide sections or integrated bends. A polarisation modulator can be fabricated by fabricating a phase modulator which introduces a phase shift between two polarisation modes, having a polarisation rotator at the input and output. A splitter or combiner can be fabricated by fabricating Mach-Zehnder interferometers, in a similar manner to a variable beam splitter.

A detector can be integrated onto a substrate by fabricating the detector on a wafer and then flip chip bonding it on the substrate with the other integrated components. The detector can be flip chip bonded on its side on an insulating substrate for example.

A master light source and a slave light source integrated onto a semiconductor substrate as described in relation to FIGS. 18 to 36 above can be used in a QKD system, for example as described in relation to FIG. 10, or a measurement device independent QKD system, for example as described in relation to FIG. 13. It may also be used in an encoder for a photonic quantum information system. A master light source and a slave light source integrated onto a semiconductor substrate as described in relation to FIGS. 18 to 36 above can be used in phase-randomised quantum and classical optical interference applications.

A master light source and a slave light source integrated onto a semiconductor substrate as described in relation to FIGS. 18 to 36 above is a compact device, which is low cost and quick to manufacture and assemble.

The device can produce laser pulses from a single integrated chip, which is small, cheap, easy to manufacture and suitable for mass manufacture using conventional semiconductor processes. The device provides enhanced visibility, time resolution and spectral resolution, and is a small size, on-chip light source.

The device comprises two optically coupled lasers that share a common semiconductor substrate. One laser is used to seed the second laser. This reduces the time jitter related to the spontaneous emission of the slave laser. Furthermore, the frequency modes of the second laser are defined by the first laser, thus reducing the frequency chirp of the second laser.

An integrated chip comprising a master light source and a slave light source allows for time jitter reduction, i.e. the time jitter of the slave light pulses is less than the time jitter of the master light pulses and the time jitter of the slave light pulses generated with injection of the master light pulses is less than the time jitter of light pulses generated without injection of master light pulses, and frequency chirp reduction, i.e. the bandwidth of the light pulses generated by seeding is less than if they were generated without seeding.

A frequency filter can be integrated on the same chip as the light source, therefore further reducing the size of the device.

A low time jitter and low frequency chirp light source can be used to obtain a good visibility in interference experiments. A light source in which there is phase randomisation of the light pulses can be used to guarantee security in QKD and MDI QKD systems. The light source described above is a compact, on chip light source with low time jitter and low frequency chirp.

Transmitters for QKD systems, MDI QKD systems or interference experiments can be built using components such as one or more laser diodes, phase modulators, intensity modulators, couplers/combiners, fibre delay lines, polarising beam splitters and attenuators integrated on a semiconductor substrate.

A master light source and a slave light source integrated onto a semiconductor substrate as described in relation to FIGS. 18 to 36 above outputs random-phase-encoded low-time-jitter low-frequency-chirp laser pulses from a single integrated chip, which is small, cheap, easy to manufacture and suitable for mass manufacture using conventional semiconductor processes.

An interference system in which the master light source and the slave light source are integrated onto a substrate can be small and compact. The interference system has low time jitter, which enables applications based on interference or precise timing. The light pulses emitted from the slave light pulse have a random phase relation. This automatic randomization of the phase between adjacent pulses benefits security in QKD-related applications for example.

An interference system in which the master light source and the slave light source are integrated onto a substrate can be used as part of a quantum random number generator (QRNG). The system shown in FIG. 2 can be used as a QRNG for example. All of the components shown in FIG. 2 may be integrated onto the substrate. A QRNG such as shown in FIG. 2, and in which the master light sources 203 and 204 and slave light sources 201 and 202 are integrated onto a single chip provides a compact QRNG. The light pulses emitted from the slave light sources 201 and 202 have a low time jitter, and therefore short light pulses can be generated, which still result in good temporal overlap at the beam splitter 206. This means that the QRNG is fast, as it is not necessary to generate long light pulses in order to ensure good interference at the beam splitter 206.

While certain embodiments have been described, these embodiments have been presented by way of example only, and are not intended to limit the scope of the inventions. Indeed the novel methods and apparatus described herein may be embodied in a variety of other forms; furthermore, various omissions, substitutions and changes in the form of methods and apparatus described herein may be made without departing from the spirit of the inventions. The accompanying claims and their equivalents are intended to cover such forms of modifications as would fall within the scope and spirit of the inventions.

The invention claimed is:

1. An interference system, comprising:
an interference apparatus, configured such that input light pulses interfere at an interference component;
wherein the input of said interference apparatus is provided by a substantially phase-randomised light source, said substantially phase-randomised light source comprising:
at least one slave light source;
at least one master light source configured to intermittently generate master light pulses such that the phase of each master light pulse has a substantially random relationship to the phase of each subsequently generated master light pulse, further configured to supply said master light pulses to the slave light source; and
a controller, configured to apply a time varying drive signal to said at least one slave light source such that one slave light pulse is generated during each period of time for which a master light pulse is received, such that the phase of each slave light pulse has a substantially random relationship to the phase of each subsequently generated slave light pulse and such that each slave light pulse has a fixed phase relationship to the corresponding master light pulse.

2. The interference system of claim 1, wherein light pulses generated by the at least one slave light source interfere at the interference component.

3. The interference system of claim 1, said substantially phase-randomised light source further comprising a nonlinear crystal, configured such that when a slave light pulse is incident on the nonlinear crystal, a signal photon and an idler photon are generated through spontaneous parametric down conversion, wherein the interference system is configured such that signal light pulses interfere at the interference component.

4. The interference system of claim 1, wherein the master light source and the slave light source are configured to generate a plurality of light pulses.

5. The interference system of claim 1, wherein said controller is further configured to apply the time varying drive signal to said at least one master light source.

6. The interference system of claim 1, further comprising a second controller, configured to apply a second time varying drive signal to said at least one master light source, wherein said time varying drive signal and said second time varying drive signal are synchronised.

7. The interference system of claim 1, wherein said slave light source is a gain-switched laser.

8. The interference system of claim 1, wherein said master light source is a gain-switched laser.

9. The interference system of claim 1, wherein the interference apparatus comprises an interferometer, comprising first and second optical paths, wherein there is a difference in optical path length between the first and second optical paths.

10. The interference system of claim 9, wherein the interference component is an exit beam splitter in the interferometer, and wherein the difference in optical path length corresponds to an integer multiple of the time between emission of a first slave light pulse and emission of a second slave light pulse, such that each slave light pulse interferes with a subsequently generated slave light pulse at the exit of the interferometer.

11. The interference system of claim 1, wherein said at least one slave light source comprises a first slave light source and a second slave light source and wherein the interference component is a beam splitter configured such that each slave light pulse generated by the first slave light source interferes with a light pulse generated by the second slave light pulse at the beam splitter.

12. The interference system of claim 1, wherein said substantially phase-randomised light source further comprises a spectral filter.

13. A quantum communication system, comprising the interference system of claim 1, wherein the interference apparatus comprises;
    an interferometer, comprising first and second optical paths, wherein there is a difference in optical path length between the first and second optical paths such that said slave light pulses interfere when exiting the interferometer.

14. The quantum communication system according to claim 13, wherein the slave light source is in a sending unit and the interference component is in a receiving unit.

15. A quantum communication system, comprising the interference system of claim 1, wherein said at least one slave light source comprises a first slave light source and a second slave light source; wherein the interference component is a beam splitter and wherein the interference system is configured such that each slave light pulse generated by the first slave light source interferes with a slave light pulse generated by the second slave light source at the beam splitter;
    wherein the first slave light source is in a first sending unit, the second slave light source is in a second sending unit and the interference component is in a relay unit.

16. A quantum communication system, comprising the interference system of claim 1, wherein the interference apparatus comprises;
    a first interferometer, comprising first and second optical paths and having a difference in optical path length between the first and second optical paths;
    a second interferometer, comprising third and fourth optical paths and having a difference in optical path length between the third and fourth optical paths;
    wherein the delay caused by the first interferometer is reversed to the delay caused by the second interferometer such that a light pulse which is separated by the first interferometer recombines when exiting the second interferometer.

17. The quantum communication system according to claim 16, wherein the first interferometer is in a sending unit and the second interferometer is in a receiving unit.

18. An interference method, comprising;
    intermittently supplying master light pulses to a slave light source, wherein the phase of each master light pulse has a substantially random relationship to the phase of each subsequent master light pulse;
    applying a time varying drive signal to said slave light source such that one slave light pulse is generated during each period of time for which a master light pulse is received, such that the phase of each slave light pulse has a substantially random relationship to the phase of each subsequently generated slave light pulse and such that each slave light pulse has a fixed phase relationship to the corresponding master light pulse; and
    interfering said slave light pulses at an interference component.

19. A quantum communication method, comprising the interference method of claim 18, further comprising:
    encoding information in said slave light pulses; and
    sending encoded slave light pulses from a sending unit to a receiving unit comprising an interferometer, comprising first and second optical paths, wherein there is a difference in optical path length between the first and second optical paths such that said slave light pulses interfere when exiting the interferometer.

\* \* \* \* \*